(12) United States Patent
Schafer et al.

(10) Patent No.: US 11,463,127 B2
(45) Date of Patent: Oct. 4, 2022

(54) MODULAR CUSTOMER PREMISES EQUIPMENT FOR PROVIDING BROADBAND INTERNET

(71) Applicant: Avista Edge, Inc., Spokane, WA (US)

(72) Inventors: David Gregory Schafer, Spokane, WA (US); Robert J. Conley, Liberty Lake, WA (US); Mark Wayne Gustafson, Spokane, WA (US); Cao Ming, County Laois (IE)

(73) Assignee: Avista Edge, Inc., Spokane, WA (US)

( * ) Notice: Subject to any disclaimer, the term of this patent is extended or adjusted under 35 U.S.C. 154(b) by 0 days.

(21) Appl. No.: 17/202,526

(22) Filed: Mar. 16, 2021

(65) Prior Publication Data
US 2021/0297111 A1   Sep. 23, 2021

Related U.S. Application Data

(60) Provisional application No. 63/110,538, filed on Nov. 6, 2020, provisional application No. 63/006,304, filed
(Continued)

(51) Int. Cl.
*H04B 3/54* (2006.01)
*H01Q 3/28* (2006.01)
(Continued)

(52) U.S. Cl.
CPC ............. *H04B 3/542* (2013.01); *G01R 1/04* (2013.01); *H01Q 3/28* (2013.01); *H01Q 3/30* (2013.01); *H04B 7/10* (2013.01)

(58) Field of Classification Search
CPC ... H01Q 3/30; H01Q 3/28; H04B 7/10; H04B 3/54; G01R 1/04
See application file for complete search history.

(56) References Cited

U.S. PATENT DOCUMENTS 6,628,627 B1   9/2003   Zendle et al.
7,561,867 B2   7/2009   Frye, Jr.
(Continued)

OTHER PUBLICATIONS

Jim Hanson, "Meter Collars for Distributed Generation", Business and Technology Strategies, Jan. 2016 (Year: 2016).*
(Continued)

*Primary Examiner* — Aristocratis Fotakis
(74) *Attorney, Agent, or Firm* — Lee & Hayes, P.C.

(57) ABSTRACT

An electronic device includes a first housing including a power module and a second housing coupled to the first housing. The second housing includes a first antenna communicatively coupled to the power module, and oriented in a first direction. The second housing further includes a second antenna communicatively coupled to the power module, and oriented in a second direction that is different than the first direction. At least one printed circuit board (PCB) is disposed in the second housing and communicatively coupled to the power module, the first antenna, and the second antenna A modem module resides within the second housing and communicatively couples to the power module, the first antenna, the second antenna, and the at least one PCB. An interface resides within the second housing and communicatively couples to the power module, the first antenna, the second antenna, the at least one PCB, and the modem module.

20 Claims, 27 Drawing Sheets

Related U.S. Application Data on Apr. 7, 2020, provisional application No. 62/991,436, filed on Mar. 18, 2020.

(51) Int. Cl.
  *H01Q 3/30* (2006.01)
  *H04B 7/10* (2017.01)
  *G01R 1/04* (2006.01)

(56) References Cited

U.S. PATENT DOCUMENTS

| | | | |
|---|---|---|---|
| 8,022,690 | B2 | 9/2011 | Kagan |
| 8,947,258 | B2 | 2/2015 | Pant et al. |
| 8,983,451 | B2 | 3/2015 | Yoon et al. |
| 10,886,748 | B1 * | 1/2021 | Karlgaard ............ G01R 22/063 |
| 2006/0193151 | A1 * | 8/2006 | Quan .................. F21V 23/0442 362/640 |
| 2006/0222086 | A1 | 10/2006 | Frye, Jr. |
| 2007/0201540 | A1 | 8/2007 | Berkman |
| 2010/0253538 | A1 * | 10/2010 | Smith .................... G01D 4/002 29/601 |
| 2010/0328097 | A1 | 12/2010 | Leo et al. |
| 2011/0140911 | A1 | 6/2011 | Pant et al. |
| 2011/0264295 | A1 | 10/2011 | Schmelcher |
| 2012/0050971 | A1 | 3/2012 | Seal et al. |
| 2014/0218010 | A1 | 8/2014 | Fulton et al. |
| 2015/0011273 | A1 | 1/2015 | Wilmhoff et al. |
| 2015/0311951 | A1 | 10/2015 | Hariz |
| 2015/0325984 | A1 * | 11/2015 | Knauer ................. H01R 33/90 361/669 |
| 2017/0215295 | A1 * | 7/2017 | Herzig .................... H02J 3/381 |
| 2018/0188072 | A1 * | 7/2018 | Barnett, Jr. ............ G01D 4/004 |
| 2019/0101411 | A1 * | 4/2019 | Davis .................... G01F 15/063 |
| 2019/0159353 | A1 * | 5/2019 | Herzig ................ H05K 5/0247 |
| 2019/0319336 | A1 * | 10/2019 | Bell ..................... H01Q 1/1207 |
| 2020/0119937 | A1 | 4/2020 | Gustafson et al. |
| 2020/0153493 | A1 * | 5/2020 | Zhong ................ H04L 27/2646 |
| 2020/0267012 | A1 | 8/2020 | Gustafson et al. |
| 2021/0037606 | A1 | 2/2021 | Schafer et al. |
| 2021/0227396 | A1 * | 7/2021 | Khalid ................. H04W 16/28 |
| 2021/0297141 | A1 | 9/2021 | Schafer et al. |
| 2022/0029847 | A1 | 1/2022 | Gustafson et al. |

OTHER PUBLICATIONS

Trong Nghia Le, Wen-Long Chin, Dang Khoa Truong and Tran Hiep Nguyen, "Advanced Metering Infrastructure Based on Smart Meters in Smart Grid", 2016 (Year: 2016).*

Invitation to pay fees dated May 27, 2021 for App PCT/US21/22683, "Modular Customer Premises Equipment for Providing Broadband Internet", 2 pages.

Non Final Office Action dated Feb. 5, 2020 for U.S. Appl. No. 16/160,807 "Wireless Broadband Meter Collar" Gustafson, 8 pages.

Non Final Office Action dated Aug. 20, 2020 for U.S. Appl. No. 16/526,358, "Wireless Broadband Meter Collar", Schafer, 13 pages.

Non Final Office Action dated Sep. 4, 2020 for U.S. Appl. No. 16/866,006, "Wireless Broadband Meter Collar", Gustafson, 8 pages.

The PCT Search Report and Written Opinion dated Sep. 9, 2020, for PCT Application No. PCT/US20/44355, 9 pages.

"The SIMPLE ConnectDER(TM)," 2 pages, May 12, 2015.

PCT Search Report & Written Opinion dated Aug. 2, 2021, 10 pages.

* cited by examiner

MODULAR CUSTOMER PREMISES EQUIPMENT FOR PROVIDING BROADBAND INTERNET

CROSS-REFERENCE TO RELATED APPLICATIONS

This application claims priority to U.S. Provisional Application No. 62/991,436, filed Mar. 18, 2020, entitled "Broadband-Over-Powerline Systems and Methods," U.S. Provisional Application No. 63/006,304, filed Apr. 7, 2020, entitled "Fixed Wireless Device at Premise for Providing Broadband Internet," and U.S. Provisional Application No. 63/110,538, filed Nov. 6, 2020, entitled "Predetermining Phase and/or Amplitude for Achieving Polarization Diversity and Flat Pattern Gain," the entirety of which are herein incorporated by reference.

BACKGROUND

With the proliferation of the Internet, individuals and business are becoming more connected. The demand for services available on the Internet and the availability of devices to access the Internet has increased rapidly. Despite this increase, much of the world lacks access to broadband internet (e.g., DSL, cable, fiber-optic, satellite, etc.). This need has forced carriers, providers, and equipment manufacturers to develop high throughput solutions with $4^{th}$ generation long term evolution (4G LTE) and $5^{th}$ generation (5G) technologies. These services generally require delivering fiber-optic networks to individual premises. However, certain premises may be difficult and/or costly to access.

To overcome these deficiencies, some providers utilize wireless technology to deliver broadband internet. As wireless technology evolves to higher frequencies to increase throughput and capacity, building penetration becomes untenable. For example, conventional systems fail to penetrate structures when wireless signals are attenuated below useful levels. Additionally, existing wireless technologies are designed according to specific polarizations. However, in non-line of sight (NLOS) communications, topography and obstructions (e.g., building, vegetation, etc.) make it difficult for transmitting and receiving signals. In such instances, the signals may be reflected, diffracted, refracted, and scattered, and incident signals may be cross-polarized. This results in transmission nulls and lost data.

Further technological improvements may enhance access to broadband internet and increase user experiences.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items or features. The systems and devices depicted in the accompanying figures are not to scale and components within the figures may be depicted not to scale with each other.

DETAILED DESCRIPTION

Figure 1:
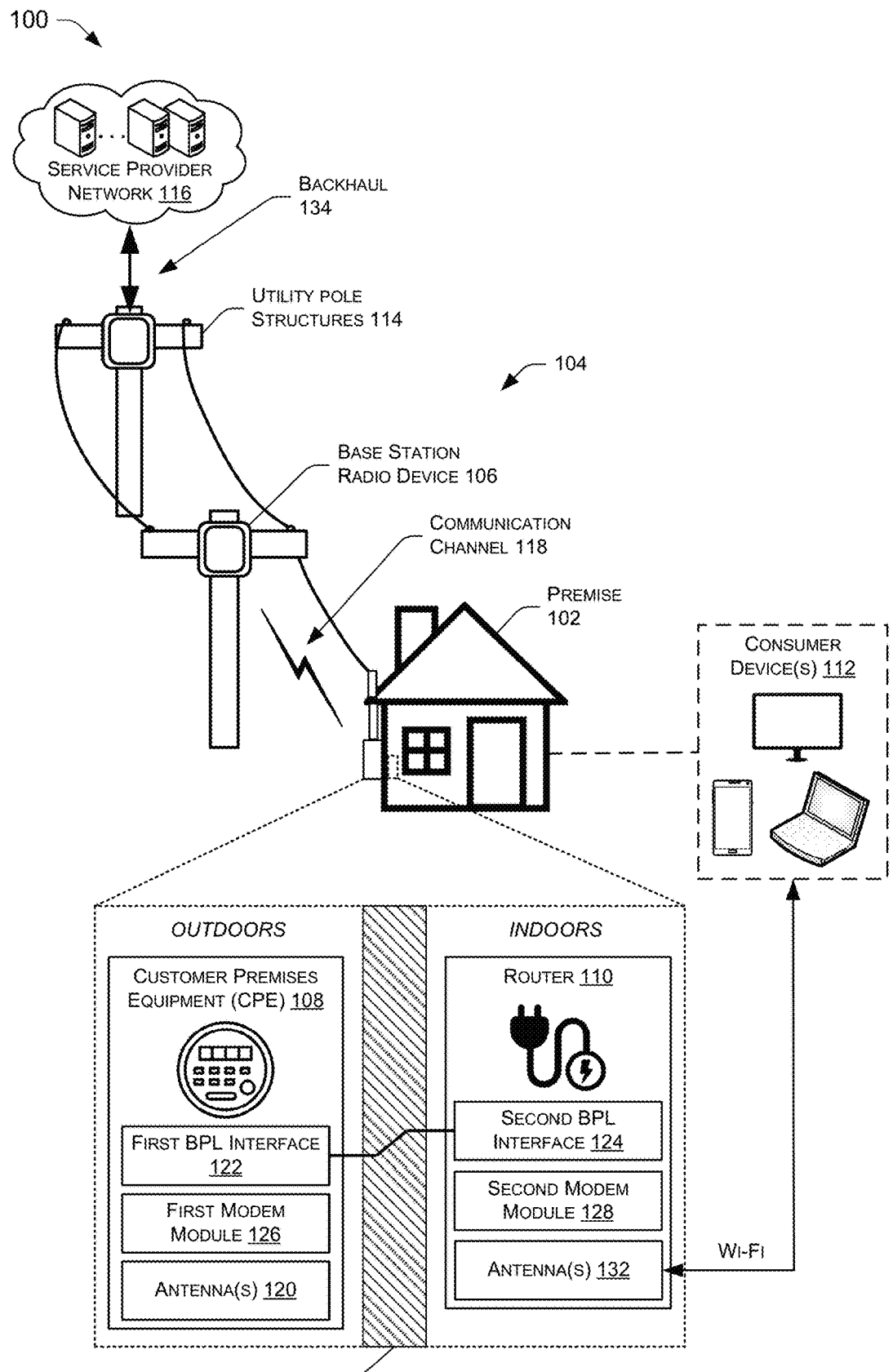
FIG. 1 illustrates a diagram of an example environment, showing a base station radio device communicating with customer premises equipment (CPE), or other user equipment (UE) and/or end user device (EUD), for providing broadband internet to a premises, according to an embodiment of the present disclosure. In some instances, the base station radio device and the CPE may communicate over a dynamic shared spectrum (DSS) (e.g., Citizens Broadband Radio Service (CBRS)). The base station radio device ultimately couples to a backhaul network (e.g., fiber-optic network) for transmitting and receiving broadband data to and from an internet service provider (ISP) or service provider network (SPN). Additionally, the CPE communicatively couples to a router located within the premises for providing broadband internet to consumer device(s) within the premises.

The present disclosure is directed, in part, to systems and methods that provide broadband internet (e.g., high-speed internet) to a premises. In some instances, the systems and methods discussed herein may use Broadband over Power Line (BPL) technology (alternatively referred to a powerline communication (PCL) and/or internet over power line (IPL)) to deliver broadband internet to a variety of premises, such as homes, multi-family units and/or places of business. Utilizing existing electrical wiring of the premises may alleviate the need to build broadband facilities, structures, and/or route cables to individual premises. In such instances, BPL technology makes use of existing electrical wiring of the premises. Because of this, in some instances, utility companies (e.g., water, gas, electricity) that provide power (or other utilities) may also provide broadband internet as a service. This may consolidate consumer expenditures and increase user convenience.

In some instances, a plurality of base station radio devices may be disposed atop vertical structures (e.g., utility poles and street lights) and which communicate with customer premises devices (CPEs) disposed at the premises. The base station radio devices may communicatively couple to an internet service provider (ISP), wide area network (WAN), and/or service provider network (SPN) that offers or otherwise provides broadband internet to consumers. In some instances, the base station radio devices may communicatively couple to the SPN via a backhaul network, such as fiber-optic, cables, and/or millimeter wave (mmWave) technology. Additionally, or alternatively, the base station radio devices may communicate with the SPN or be connected to the SPN via powerlines of a utility service using BPL technology (e.g., over medium or low voltage powerlines), and/or may use other technologies. Regardless of the specific implementation, the communication between the base station radio devices and the SPN represents a high-speed communication path for providing broadband internet.

The base station radio devices may also include components for routing, networking, and switching functions to facilitate the conveyance of broadband internet between consumers (e.g., users, entities, etc.), other consumers (e.g., users, entities, etc.), and the SPN. In some instances, the base station radio devices may communicate with one another (e.g., mmWave) to transmit and receive data, and/or couple to the SPN. The base station radio devices function to provide broadband internet to the CPEs (and ultimately the premises) by wirelessly communicating with the CPEs. To wirelessly communicate with one another, the base station radio devices and the CPEs may include modems, antenna(s), an array of antenna(s), transceiver systems, antenna feed networks, and so forth. In some instances, the antenna(s) of the base station radio devices and/or the antenna(s) of the CPEs may include a plurality of modems and/or antennas for communicating over a range of frequencies (e.g., mid frequencies, high frequencies, etc.). The antenna(s) of the base station radio device(s) and/or the CPEs may include antennas for any disparate number of communication technologies (e.g., 4G LTE, 5G, etc.). Additionally, or alternatively, the CPE may include various interfaces for communicating with the SPN via wired technologies and physical layer (PHY) technologies at the premises (e.g., Coaxial Cable, DSL, Fiber, etc.). In some instances, the CPE may include modular components for interchanging modems, antenna(s), and so forth depending on which communication technologies are utilized for delivering broadband internet.

In some instances, the base station radio device and the CPE may utilize, or communicate, over any dynamic shared spectrum (DSS). By way of example, the base station radio device and the CPE may communicate over a 3100 MHz to 4200 MHz DSS, such as a C-band spectrum (3700 MHz-4200 MHz). In some instances, the base station radio device and the CPE may communicate within specific ranges of the DSS, such as the Citizens Broadcast Radio Spectrum (CBRS) between 3550 MHz to 3700 MHz. However, other frequencies are envisioned and may be utilized. Regardless, the base station radio device and the CPE may include corresponding modem(s) and antenna(s) for communicating over desired frequencies, or at desired frequencies. In some instances, and as noted above, the antenna(s) and/or modems of the base station hub device and/or the CPE may be modular and interchangeable depending on the specific implementation.

With the varying frequencies at which the base station radio device and the CPE communicate, under-utilized frequencies may be used depending on demand and load. That is, the base station radio device and the CPE may communicate with one another over a plurality of frequencies and depending on current loads within those frequencies. In some instances, the base station radio device and/or the CPE may include multiple radio transceiver ports coupled to the ports of one or more antenna elements via a coupling network. This may result in the CPE having a multiple-input and/or multiple-output (MIMO) antenna for receiving high frequencies and/or mid frequencies. In some instance(s), the antenna(s) may represent a massive MIMO for transmitting and receiving signals across a wide spectrum of frequencies.

The antenna(s), a transceiver system, and/or an antenna feed network of the base station radio devices and/or the CPEs may also be configured to beamform or beam steer in order to increase a signal strength with the base station radio device(s). For example, the antenna(s) of the base station radio devices and/or the CPEs may be steered to transmit signals in a specific direction rather than broadcasting signals in all directions. In such instances, the antenna(s) (or the array of antenna(s)) may determine a direction of interest for sending and receiving a stronger signal in the direction of interest. As another example, the antenna(s) of the base station radio devices and/or the CPEs may transmit signals in a plurality of directions rather than broadcasting signals in all directions or a single direction. Herein, the antenna(s) of the CPEs may form multiple beams within communication channels between the CPE and the base station radio device. In such instances, the antenna(s) (or the array of antenna(s)) may determine the directions of interest for sending and receiving a stronger composite signal to the base station radio device.

The CPEs are installed at the premises of the consumer (e.g., home and/or place of business) and may represent a fixed wireless device. In some instances, the CPEs may be installed on an exterior side of the premises at a demarcation point in which services (e.g., power, phone, television, etc.) are provided to the premises. In some instances, the CPE may be installed within an electric meter panel and coupled to the electric meter and the electrical wiring of the premises. For example, the CPE may include a housing that fits within an existing electric meter panel and when installed, is interposed between the electric meter panel and the electric meter. This coupling may provide power to the CPE, transfer power to the electric meter for metering, and connect the CPE with (or to) the electrical wiring of the premises. In some instances, a router may be plugged into an outlet within the interior of the premises and located proximate to the CPE to reduce dissipation and/or noise. The router and the CPE may be paired with one another as part of an out of box experience (OOBE) for providing broadband internet. Therein, the router may broadcast broadband internet within an interior of the premises.

The CPE includes one or more interfaces for communicating with the router. For example, the CPE may include a BPL interface and a modem coupled to the antenna(s). The BPL interface and the modem may be communicatively coupled with one another. In some instances, the BPL interface and the modem (and/or the antenna(s)) may be components of a system on a chip (SoC) of the CPE. As the antenna(s) of the CPE receives the broadband internet from the base station radio device(s), or via DHY technologies, the modem may communicate the broadband data to the BPL interface (e.g., via digital and/or Ethernet interface). The BPL interface is configured to transmit the broadband data over the electrical wiring of the premises to the router. However, the CPE may utilize other existing wiring of the premises (e.g., plastic fiber, twisted pair, coax, etc.) for providing broadband data to the premises. In such instances, the CPE may include a LAN interface.

The router, which is located within the interior side of the premises, may include a BPL interface for receiving the broadband data from the CPE. The BPL modem of the CPE and the BPL modem of the router therefore allows for the CPE and the router to communicate over the electrical wiring of the premises. The router further includes a wireless modem and antenna(s) for distributing broadband internet to the premises, or consumer device(s) within the premises. For example, the antenna(s) of the router may include a Wi-Fi module for supplying the premises with Wi-Fi (e.g., 2.4 GHz Wi-Fi, 5 GHz Wi-Fi, 6 GHz, etc.). The antenna(s) may also be modular or interchangeable to provide additional Wi-Fi frequency bands to the premises. In some instances, the router may broadcast the broadband internet via wireless and/or wired technologies (e.g., Ethernet, coaxial cable, USB, twisted pair, plastic fiber, etc.). In some instances, the antenna(s), BPL interface, and/or modem of the router may be components of a SoC of the router.

Wirelessly coupling the base station radio device and the CPE may avoid conventional problems associated with providing broadband internet to individual premises. For example, costs, time, and inconveniences, sometimes referred as the last mile problem, are often limiting factors in providing broadband internet. Compared to conventional techniques that physically connect premises to the SPN, using wireless communication between the base station radio device and the CPE, as well as BPL technology, may reduce these challenges. For example, consumers may no longer be expected to be home while broadband internet is set up. In this manner, coupling the CPEs to the electrical wiring of the premises (i.e., the electric meter panel and the electric meter) also addresses challenges associated with building penetration.

However, in NLOS applications, topography and obstructions make it difficult for transmitting and receiving signals. For example, the signals transmitted by the CPE may be reflected, diffracted, refracted, and scattered. In some instances, to overcome challenges associated with wireless communications between the CPE and the base station radio device, the CPE may include, or the antenna of the CPE may represent, a multi-antenna array having antennas arranged with different polarizations. The antenna(s) may include sub-arrays having multiple elements. In some instances, each sub-array of the multi-antenna array may include two orthogonally polarized elements. Additionally, each element of the sub-array may include a dedicated antenna feed port. By selecting specific polarizations, and determining the phase and or amplitude of the antenna feeds, the multi-antenna array may have a radiation pattern with a predetermined variable polarization. In some instances, the predetermined variable polarization may be a function of the direction of departure and arrival of signals. For example, the multi-antenna array may have linear, circular, and/or elliptical polarizations as a function of the direction of arrival/departure in the pattern.

The multi-antenna array includes a structure for supporting the antenna feed network and orienting the elements such that the multi-antenna array realizes a directional radiation pattern in azimuth and elevation that is greater than the radiation pattern of a sub-array pattern. For example, in some instances, the multi-antenna array may be implemented as a non-planar array having sub-arrays arranged to form a pattern that has a beamwidth that exceeds the radiation pattern of the individual sub-array beamwidths. That is, each of the individual sub-arrays have an individual beamwidth, but when these beams experience constructive interference, a beam of the multi-antenna array may have a width that exceeds that of the individual sub-arrays. In some instances, the sub-arrays may include two orthogonally polarized elements and each element within the sub-array may have a dedicated antenna feed port. The sub-array may be implemented as a patch antenna having a first patch feed (and associated port) and a second patch feed (and associated port) that are orthogonally polarized.

In some instances, the multi-antenna array may include a single transmission port or a single receiving port, and/or a single transmission/receiving port. In instances where only a single transmission/receiving port is included, the single transmission/receiving port may split or combine the transmitted/received signal amongst the sub-arrays and drive individual elements of the sub-arrays. This splitting/combining makes it possible for the CPE to include a single transmission/receiving port but have variable polarizations across the pattern. Additionally, this results in equal power or predetermined unequal power being transceived by the element(s).

The multi-antenna array increases the number of transmission and receiving ports in MIMO and coherent space-polarization MIMO radio systems. For example, in conventional systems, if there is only one transmission port, then only one polarization may be used to illuminate the propagation channel. However, in such instances, this polarization may not be optimal for the communication channel between the CPE and the base station radio device (or between two devices). The multi-antenna array may be capable of eliminating polarization dependent loss (PDL) and utilizing a method of polarization mode dispersion combining to optimize the Signal to Interference to Noise Ratio (SINK) at the receiver to extend range and increase throughput.

The differently polarized elements of the multi-antenna array allows receivers to implement PDL mitigation and adaptive interference mitigation based at least in part on polarization mode dispersion (PMD) processing. For example, the multi-antenna array provides a continuous distribution of polarizations from linear, elliptical, and circular. By way of example, envision that for a multi-antenna array that includes three patches, assume that the left patch includes a vertical polarization, the center patch includes a horizontal polarization (i.e., orthogonal polarization for the center patch), and the right patch includes a vertical polarization. Additionally, the left and right patches may be driven with equal phase while the center patch may be driven with a composite 90 degree phase shift. That is, the composite phase of the center patch is the sum of the phase delay realized in the feed and the time of flight phase delay due to the physical separation of the patch antennas. If the polarization of the left patch is measured, a vertical polarization is verified. As the measurement position moves from left to right, around the pattern, the polarization varies from the initial vertical polarization, through elliptical polarization, to circular polarization, and once again to vertical polarization in the right patch.

The multi-antenna array seeks to create a variable polarization over its beamwidth for polarization diversity. The variation in polarization is observed to change in a trajectory around the Poincaré Sphere. In some instances, the receiver may receive signals having the vertical, circular, and/or elliptical polarizations. By diversifying the polarization, the CPE may more effectively communicate with the base station radio device. For example, when communicating with a multi-port receiver equipped with coherent spatial and/or polarization combining capability, such as the base station radio device, there is a significant advantage if the transmitter maximizes the spatial and polarization diversity. In effect, the multi-antenna array of the CPE enhances the apparent diversity via predetermined polarizations to allow the base station radio device to implement polarization dependent loss mitigation and mitigate interference and jamming through spatial and polarization processing over the bandwidth of the signal.

In some instances, the polarization diversity may be accomplished, at least in part, by precoding the phase and/or amplitude of the feeds into the elements of the sub-arrays. For example, to adjust the polarization, and/or the direction of departure/arrival of signals in the multi-antenna array, the phase and/or amplitude of the feeds to/from the elements may be predetermined. In some instances, the phase and/or amplitude may be determined as a function of the direction of arriving signals/transmitting signals (i.e., where the multi-antenna array is receiving signals from and transmitting signals to). By way of example, the sub-array may be precoded or programmed to exhibit a 70 degree pattern in both azimuth and elevation, while the multi-antenna array achieves a 3 dB pattern of +/−90 degrees azimuth with respect to the multi-array antenna's boresight and an elevation of −0 degrees to +70 degrees with respect to the plane formed by the earth's surface.

In some instances, multi-antenna array may include two-way or three-way power splitters/combiners to drive ports of each element within the multi-antenna array. Using orthogonal elements for adjacent sub-arrays serves to reduce the constructive or destructive interference as orthogonal components do not interfere with each other. Stated alternatively, the use of polarization diversity in the non-planar multi-antenna array reduces the parasitic effects of beam overlap and sidelobes. In some instances, the beamwidths from the sub-arrays may partially overlap to result in destructive interference decreasing the array gain in specific directions. Conversely beam overlap and sidelobes may interfere constructively, resulting in gain peaking over the beamwidth. This constructive interference may result in excess gain in specific directions that exceed Federal Communications Commission (FCC) limits for Effective Isotropic Radiated Power (EIRP). If the EIRP is exceeded in any specific direction the transmitter power may be required to be reduced for the entire array beamwidth resulting in shorter range and coverage over the beamwidth. This gain unflatness across the beamwidth is undesirable. Therefore the array element precoding (polarizations, power and phase) are pre-determined to maximize polarization diversity while minimizing gain variation across the array beamwidth.

The present disclosure provides an overall understanding of the principles of the structure, function, device, and system disclosed herein. One or more examples of the present disclosure are illustrated in the accompanying drawings. Those of ordinary skill in the art will understand and appreciate that the devices, the systems, and/or the methods specifically described herein and illustrated in the accompanying drawings are non-limiting embodiments. The features illustrated or described in connection with one embodiment, or instance, may be combined with the features of other embodiments or instances. Such modifications and variations are intended to be included within the scope of the disclosure and appended claims.

FIG. 1 illustrates an example environment 100 for providing broadband internet to a premises 102 (e.g., building, house, multi-dwelling complex, etc.). In some instances, the environment 100 may include a system 104 for providing the broadband internet to the premises 102. The system 104 may, in some instances, include one or more base station radio devices 106, one or more customer premises devices (CPE) 108, one or more routers 110, and/or one or more consumer device(s) 112.

The base station radio device 106 is shown coupled to utility pole structures 114 for being disposed above the ground. In some instances, the base station radio devices 106 may be configured to mount to the utility pole structures 114, or on other structures, to vertically dispose the base station radio devices 106 above the ground. For example, the base station radio devices 106 may be disposed on a side of a building, a light pole, stop lights, telephone poles, and so forth. In some instances, the base station radio device 106 may be disposed on the utility pole structures 114 for communicatively coupling to a service provider network (SPN) 116.

In some instances, a backhaul 134 may couple the base station radio devices 106 to the SPN 116. The backhaul 134 may, in some instances, represent a network for providing broadband internet to the premises 102. For example, the backhaul 134 may include or represent cables (e.g., fiber-optic cables) that span between the utility pole structures 114 and which ultimately route to the SPN 116 for providing broadband internet. In some instances, the backhaul 134 may first route to a middle-mile location with broadband internet (e.g., hospital, police station, etc.) before routing to the SPN 116. In some instances, additionally or alternatively, the base station radio devices 106 may communicate with the SPN 116 via wireless technologies (e.g., mmWave). However, the backhaul 134 may be routed differently than shown for communicating with the SPN 116. For example, rather than the backhaul 134 being disposed on the utility pole structures 114, the backhaul 134 (or portions) thereof may be buried and the base station radio devices 106 may couple to the backhaul 134. In such instances, the base station radio devices 106 may be disposed on vertical structures (e.g., light poles).

Regardless of the specific implementation, the base station radio devices 106 may be connected to the SPN 116 for accessing broadband internet provided by the SPN 116. Disposing the base station radio devices 106 on the utility pole structures 114 utilizes an existing network of vertical structures for providing broadband internet. Furthermore, discussed herein, disposing the base station radio devices 106 on the utility pole structures 114, or other vertical structures, may provide an unobstructed transmission path (or reduced unobstructed path) between the base station radio devices 106 and the CPEs 108, vice versa. Additionally, noted above, in communities that lack the utility pole structures 114, the base station radio devices 106 may be disposed on vertical structures other than the utility pole structures 114, such as light poles.

The base station radio devices 106 may function to provide broadband internet to one or more premises. For example, a first base station radio device may be disposed on a first powerline structure to provide broadband internet to one or more first premises, while a second base station radio device may be disposed on a second powerline structure to provide broadband internet to one or more second premises. In some instances, the one or more first premises may be the same as, or include some of, the one or more second premises. For example, referring to FIG. 1, the base station radio device 106 may provide broadband internet to multiple premises, including the premises 102. However, it is to be understood that more than two base station radio devices 106 may be included and any number of base station radio devices 106 may installed for providing broadband internet to a geographical region. For example, within densely populated areas, a larger number of base station radio devices 106 may be installed per block, radius, mile, etc. as compared to less densely populated areas. In this sense, the system 104 may be scaled as needed depending on demand, usage, and/or throughput requirements.

The base station radio devices 106 may communicate with nearby CPEs, such as the CPE 108, installed at the premises 102. The base station radio device 106 may wirelessly communicate with the CPE 108 via a communication channel 118 to provide broadband internet offered by the SPN 116. In some instances, the communication channel 118 between the base station radio device 106 and the CPE 108 may support any dynamically shared spectrum (DSS) (e.g. between 3100 MHz and 4200 MHz). In some instances, the communication channel 118 may support the Citizens Broadcast Radio Spectrum (CBRS) between 3550 MHz and 3700 MHz. In some instances, the communication channel 118 may include any low-band, mid-band and/or high-band frequencies, regardless of the DSS. However, it is to be understood that the communication channel 118 may support any range of frequencies for providing broadband internet to the premises 102.

The CPE 108 includes antenna(s) 120 (or a multi-antenna array) for communicating, via the communication channel 118, with the base station radio device 106 and via an antenna of the base station radio device 106 (not shown in FIG. 1). In some instances, depending on the range of frequencies (or spectrum) at which the base station radio device 106 and the CPE 108 are configured to communicate, the CPE 108 may be configured accordingly. For example, the antenna(s) 120 may be interchangeable to accommodate for the spectrum, or range of frequencies, at which the base station radio device 106 and the CPE 108 communicate. In such instances, components of the CPE 108 may be modular or configurable to change antennas, modems, interfaces, and so forth. Multiple antennas, or antenna housings, may be configured to attach to the CPE 108. Such configuration may make the CPE 108 modifiable to accommodate new technologies and communication protocols.

The CPE 108 may include, or the antenna(s) 120 of the CPE 108 may represent, a multi-antenna array having antennas (e.g., two, three, four, etc.) arranged with different polarizations. The antenna(s) 120 may include sub-arrays having multiple patches or elements (e.g., two). In some instances, each sub-array of the multi-antenna array may include two orthogonally polarized elements and each element of the sub-array may include a dedicated antenna feed port. By selecting specific polarizations, and determining the phase and or amplitude of the antenna feeds, the antenna(s) 120 may have a radiation pattern with a predetermined variable polarization.

In some instances, the predetermined variable polarization may be a function of the direction of departure and arrival of signals and/or in the antenna array. For example, the antenna array may have linear, circular, and/or elliptical polarizations, which may be a function of the direction of arrival/departure in the antenna array pattern. By diversifying the polarization, the CPE 108 may more effectively communicate with the base station radio device 106. Stated alternatively, the base station radio device 106 may more efficiently communicate with the CPE 108 given the variable polarization over a beamwidth generated by antenna(s) 120 of the CPE 108. For example, the antenna(s) 120 of the CPE 108 may enhance the apparent diversity via predetermined polarizations to allow the base station radio device 106 to implement DPL mitigation and mitigate interference and jamming through spatial and polarization processing over the bandwidth of the signal. This is in comparison to conventional antennas that are conditioned on a fixed polarization or fixed dual orthogonal polarization.

The CPE 108 may be constrained such that, for example, only one transmit port is provided. In this example, the polarization diversity may be accomplished, at least in part, by splitting the transmitter power and precoding the phase and/or amplitude of the transmit signal feeds into the elements of the sub-arrays. For example, to adjust the polarization, and/or the direction of departure/arrival of signals in the multi-antenna array, the phase and/or amplitude of the feeds to/from the elements may be predetermined. In some instances, the phase and/or amplitude may be determined as a function of the direction of arriving signals/transmitting signals (i.e., where the multi-antenna array is receiving signals from and transmitting signals to). The selection of the amplitudes and phase shifts are predetermined to minimize transmitter gain variation across the antenna pattern and maximize the polarization diversity over the antenna pattern.

In some instances, the CPE 108 may be configured to attach as a meter collar and within existing electric meters (or panels), which may be a smart meter of the premises 102. Additional details of the meter collar are discussed in detail herein. However, generally, the meter collar includes a power module configured to supply power to the CPE 108 and which couples to the electrical wiring of the premises 102. Alternatively, the CPE 108 may attach to the premises 102 at any demarcation point between a utility service and the premises 102 (e.g., electrical panel).

The CPE 108 may include one or more interface(s) for communicatively coupling with the router 110 and providing the broadband internet to the consumer device(s) 112. In some instances, the interfaces communicatively couple the CPE 108 and the router 110 over the electrical wiring of the premises 102 for providing broadband internet to the consumer device(s) 112 within the premises 102. (e.g., personal computer, laptop, television, printer, audio/video receiver, audio equipment, video equipment, mobile devices, tablets, etc.). For example, the CPE 108 is shown including a first BPL interface 122 for communicating with a second BPL interface 124 of the router 110. In addition, the CPE 108 may include a first modem module 126 for communicating with a second modem module 128 of the router 110. The CPE 108 may include alternate interfaces as well, such as a LAN interface for communicating with the router 110.

Collectively, the BPL interfaces and the modem modules may provide broadband internet to the consumer device(s) 112. For example, the BPL interfaces allow the CPE 108 and the router 110 to communicate over the electrical wiring of the premises 102 for coupling the consumer device(s) 112 to the SPN 116. The modem modules act to wirelessly receive and transmit data between the SPN 116 and the consumer device(s) 112. To briefly illustrate, the first modem module 126, via the antenna(s) 120, may receive broadband data from the base station radio device(s) 106. This broadband data is communicated with the first BPL interface 122. The first BPL interface 122 then transmits the broadband data through the premises structure 130, via the electrical wiring of the premises 102, to the second BPL interface 124. The second modem module 128 then receives the broadband data from the second BPL interface 124, and using antenna(s) 132, broadcasts the broadband data via Wi-Fi to the consumer device(s) 112. For example, the second modem module 128 may include a Wi-Fi module to supply wireless internet to the premises 102. Additionally, while one pathway of communication is described, it is to be understood that the router 110 may similarly communicate with the CPE 108 for transmitting data from the CPE 108 to the base station radio device 106 and the SPN 116.

The first modem module 126 and/or the second modem module 128 may be configured for certain spectrums. For example, the first modem module 126 may be modular for adapting the CPE 108 to communicate with the base station radio device 106 over a range of frequencies, and the second modem module 128 may be modular for adapting the CPE 108 to communicate with the consumer device(s) 112 over a range of frequencies. For example, in some instances, the first modem module 126 may represent a CBRS modem for communicating with the base station radio device 106 in the CBRS (3550 MHz-3700 MHz). Alternatively, the first modem module 126 may represent a DSS modem for communicating with the base station radio device 106 via any frequency of the DSS (3100 MHz-4200 MHz). However, it is to be understood that the first modem module 126 may include other modules (e.g., WWAN), interfaces, or components for wirelessly communicating with the base station radio device 106 over any frequency, or range of frequencies, such as mmWave.

The first modem module 126 may additionally or alternatively be configured for wired technologies (e.g., Ccable, DSL, twisted pair, etc.). In such instances, the CPE 108 may have ports or receptacles for receiving the physical connections. Additionally, the first modem module 126 may be interchangeable depending on the specific configuration of the CPE 108 (e.g., CBRS, BPL, mmWave, LAN, Optical etc.) or the router 110 (e.g., 5G, Wi-Fi, etc.). The CPE 108 may therefore be modular, with interchangeable modem module(s) depending on the specific implementation and technologies at the premises 102. In some instances, the CPE 108 may include an expansion port(s) (e.g., UART, I²C, SPI, SDIO, USB, GPIOs, etc.), a real-time clock, temperature sensor(s), a Joint Test Action Group (JTAG), and/or a 6× sensor.

Additionally, the second modem module 128 may represent other modems coupled to the antenna(s) 132 and which are configured to provide Wi-Fi to the consumer device(s) 112. For example, the second modem module 128 may be configured to provide Wi-Fi other than 2.4 GHz and 5.0 GHz (e.g., Near Field Communication (NFC)). Additionally, or alternatively, in some instances, the router 110 may wirelessly broadcast the broadband internet to the consumer device(s) 112 via wired technologies such as Ethernet, USB, coaxial, fiber optic, and the like. In such instances, the router 110 may include plug-ins for receiving the wired technologies.

In some instances, the router 110 may represent a wall plug-in or device that otherwise plugs into a power outlet within the premises 102. The router 110 may receive power, via the power outlet, and ultimately via the electrical wiring of the premises 102. As the CPE 108 couples to the electrical wiring of the premises 102, via coupling to the electric meter, the CPE 108 may communicate with the router 110 over the electrical wiring within the premises 102. For example, the meter collar may couple the CPE 108 with the neutral, earth ground wires and/or the line voltage wires that are fed into the premises 102 (or which feed into the breaker box of the premises 102). Once the router 110 is plugged in, the CPE 108 may communicate with the router 110 using the electrical wiring (e.g., wires). The BPL interfaces of the CPE 108 and the router 110, respectively, decipher, interpret, and communicate with one another for transmitting and receiving data. In some instances, the CPE 108 and the router 110 may be paired together as part of an installation process in order to provide the broadband internet.

In some instances, the router 110 may be plugged into a wall outlet located closest to the electric meter for reducing a noise and/or decay of the broadband data over the electrical wiring of the premises 102. For example, the broadband data may become attenuated with increased wire lengths between the CPE 108 and the router 110. Additionally, appliances and/or devices that pull from the power supplied to the premises 102, via the electrical wiring, may generate noise. In some instances, the router 110 may be installed within a breaker box, or in close proximity to the breaker box.

As shown in FIG. 1, the CPE 108 may mount to an exterior (e.g., outdoor) of the premises 102 and the router 110 may mount within or be disposed within an interior (e.g., indoor) of the premises 102. This combination, or respective positioning of the CPE 108 and the router 110 may alleviate issues associated with building penetration. For example, wireless signals may fail to penetrate building materials (e.g., siding, roofing, studs, windows, etc.) of homes and/or business. By mounting the CPE 108 on an exterior-side of the premises 102, and communicatively coupling the CPE 108 with the router 110 located on the interior-side of the premises 102 broadband internet may be provided to the consumer device(s) 112. This may provide high-throughput wireless technologies (e.g., 4G LTE, 5G, etc.) to the premises 102 and without experiencing lag, latency, and/or buffering.

However, in wireless technologies, challenges in NLOS application may introduce challenges. These challenges may be addressed, in part, by the polarization diversity of the CPE 108. For example, in NLOS applications, signals incident at the base station radio device 106 may be cross-polarized. This may result in PDL and/or the transmission path (channel) may exhibit frequency selective multi-path fading where reflected copies of the signal cancel one another at the antenna of the base station radio device 106 to create a transmission null. However, the diversity of the polarization within the antenna(s) 120 allows the base station radio device 106 to implement PDL mitigation and adaptive interference mitigation based at least in part on PMD processing.

In other words, the antenna(s) 120 intentionally introduces diversity for transmitting signals and for communicating over channels with the base station radio device 106. This makes it possible in MIMO applications to perform digital baseband space or polarization processing with transmission/receiving ports. For example, when a single transmission port is intended to communicate with a multi-port receiver equipped with coherent spatial and/or polarization combining capability, there is a significant advantage if the transmitter can maximize the spatial and polarization diversity transmitted into the channel. In effect, the antenna(s) 120 may support a predetermined polarization as a function of direction (e.g., azimuth) and based on the spatial or polarization properties of the elements within the antenna(s) 120. In some instances, the antenna(s) 120 may have a compact non-planar array of two or more dual-polarized sub-arrays. However, the antenna(s) 120 may have any number of dual-polarized sub-arrays, such as four.

In some instances, the CPE 108 or the antenna(s) 120 of the CPE 108 may be configured to beam-form for achieving optimum link properties with the base station radio device(s) 106. In some instances, the beam-forming may be achieved by using an antenna array or a MIMO antenna. Additionally, in some instances, the MIMO antenna may combine or aggregate signals received over disparate spectrums (or frequencies). Once combined, these signals may be provided to the premises 102 as broadband internet. For example, in some instances, the CPE 108 may combine broadband data received via mmWave frequencies and other spectrums (e.g., CBRS) for providing high bandwidth and throughput to the premises 102. Such aggregation may also utilize currently available bandwidths and/or loads on the DSS. That is, a portion of the broadband internet supplied to the premises 102 may come by way of CBRS, while another portion may come by way of mmWave.

Additionally, in some instances, the antenna(s) 120 of the CPE 108 may position at various positions on and/or around the premises 102 for achieving an increased signal strength with the base station radio device 106. For example, as shown in FIG. 1, the CPE 108 may mount to a side of the premises 102 facing the base station radio device 106. In some instances, however, the electric meter may not be facing the base station radio device 106 and/or a line of sight between the electric meter and the base station radio device 106 may be obstructed (e.g., trees, fences, buildings, etc.). In such instances, when the CPE 108 mounts to the electric meter, the antenna(s) 120 may be similarly obstructed, which may impact the communication channel 118 and/or reduce a signal strength between the base station radio device 106 and the CPE 108. Here, the antenna(s) 120, in some instances, may extend from the CPE 108 (coupled to the utility meter) to dispose the antenna(s) 120 at various positions for potentially eliminating physical obstructions between the base station radio device 106 and the antenna(s) 120. In these instances, the antenna(s) 120 may communicate the broadband data back to the CPE 108 via a cable. The cable may extend to various lengths using, for example, a cable recoil system (e.g., torsional spring, retractable reel, etc.). To find the optimum location of the antenna(s) 120 on the premises 102, various techniques or instruments may be used. Once the optimum location is found (e.g., highest signal strength), the antenna(s) 120 may be mounted at that location.

In some instances, and as alluded to above, the CPE 108 may be covered by another base station radio device 106 mounted on another powerline structure and in communication with the CPE 108. These base station radio devices 106 may also be connected to the same SPN 116 (via the backhaul 134) as the CPE 108 to provide the broadband internet to the CPE 108. In some instances, the CPE 108 may connect with a nearest base station radio device 106, a base station radio device 106 with which the CPE 108 has a strongest signal strength, and/or a base station radio device 106 having bandwidth to connect with the SPN 116. In other instances the CPE 108 may be simultaneously connected to multiple base station radio devices 106 for allowing aggregation of data from the multiple base station radio devices 106.

In some instances, the CPE 108 may be configured to read electrical information, such as electrical consumption and/or generation over a certain period, statistical data analysis of thereof, outage information, etc. associated with the electric meter. The CPE 108 may also communicatively couple to other internet-accessible devices (e.g., IoT) of the premises 102 for reading electrical usage and/or status. For example, the CPE 108 may report, or provide, data indicating energy savings, usage, load to service, and/or other statistical information of the premises 102. In such instances, the CPE 108 may tap into power systems or components of the premises 102 for providing such information (e.g., batteries, solar panels, etc.). In some instances, the CPE 108 may be configured to transmit the electrical information, usage data, and/or status data to a service entity (not shown) associated, via the communication channel 118 (and/or another communication channel) for advanced metering and providing essential services.

In some instances, although the router 110 is discussed as being separate from the CPE 108, in some instances, the router 110 may be integrated within the CPE 108. In such instances, the integrated CPE may be disposed within the premises 102 and/or exterior the premises 102. Additionally, or alternatively, in some instances the CPE 108 and the router 110 may wirelessly communicate with one another. In such instances, the CPE 108 and the router 110 may not communicate using the existing electrical wiring within the premises 102. Instead, the CPE 108 and the router 110 may include wireless interfaces/modems for communicating with one another. However, noted above, in some instances, the CPE 108 may act as a wireless router for providing broadband internet to the premises 102. Furthermore, in some instances, the router 110 may be integrated within the CPE 108 and/or the CPE 108 (with the router 110) may be mounted in the interior or exterior of the premises 102.

In some instances, the CPE 108 may provide for an advanced metering infrastructure (AMI). Generally, AMI is an integrated system of smart meters, communications networks, and data management systems that enables two-way communication between utility companies and consumers. In some instances, AMI may eliminate the need for physically walking or driving to premises within a community to measure readings of power, gas, water, and so forth. In some instances, the CPE 108 may be used as a component of AMI for providing utility data or reporting utility data. This data may be used to optimize utilities, such as system loss, reporting maintenance planning, improving customer perception and engagement, water management, conservation and energy efficiency, consumption versus revenue trends and forecasting, power quality monitoring, theft identification, and revenue recovery.

In part, this optimization may require an understanding of the premises 102, and/or the condition and importance to the overall structure at the premises 102. In some instances, this insight may be gleaned by aggregating utility data, including work history and condition rating, into a single system, balancing the importance of one factor versus another, and updating any condition changes as they occur. By receiving this data in real time, the utility company may obtain a more reliable view of the health of the premises 102, the consumption of utilities and/or services at the premises 102, and may make more meaningful investment and work decisions on how to best balance compliance, reliability, safety and risk. For example, the CPE 108 may provide utility data (or other data) regarding the various components within the premises 102 to the utility service. These components may include meters (e.g., gas, water, electricity, etc.) and/or appliances (e.g., coffee pot, light switch, oven, etc.). By communicatively coupling to these meters and/or appliances, via BPL and/or wireless technologies, data associated with use and consumption may be obtained. For example, the CPE 108 may determine electrical usage of certain appliances, and/or the router 110 may communicatively couple to appliances within the premises 102 (e.g., IoT). This coupling may be used to report usage and consumption data, and/or may be used to control certain appliances (e.g., turning on a furnace when the consumer approached the premises). In some instances, tapping into the electrical wiring may be used to control the assets within the premises 102. For example, by providing broadband data transmission between electrical outlets within the premises 102, or via the wireless communication pathways, there is the potential to network all kinds of common appliances and control their associated operations.

Figure 2:
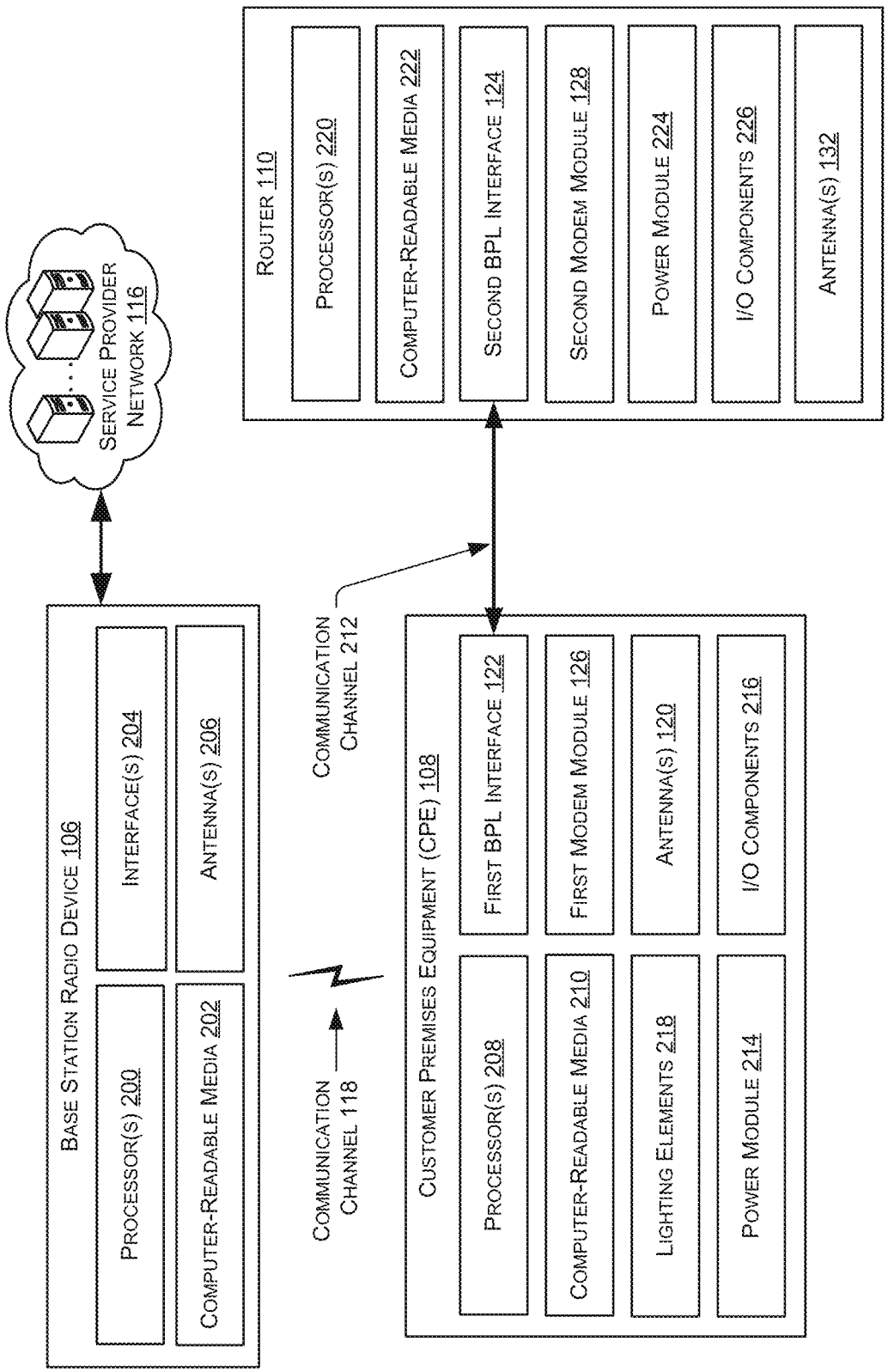
FIG. 2 illustrates example computing components of the base station radio device, the CPE, and the router of FIG. 1, according to an embodiment of the present disclosure.

FIG. 2 illustrates example components of the base station radio device 106, the CPE 108, and the router 110. Discussed above, the base station radio device 106 may be in communication via wired technologies (e.g., a fiber-optic cable network) and/or wireless technologies (e.g., mmWave) with the SPN 116.

The base station radio device 106 may include one or more processor(s) 200, computer-readable media 202, interface(s) 204, and/or antenna(s) 206. The processor(s) 200 may include a central processing unit (CPU), a graphics processing unit (GPU), both a CPU and a GPU, or other processing units or components. Additionally, each of the processor(s) 200 may possess its own local memory, which also may store program modules, program data, and/or one or more operating systems.

The processor(s) 200 may be coupled to the computer-readable media 202 and execute computer executable instructions stored in the computer-readable media 202. The processor(s) 200 may also couple modules and components of the base station radio device 106 to one another and may perform various functions including instructing and causing the modules and components of the base station radio device 106 to perform their associated functions. For example, the processor(s) 200 may cause components of the base station radio device 106 to transmit and receive broadband data from the SPN 116, as well as transmit and receive broadband data from the CPE 108.

As the base station radio device 106 communicatively couple to multiple CPEs 108 to provide broadband internet, the base station radio device 106 may store, in the computer-readable media 202, indicators and/or identifying information of individual CPEs 108. Such information may be utilized for communicating (e.g., routing) with respective CPEs 108 at respective premises 102. For example, a particular base station radio device 106 may provide broadband internet to multiple premises. As the base station radio device 106 sends data to respective premises, or receives data from the respective premises, the base station radio device 106 may tag or otherwise mark this outgoing and incoming data. This marking may indicate which premises is the recipient and/or originator of the data. As such, the base station radio device 106 may transmit the data to the respective premises, or to the proper recipients.

The interface(s) 204 couple the base station radio device 106 to the SPN 116 (e.g., via the fiber-optic broadband network) for accessing broadband internet. Additionally, the interface(s) 204 may couple the base station radio device 106 to the CPE 108. For example, the interface(s) 204 may be coupled to the processor(s) 200 and the antenna(s) 206 for communicating with the CPE 108 (and/or a plurality of CPEs 108) to provide broadband internet. In some instances, the interface(s) 204 may include modems, modules, or other components for wirelessly coupling with the CPE 108. For example, the interface(s) 204 may include a DSS modem module, a CBRS modem module, C-band modem module, a WWAN modem module, and/or any other modem/module for communicating, via the communication channel 118, with the CPE 108 (e.g., mid frequencies, high frequencies, etc.). The base station radio device 106 may therefore include a plurality of interface(s) 204 for communicating with corresponding interfaces (e.g., the first modem module 126) of the CPEs 108.

In some instances, the interface(s) 204 may include interfaces for interacting with wide area networks (WAN), cellular networks, and so forth. The antenna(s) 206 may include an array of antennas for otherwise transmitting data to, and receiving data from, the CPE 108. In some instances, the antenna(s) 206 may beam-form for achieving optimum link properties with the CPE 108 and/or the SPN 116. The base station radio device 106 may include additional interface(s) for communicating with other base station radio devices 106 (and ultimately the SPN 116) using wired and/or wireless technologies. Additionally, the antenna(s) 206 may be capable of receiving signals with varying polarizations from the CPE 108 (e.g., vertical, horizontal, elliptical, etc.).

In some instances, the base station radio device 106 may include input/output (I/O) components coupled to the processor(s) 200. The I/O components may be configured to communicate with a computing device, such as a computing device loaded with appropriate applications for programming or checking the status of the base station radio device 106. For example, the computing device may be operated by a utility service or company providing the broadband internet to the premises 102, and which is used for monitoring and/or troubleshooting issues experienced by the base station radio device 106 and/or the CPE 108. The I/O components may also provide other information from the premises 102, such as usage data, data generated by appliances within the premises 102 (e.g., IoT), for use in energy savings, system management, and/or load to service determination.

The base station radio device 106 communicatively couples to the CPE 108 via the communication channel 118. As shown, the CPE 108 may include one or more processor(s) 208, computer-readable media 210, the antenna(s) 120, the first BPL interface 122, and the first modem module 126, as discussed above with regard to FIG. 1. In some instances, the processor(s) 208 may include a CPU and/or a GPU. Additionally, the processor(s) 208 may possess its own local memory, which also may store program modules, program data, and/or one or more operating systems. The processor(s) 208 may be coupled to the computer-readable media 210 and execute computer executable instructions stored in the computer-readable media 210.

The processor(s) 208 may be also coupled modules and components of the CPE 108 and may perform various functions including instructing and causing the modules and components of the CPE 108 to perform their associated functions. For example, the processor(s) 208 may cause components of the CPE 108 to send and receive broadband data to and from the base station radio device 106, and to send and receive broadband data to and from the router 110. For example, as the antenna(s) 120 receive broadband data from the base station radio device 106, the processor(s) 208 may cause this data to be sent to the router 110 via the first BPL interface 122. The processor(s) 208 may therefore route broadband data from the antenna(s) 120 to interfaces of the CPE 108, and vice versa, for providing broadband internet to the premises 102.

The first BPL interface 122 of the CPE 108 is shown communicating with the second BPL interface 124 of the router 110. For example, a communication channel 212 exists between the first BPL interface 122 and the second BPL interface 124. Noted above, the communication channel 212 may represent a communication channel over the electrical wiring of the premises 102, where the broadband data is transmitted over wires or other cables within the premises 102. However, although the discussion herein is with regard to providing broadband internet over the electrical wiring, the CPE 108 and the router 110 may wirelessly communicate with one another. In such instances, the communication channel 212 may represent a wireless communication channel. Additionally, the CPE 108 and the router 110 may communicate with other wiring of the premises 102

The first BPL interface 122 communicatively couples to the first modem module 126 and the second BPL interface 124 communicatively couples to the second modem module 128. The first modem module 126 may include a corresponding module for communicating with the interface(s) 204 of the base station radio device 106 (e.g., DSS, CBRS, G.hn, WWAN, C-band, etc.). As the first modem module 126 receives broadband data, via the antenna(s) 120, the first modem module 126 may interpret the broadband data. The first BPL interface 122 then transmits the broadband data to the second BPL interface 124, whereby the second modem module 128 may interpret the broadband data. Therein, the second modem module 128 may broadcast the broadband data to the consumer device(s) 112 via the antenna(s) 132 as broadband internet. As the CPE 108 receives data from the base station radio device 106 (via the antenna(s) 120 and the first modem module 126 (e.g., CBRS, DSS, WWAN, etc.), the first BPL interface 122 may transmit (via the communication channel 212) the data to the second BPL interface 124. The second BPL interface 124 receives the data and the second modem module 128 (e.g., 2.4 GHz and/or 5.0 GHz Wi-Fi module) communicatively coupled to the second BPL interface 124 then broadcasts this data, via the antenna(s) 132, to the consumer device(s) 112.

Similarly, the second modem module 128 may receive data from the consumer device(s) 112 (via the antenna(s) 132). The second BPL interface 124 transmits the data to the first BPL interface 122 and the first modem module 126 broadcasts this data to the base station radio device 106 via the antenna(s) 120. The communicative coupling between the first BPL interface 122 and the first modem module 126, the second BPL interface 124 and the second modem module 128, as well as the CPE's 108 connection with the base station radio device 106, permits the system 104 to provide broadband internet over existing electrical wiring of the premises 102.

Although the first BPL interface 122 and the first modem module 126 are shown as separate components, in some instances, the first BPL interface 122 and the first modem module 126 may be integrated as a single component. In some instances, the first BPL interface 122 and the first modem module 126 may be components of a SoC. Noted above, the first modem module 126 may also be modular and interchangeable depending on the frequencies which the first modem module 126 communicates with the base station radio device 106. Additionally, or alternatively, the second BPL interface 124 and the second modem module 128 may be integrated as a single component. In some instances, the second BPL interface 124 and the second modem module 128 may be components of a SoC. The second modem module 128 may also be modular and interchangeable depending on the Wi-Fi or network provided to the premises 102.

In some instances, the antenna(s) 120 may be located inside, outside, or on the outside surface of a housing of the CPE 108, and/or mounted at other locations distant or proximate to the electric meter. In some instance, the antenna(s) 120 may be configured to beam-form for achieving optimum signal strengths with the base station radio device(s) 106. In some instances, the antenna(s) 120, or an antenna array, may support 3100 MHz to 4200 MHz dual port/polarization, include a gain of 4 dBi, and may include an antenna pattern of 180 degrees azimuth −0+70 degrees vertical.

As introduced above, the CPE 108 may include, or the antenna(s) 120 may represent, a multi-antenna array having antennas arranged with different polarizations. The antenna(s) 120 may include sub-arrays having multiple elements and each sub-array of the multi-antenna array may include two orthogonally polarized elements. Additionally, the antenna(s) 120 may have a radiation pattern with a predetermined variable polarization. In some instances, the predetermined variable polarization may be a function of the direction of departure and arrival of signals at the antenna(s) 120. In some instances, the polarization diversity may be accomplished, at least in part, by precoding the phase and/or amplitude of the antenna feeds into the elements of the sub-arrays. Elements of the antenna array will constructively interfere if elements realize the same polarization and relative phase. When constructive interference is undesirable (e.g., when gain flatness is desired to meet FCC radiation limits), the relative phase of the two interfering elements may be precoded with a 180° phase offset resulting in the replacement of the constructive interference with destructive interference. Thus the gain peak is replaced with a gain null in a particular pattern azimuth and elevation.

In some instances, this may be accomplished, at least in part by determining a geometry for a compact antenna, as well as gain and pattern objectives for the antenna array. Three-dimension simulation may be carried out to obtain equal phase and amplitude patterns. The selected elements may be converted to orthogonal polarization to eliminate first order pattern peaks. Therein, the phase and/or amplitude may be adjusted for co-polarized elements to flatten the pattern response. Additionally, the phase and/or amplitude of cross-polarized elements may be adjusted to maximize polarization diversity.

The CPE 108 includes a power module 214 coupled to the processor(s) 208. The power module 214 may be coupled to the electric meter of the premises 102 to supply electrical power from the electric meter to some or all components and modules of the CPE 108. The CPE 108, or a housing of the CPE 108, may be configured to attach as a meter collar to the electric meter. Coupling the CPE 108 to the utility meter in this manner also communicatively couples the first BPL interface 122 with the second BPL interface 124 via the electrical wiring of the premises 102. In this sense, the power module 214 may tap into the electrical wiring of the premises 102 for sending broadband data through the wiring of the premises 102, for delivery to the router 110. Using this form of communication allows broadband internet to penetrate the premises 102 using existing wiring networks and alleviates the building penetration problem.

The CPE 108 may additionally include input/output (I/O) components 216 coupled to the processor(s) 208. The I/O interface components 216 may be configured to communicate with a programming device, such as a computing device of the utility service, or other device loaded with appropriate applications for programming or checking the status of the CPE 108 (or the broadband internet). This communication may provide for testing, system upgrades, reboots, and so forth. The communication may also include data from an IoT within the premises 102 for use in load to service determination, energy savings, system usage, and so forth. In such instances, a user interface (UI) may be provided for interfacing with the CPE 108. In some instances, the I/O components 216 may comprise a connector, such as a telco connector, a USB connector, a RJ45 connector, and the like, and/or an RF communication module such as a NFC, Bluetooth communication, or Wi-Fi communication module for such communication.

In some instances, the CPE 108 may also include lighting element(s) 218 that indicate an operational state of the CPE 108 (e.g., light emitting diodes (LEDs)). The lighting element(s) 218 may indicate, for example, a strength of the broadband internet (e.g., Received Signal Strength Indicator (RSSI)), a packet error rate (PER) associated with receiving broadband data from the CPE 108 and/or the router 110, or a health of the connection with the base station radio device 106 (e.g., the communication channel 118) and/or the connection with the router 110 (e.g., the communication channel 212). The lighting element(s) 218 may additionally or alternatively indicate power, BPL link, and may be disposed on side of CPE 108 and/or viewable at all angles.

The computer-readable media 210 of the CPE 108 may also store electrical information associated with the electric meter, electrical information of the premises 102, connectivity of the consumer device(s) 112, and the like for reporting to a utility service. In some instances, the power module 214 may read the electrical information from memory of the electric meter provider for transmitting the electrical information to the associated service entity using the broadband internet. The CPE 108 may also include a global positioning system (GPS) component and/or other locating components for determining a location of the CPE 108 amongst a network or grid. Temperature sensors of the CPE 108 may also monitor a temperature within the CPE 108. Additionally, the CPE 108 may include components for determining an orientation or angle at which the CPE 108, or the antenna(s), are disposed (e.g., gyroscope, inclinometer, etc.).

The router 110 may include one or more processor(s) 220, computer-readable media 222, and the second BPL interface 124 and the second modem module 128 as discussed above with regard to FIG. 1. In some instances, the processor(s) 220 may include a CPU and/or a GPU. Additionally, the processor(s) 220 may possess its own local memory, which also may store program modules, program data, and/or one or more operating systems. The processor(s) 220 may be coupled to the computer-readable media 222 and execute computer executable instructions stored in the computer-readable media 222. The processor(s) 220 may also be coupled to modules and components of the router 110 and may perform various functions including instructing and causing the modules and components of the router 110 to perform their associated functions.

The router 110 includes a power module 224 coupled to the processor(s) 220. The power module 224 may be coupled to a power supply of the premises 102 (e.g., the electrical wiring) and receive electrical power to power components and modules of the router 110. Coupling the router 110 to the electrical wiring in this manner couples the second BPL interface 124 with the first BPL interface 122 via electrical wiring of the premises 102.

In some instances, the router 110 may include input/output (I/O) components 226 coupled to the processor(s) 220. The I/O components 226 may be configured to communicate with a computing device, such as a computing device loaded with appropriate applications for programming or checking the status of the router 110. For example, the computing device may be operated by a utility service providing the broadband internet to the premises 102, and which is used for monitoring and/or troubleshooting issues experienced by the base station radio device 106 and/or the CPE 108. Discussed above, the router 110 includes the antenna(s) 132 for broadcasting the broadband internet within the premises 102. Additionally, or alternatively, the router 110 may include plug-ins (e.g., Ethernet) for coupling to the consumer device(s) 112.

As used herein, a processor, such as the processor(s) 200, 208, and/or 220 may include multiple processors and/or a processor having multiple cores. Further, the processor(s) may comprise one or more cores of different types. For example, the processor(s) may include application processor units, graphic processing units, and so forth. In one implementation, the processor(s) may comprise a microcontroller and/or a microprocessor. The processor(s) may include a graphics processing unit (GPU), a microprocessor, a digital signal processor or other processing units or components known in the art. Alternatively, or in addition, the functionally described herein can be performed, at least in part, by one or more hardware logic components. For example, and without limitation, illustrative types of hardware logic components that may be used include field-programmable gate arrays (FPGAs), application-specific integrated circuits (ASICs), application-specific standard products (ASSPs), system-on-a-chip systems (SOCs), complex programmable logic devices (CPLDs), etc. Additionally, each of the processor(s) may possess its own local memory, which also may store program components, program data, and/or one or more operating systems.

Computer-readable media, such as the computer-readable media 202, 210, and/or 222 may include volatile and non-volatile memory, removable and non-removable media implemented in any method or technology for storage of information, such as computer-readable instructions, data structures, program component, or other data. Such memory may include, but is not limited to, RAM, ROM, EEPROM, flash memory or other memory technology (e.g., embedded Multi-Media Controller (eMMC), SPI NOR), CD-ROM, digital versatile disks (DVD) or other optical storage, magnetic cassettes, magnetic tape, magnetic disk storage or other magnetic storage devices, RAID storage systems, DDR-SDRAM or any other medium which can be used to store the desired information and which can be accessed by a computing device. The memory may be implemented as computer-readable storage media ("CRSM"), which may be any available physical media accessible by the processor(s) to execute instructions stored on the memory. In one basic implementation, CRSM may include random access memory ("RAM") and Flash memory. In other implementations, CRSM may include, but is not limited to, read-only memory ("ROM"), electrically erasable programmable read-only memory ("EEPROM"), or any other tangible medium which can be used to store the desired information and which can be accessed by the processor(s).

Figure 3A:
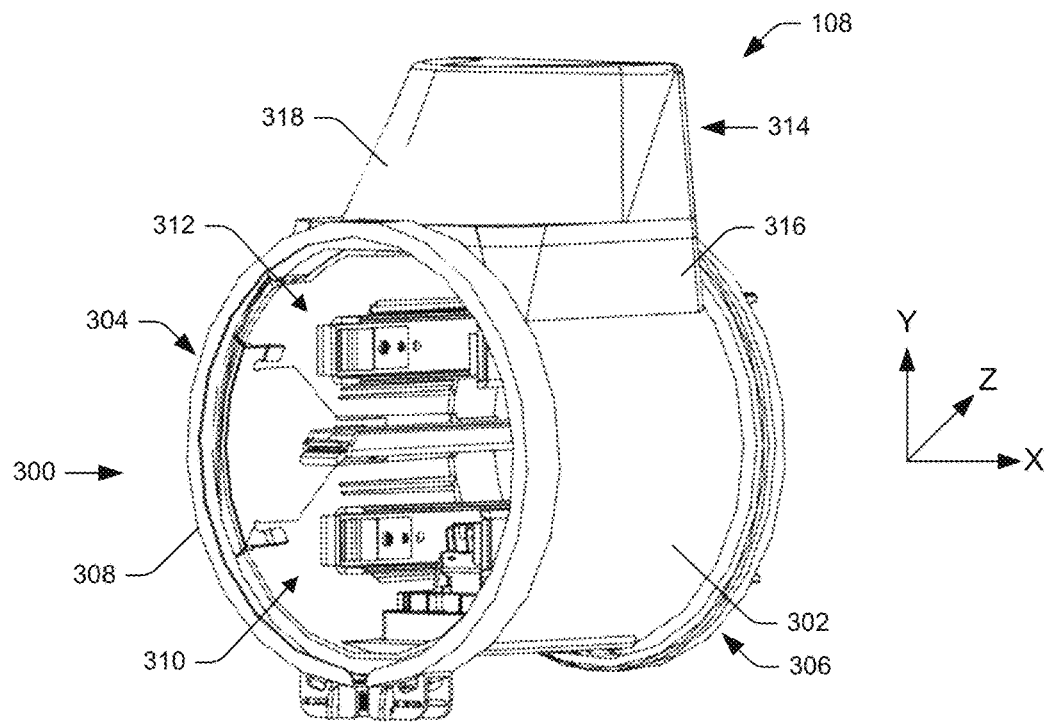
FIG. 3A illustrates a first perspective view of the CPE of FIG. 1, according to an embodiment of the present disclosure.
Figure 3B:
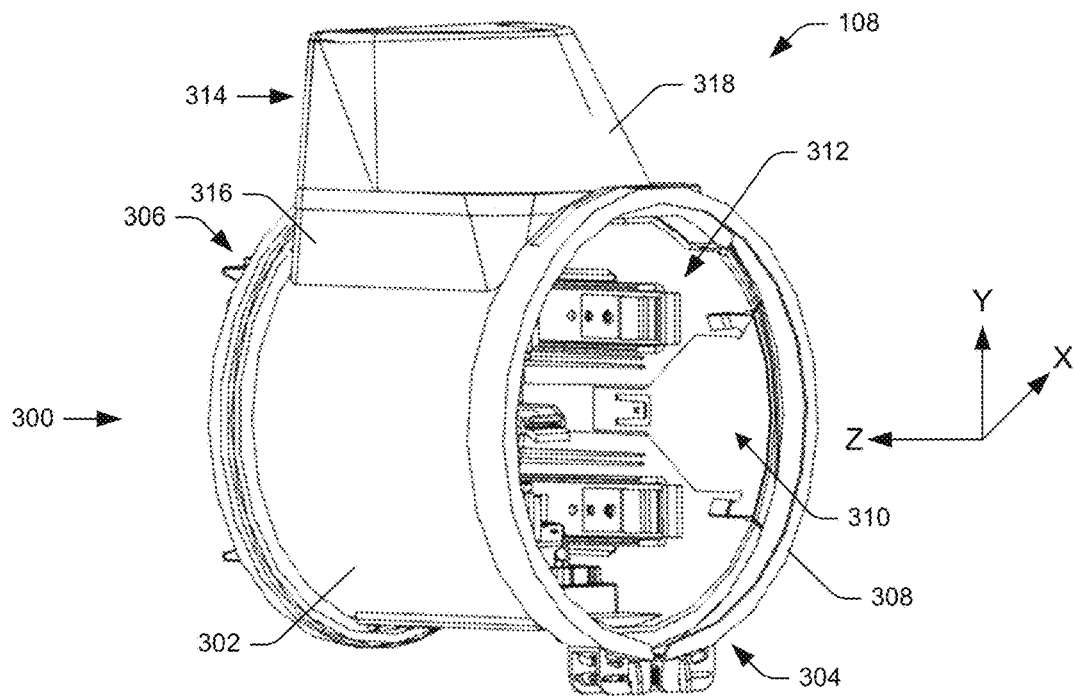
FIG. 3B illustrates a second perspective view of the CPE of FIG. 1, according to an embodiment of the present disclosure.

FIGS. 3A and 3B illustrates the CPE 108 for communicatively coupling with the base station radio device 106 and the router 110 within the premises 102. The CPE 108 is shown including a collar 300 for coupling the CPE 108 to an existing electric meter. However, the CPE 108 may include other bodies for coupling to electrical wiring at the premises 102.

In some instances, the CPE 108 may represent a fixed wireless device installed at the premises 102, within an existing electric meter panel. In such instances, the collar 300 may include components for coupling to an existing electric meter panel and receiving the electric meter. Although the collar 300 is discussed as being part of the CPE 108, or that the collar 300 has certain components, it should be understood that referring to the CPE 108 may include the collar 300 and the components thereof. That is, the CPE 108 may include the collar 300 (as well as its components) and the collar 300 may represent a portion of the CPE 108 placed at or on the premises 102.

The collar 300 may include a cylindrical shaped housing or body 302. The body 302 extends between a first end 304 and a second end 306, opposite the first end 304 and spaced apart in the Z-direction from the first end 304. In some instances, the first end 304 may correspond to a front of the collar 300 and the second end 306 may correspond to a back of the collar 300. The first end 304 is shown including an opening or annulus 308 for receiving an electric meter. In some instances, the annulus 308 may include a circular-shape and may be sized and configured for receiving the electric meter. The annulus 308 provides access to an interior 310 of the collar 300. Discussed herein, the interior 310 may include components of the CPE 108 and/or features for receiving the electric meter. For example, the interior 310 may include receptacles or slots 312 for receiving prongs of the electric meter. The slots 312 may extend along a lengthwise direction of the body 302 (e.g., Z-direction) and may function to complete a circuit from incoming power to the breaker box (or electrical panel) located within the premises 102. In some instances, the slots 312 may include five slots corresponding to hot wires and neutral wire(s).

The CPE 108 includes a top portion 314 mounted atop (e.g., Y-direction) of the body 302. The top portion 314 may include a base 316 and a cover 318. The base 316 may provide a platform for supporting the cover 318 or onto which the cover 318 mounts. As shown, the base 316 may include features that conform to a curvature or shape of the body 302 and features for receiving the cover 318. For example, one side of the base 316 may be curved for accommodating the body 302 and a second side may be planar for providing a substantially flat platform for the cover 318.

Disposed behind (i.e., beneath, underneath, etc.) the cover 318 may be the antenna(s) 120 and components of the CPE 108, as discussed above with regard to FIG. 2. The cover 318 may represent a radome for enclosing and protecting the antenna(s) 120 as well as other components of the CPE 108 from environmental conditions (e.g., rain, dust, debris, etc.). In some instances, the cover 318 may be manufactured from materials, including but not limited to, plastics, rubber-coated air-supported fabric, and/or other materials with low radio frequency loss characteristics.

The location of the cover 318 may increase an ease of maintenance, servicing, and/or upgrading components of the CPE 108. For example, as technology increases and/or as vendors continue to develop higher throughput technologies (e.g., 5G), the antenna(s) 120 and/or interfaces of the CPE 108 may be upgraded. Here, the top portion 314 may uncouple from the collar 300 (or the body 302). A new top portion, which may include upgraded antenna(s), circuits, etc. may be disposed in place of the existing top portion. In such instances, locating the antenna(s) within the top portion 314, and external to the interior 310 of the collar 300, may allow for interchangeability as new technologies are introduced, as components fail and are in need of repair, and/or for configuring the CPE 108 to communicate with the base station radio device 106 using a certain spectrum (e.g., CBRS, C-band, etc.) and/or any other wireless technologies. In some instances, the top portion 314 may have a quick disconnect feature from the body 302 for quickly removing the top portion 314 and/or to replace the top portion 314.

Figure 4A:
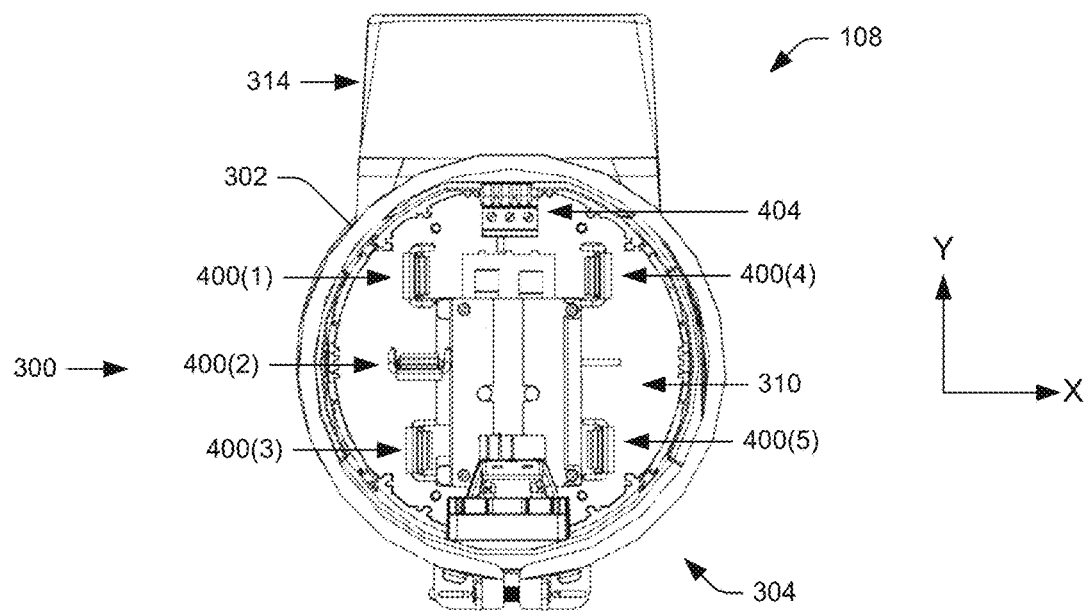
FIG. 4A illustrates a first end view of the CPE of FIG. 1, according to an embodiment of the present disclosure.
Figure 4B:
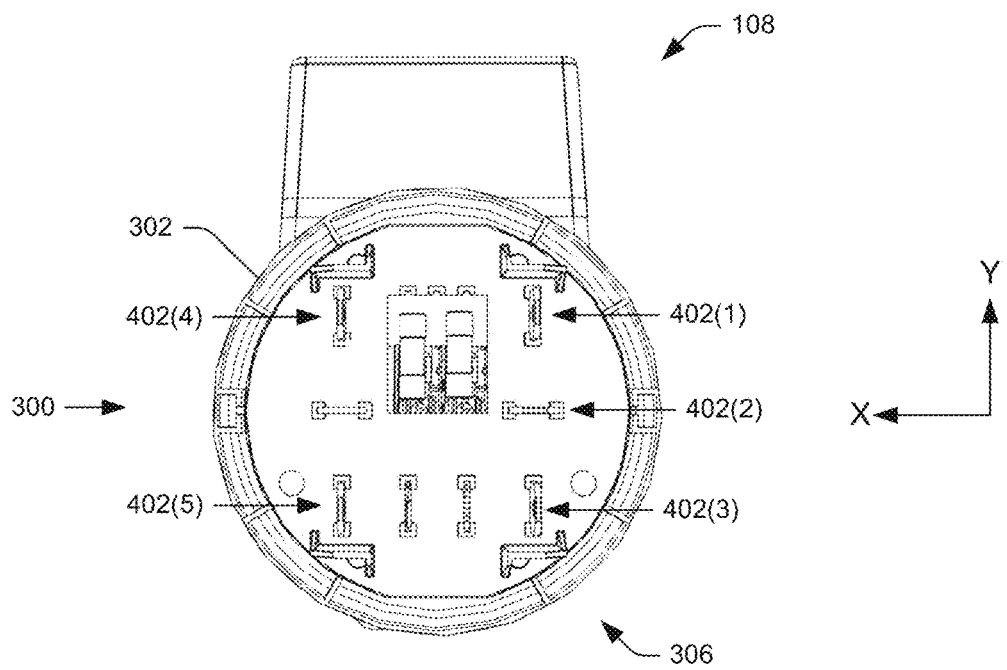
FIG. 4B illustrates a second end view of the CPE of FIG. 1, according to an embodiment of the present disclosure.

FIGS. 4A and 4B illustrate the CPE 108, including the collar 300, from opposing ends. For example, FIG. 4A illustrates the first end 304 of the body 302, such as the front, and FIG. 4B illustrates the second end 306 of the body 302, such as the back.

Discussed above, the interior 310 may include the slots 312, such as a first slot 400(1), a second slot 400(2), a third slot 400(3), a fourth slot 400(4), and a fifth slot 400(5). The first slot 400(1), the second slot 400(2), the third slot 400(3), the fourth slot 400(4), and the fifth slot 400(5) may collectively be referred to herein as "the slots 312." The slots 312 serve to transfer power as supplied by a utility service to a breaker box within the premises 102. An electric meter couples to the slots 312 for completing a circuit such that power may be supplied to the premises 102. In some instances, the first slot 400(1) may couple to a first hot wire received from the utility service for providing a first hot lead, the second slot 400(2) may couple to a neutral wire received from the utility service, the third slot 400(3) may operably couple to the first hot wire (or the first hot lead) for providing power to breaker box, the fourth slot 400(4) may couple to a second hot wire received from the utility service for providing a second hot lead, and the fifth slot 400(5) may operably couple to the second hot wire (or the second hot lead) for providing power to breaker box. In other words, power may transfer through the electric meter, between the first slot 400(1) and the third slot 400(3), and between the fourth slot 400(4) and the fifth slot 400(5). The second slot 400(2) serves to ground the premises 102. In this sense, the first slot 400(1) and the fourth slot 400(2) may be on the utility side (utility service side), while the third slot 400(3) and the fifth slot 400(5) may be on the premises side (consumer side).

The collar 300 may include a plurality of prongs for connecting to slots, or other receptacles, within the electric meter panel. For example, in FIG. 4B, the collar 300 is shown including five prongs, such as a first prong 402(1), a second prong 402(2), a third prong 402(3), a fourth prong 402(4), and/or a fifth prong 402(5). Collectively, the first prong 402(1), the second prong 402(2), the third prong 402(3), the fourth prong 402(4), and/or the fifth prong 402(5) maybe referred to as "the prongs 402." Each of the prongs 402 may couple or be connected to corresponding slots 312 for transferring power and/or grounding the premises 102. For example, the first prong 402(1) may couple to the first slot 400(1), the second prong 402(2) may couple to the second slot 400(2), the third prong 402(3) may couple to the third slot 400(3), the fourth prong 402(4) may couple to the fourth slot 400(4), and/or the fifth prong 402(5) may couple to the fifth slot 400(5). In this sense, the collar 300 may act as an extension or coupler for connecting the electric meter to the electric meter panel.

Once the prongs 402 couple with corresponding slots of the electric meter panel (or otherwise couple to the electric meter panel) and prongs of the electric meter couple within the slots 312 of the collar 300, the collar 300 may be interposed between the electric meter panel and the electric meter. Such coupling may not impact the functioning of the electric meter and/or the power supplied to the premises 102. However, interposing the collar 300 in this matter provides power to the CPE 108 and allows the CPE 108, or components thereof (e.g., the first BPL interface 122, the first modem module 126, the power module 214, etc.) to receive power and connect to the electrical wiring of the premises 102 for providing broadband internet using BPL technology.

In FIG. 4A, at least a portion of a first connector 404 is shown extending into the interior 310. The first connector 404 may couple to a second connector of the top portion 314. The coupling between the first connector 404 and the second connector may communicatively couple the top portion 314, or portions therein such as the antenna(s) 120, to other components of the CPE 108. Additionally, a coupling of the first connector 404 and the second connector of the top portion 314 may communicatively couple the CPE 108 to electrical wiring of the premises 102 for providing broadband internet to the premises. For example, the first connector 404 may communicatively couple to the electrical wiring of the premises 102 (e.g., via coupling to the slots 312 and/or the prongs 402 (e.g., via cables, wires, etc.). Additionally, the first connector 404 may include prongs, receptacles, male/female connectors, etc. for providing power to the top portion 314. For example, the second connector of the top portion 314 may snap or fit into receptacles of the first connector 404 for providing power to the top portion 314, transferring data, etc. A passage of the body 302 may be disposed through an opening of the body 302, atop the body 302 (Y-direction), for providing access to the first connector 404.

Figure 5A:
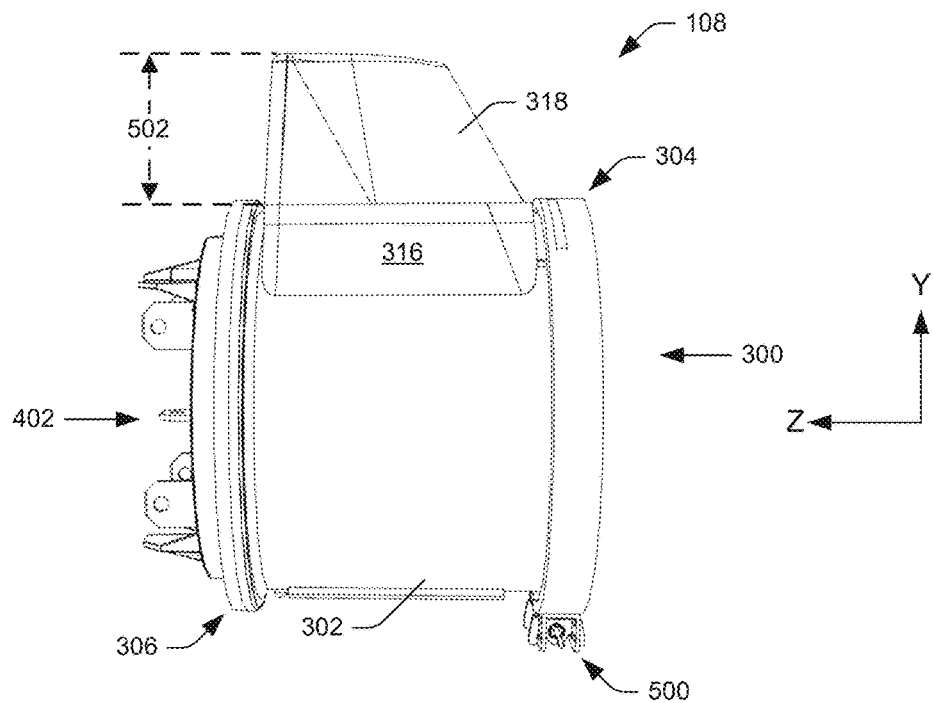
FIG. 5A illustrates a first side view of the CPE of FIG. 1, according to an embodiment of the present disclosure.
Figure 5B:
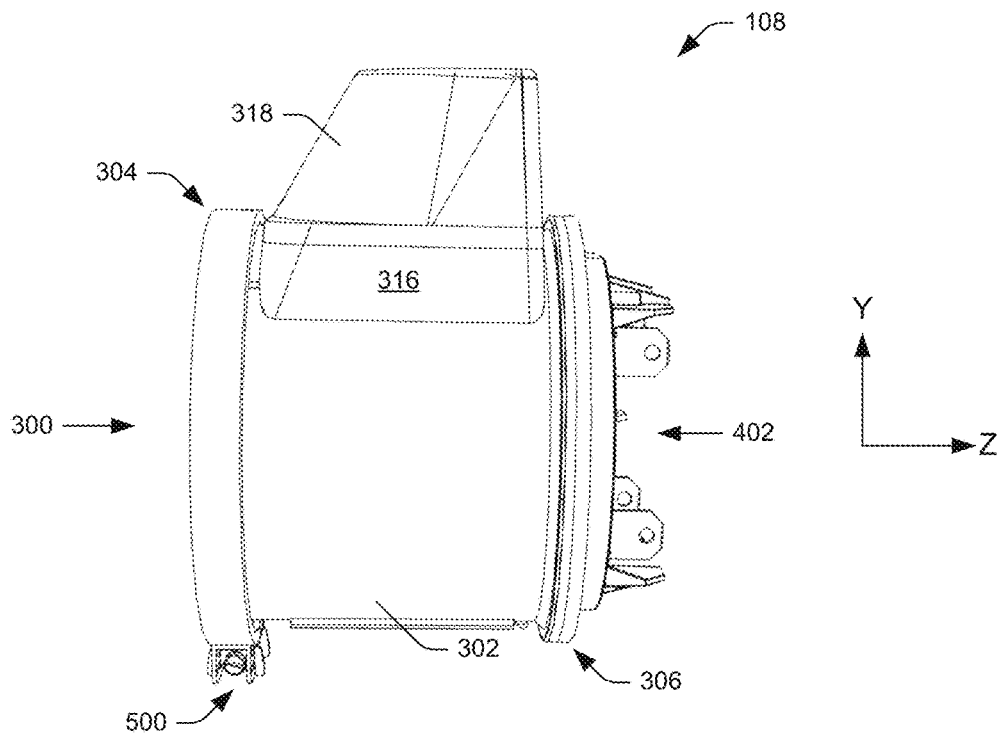
FIG. 5B illustrates a second side view of the CPE of FIG. 1, according to an embodiment of the present disclosure.

FIGS. 5A and 5B illustrate side views of the CPE 108. FIG. 5A illustrates a first side of the CPE 108 and FIG. 5B illustrates a second side of the CPE 108. Discussed above, the first end 304 (and the annulus 308) may be sized and configured (e.g., shaped) for receiving the electric meter. Disposed around the annulus 308, or at the first end 304, may be a coupler 500 (e.g., worm-gear clamp, crimping socket, hose clamp, etc.) for securing the electric meter to and/or within the collar 300. The coupler 500 may prevent the electric meter falling out of the collar 300 or otherwise disengaging from the body 302 of the collar 300. The second end 306 may be sized and configured (e.g., shaped) for being disposed within an opening or receptacle of the electric meter panel. In doing so, the prongs 402 may couple, engage, or otherwise attach to slots of the electric meter panel for receiving power.

The cover 318 is shown extending from a top of the base 316 by a distance 502. The distance 502 may be such that, when electric meter panels are stacked, the CPEs 108 are of a form factor to reside between adjacent electric meters. For example, in apartment complexes, business complexes, condominium complexes, or other multi-family units, electric meters (and electric meter panels) are often placed in stacked relationships, disposed side by side, etc. For example, in an apartment building that includes twenty units, there may be twenty power meters arranged in a four by five grid. As the electric meters are in close proximity (e.g., stacked relationship, disposed side-by-side), the CPE 108 may include a form factor that is small enough to fit within a gap disposed between adjacent vertical meters. As part of this, and as shown, the cover 318 may extend the distance 502 from the base 316. The distance 502 may be less than the distance (or gap) interposed between adjacent electric meters. As such, the CPEs 108s (or the collar 300) may be installed on such premises.

In some instances, a portion of the cover 318 may slant rearwards from a first end, located proximate to the first end 304 of the body 302 to a second end, located proximate to the second end 306 of the body 302. This slant extends backwards (Y-plane) towards the second end 306 of the body 302 to reduce a form factor of the CPE 108. In some instances, this backwards slant may also correspond to an orientation of the antenna(s) 120 within the CPE 108 (or behind the cover 318). For example, discussed herein, the antenna(s) 120 may be disposed at an angle or orientation to increase a field of view to the base station radio device 106. Slanting the antenna(s) 120 in this manner directs the antenna(s) upwards towards the base station radio devices 106. The slant may also reduce interference with incoming and outgoing signals. As such, the cover 318 may include a corresponding feature (e.g., slant) for the antenna(s) 120.

Figure 6A:
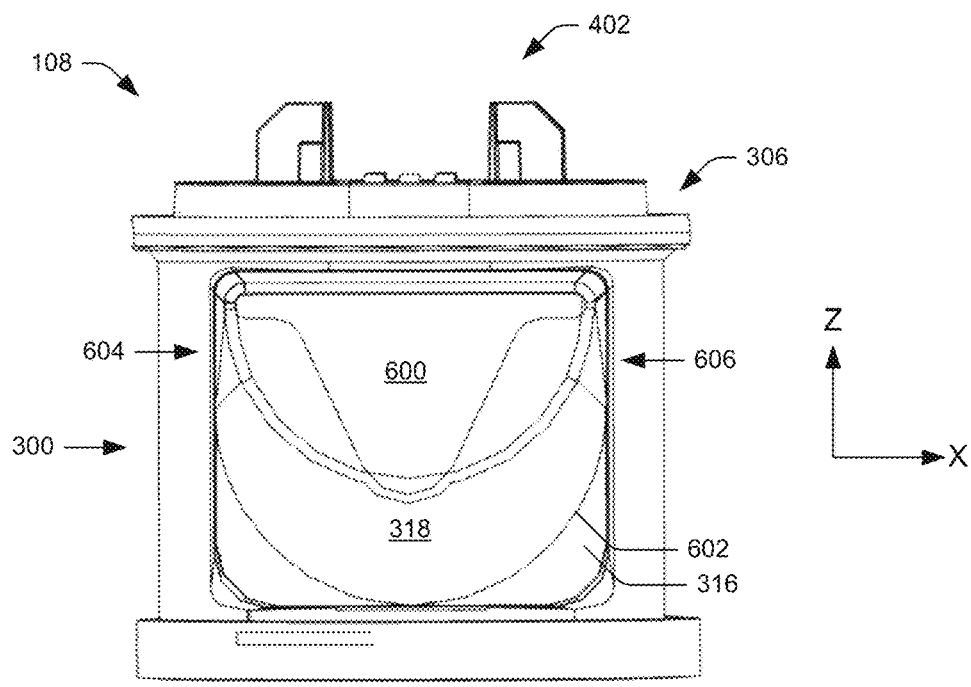
FIG. 6A illustrates a top view of the CPE of FIG. 1, according to an embodiment of the present disclosure.
Figure 6B:
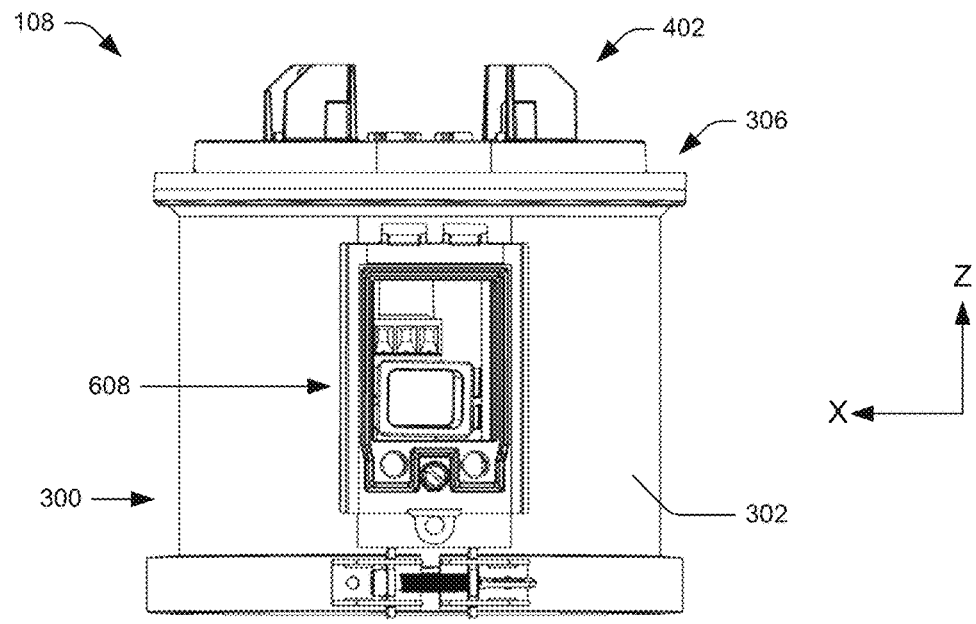
FIG. 6B illustrates a bottom view of the CPE of FIG. 1, according to an embodiment of the present disclosure.

FIGS. 6A and 6B illustrate additional side views of the CPE 108 and the collar 300. FIG. 6A illustrates a top of the collar 300 and FIG. 6B illustrates a bottom of the collar 300. The cover 318 may include a top 600 that is spaced apart from a bottom 602. The bottom 602 may be coupled to the base 316, and the top 600 may be disposed above the bottom 602 (Y-direction). As shown, in addition to the backwards slant of the cover 318 from the first end 304 to the second end 306 of the body 302, as discussed above with regard to FIGS. 5A and 5B, the cover 318 may curve along the X-direction. For example, the cover 318 may include a first side 604 and a second side 606 that is spaced apart in the X-direction from the first side 604. Between the first side 604 and the second side 606, the cover 318 may curve, arc, or bend. In some instances, the cover 318 may provide a wider beamwidth on both azimuth and elevation pattern, by 3-5 degrees and/or the cover 318 may provide a slightly lower gain (−0.3 dB), which is related to wider pattern.

In FIG. 6B, the body 302 is shown including an opening 608 for providing access to the interior 310. In some instances, the collar 300 may include a hatch for covering up or being disposed over the opening 608. In some instances, the opening 608 may be used to service components of the collar 300, access fittings for coupling the collar 300 to the electric meter panel and/or the electric meter, and/or inspecting the CPE 108.

Figure 7:
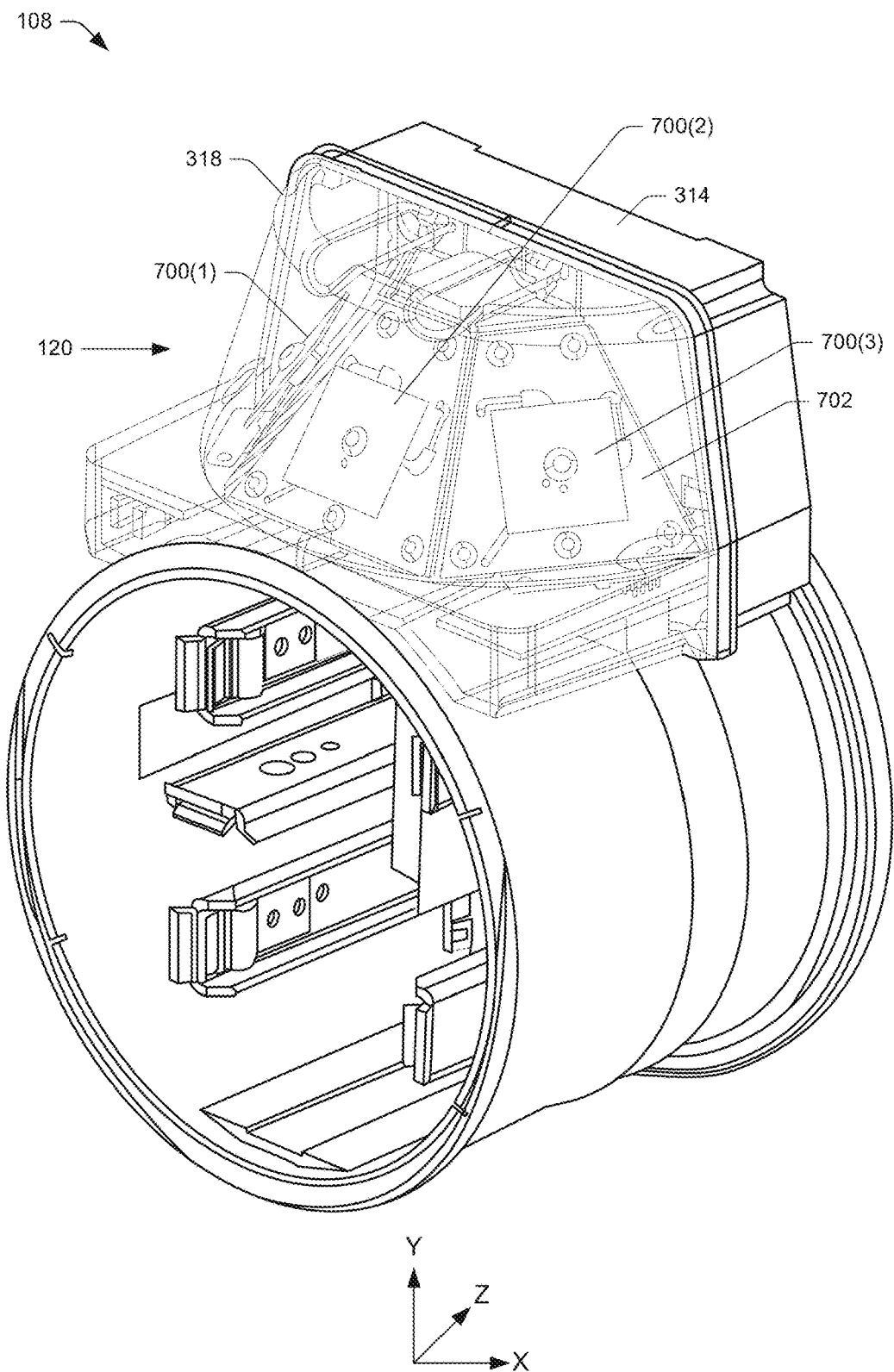
FIG. 7 illustrates a perspective view of the CPE of FIG. 1, showing an example transceiver system of the CPE, according to an embodiment of the present disclosure.

FIG. 7 illustrates the CPE 108, showing the top portion 314 as transparent or in faint lines to illustrate the antenna(s) 120 residing there beneath. As introduced above, the antenna(s) 120 may represent a multi-antenna array for wirelessly communicating with the one or more devices (e.g., the base station radio device 106) over one or more communication channels (e.g., radio frequency (RF) spectrum in the microwave to mmWave range of spectrums).

In some instances, the antenna(s) 120 may include an array of sub-arrays, such as a first sub-array 700(1), a second sub-array 700(2), and/or a third sub-array 700(3). In some instances, each of the first sub-array 700(1), the second sub-array 700(2), and/or the third sub-array 700(3) may include two elements, such as a left element and a right element. In such instances, the antenna(s) 120 may include six antennas. However, the antenna(s) 120 may include more than or less than six antenna(s) and/or the sub-arrays may include more than two elements.

In some instances, the first sub-array 700(1), the second sub-array 700(2), and/or the third sub-array 700(3) may represent two port patch antennas having a low profile and which can be mounted on a flat surface. The first sub-array 700(1), the second sub-array 700(2), and/or the third sub-array 700(3) may include two orthogonal elements, such as a slant left element and a slant right element by feed points on the patch antenna. The slant left element and the slant right element of the first sub-array 700(1), the second sub-array 700(2), and/or the third sub-array 700(3), respectively, may be independently driven (e.g., phase and amplitude). Additionally, the first sub-array 700(1), the second sub-array 700(2), and/or the third sub-array 700(3) may include different orthogonally polarized elements. For example, the first sub-array 700(1) may include a vertical polarization element and a horizontal polarization element. Additionally, in some instances, the first sub-array 700(1) may include a right hand circular polarization element and a left hand circular polarization element. By extension, the first sub-array 700(1) may be implemented with any orthogonal pair of elements, and each element may include a dedicated feed port. The second sub-array 700(2) and the third sub-array 700(3) may include differently polarized elements as well.

In some instances, the diversity of polarizations across the first sub-array 700(1), the second sub-array 700(2), and the third sub-array 700(3) may increase communications with the one or more devices when transmitting and receiving data. That is, polarization diversity may allow properly equipped transceivers to implement polarization dependent loss (PDL) mitigation and adaptive interference mitigation based on polarization mode dispersion (PMD) processing. Additionally, the direction of transmission and/or the direction of arrival of signals (e.g., to and from the base station radio devices 106) may be modified through adjusting the phase and/or amplitude of the dedicated feeds for the elements of the sub-arrays. In such instances, the radiation pattern of the antenna(s) 120 may be adjusted and configured according to predetermined variable polarizations. In some instances, the variable polarization may be determined as a function of the direction of departure/arrival in the array pattern of the first sub-array 700(1), the second sub-array 700(2), and the third sub-array 700(3).

The antenna(s) 120 are shown being coupled to or mounted on a structure 702. The structure 702 may follow a curvature of at least a portion of the cover 318. Additionally, as discussed herein, the structure 702 may orient the antenna(s) 120 upwards for increasing a line of sight with the base station radio devices 106. Additional details of the structure 702 are discussed herein.

Figure 8:
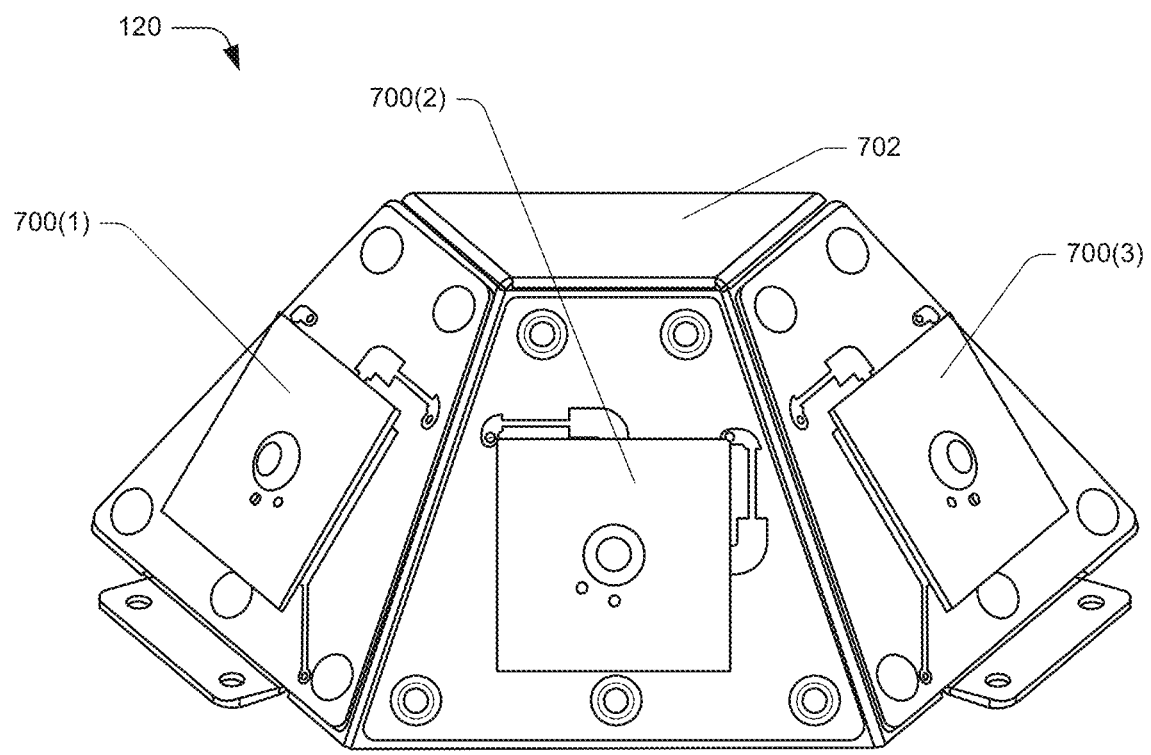
FIG. 8 illustrates the example components of the transceiver system of FIG. 7, according to an embodiment of the present disclosure.

FIG. 8 illustrates details of the antenna(s) 120 of the CPE 108. As discussed above, the antenna(s) 120 may include the first sub-array 700(1), the second sub-array 700(2), and the third sub-array 700(3). In some instances, the first sub-array 700(1) may be mounted to the structure 702 and oriented in a first direction (e.g., leftward facing from center), the second sub-array 700(2) may be mounted to the structure 702 and oriented in a second direction (e.g., forward facing from center), and the third sub-array 700(3) may be mounted to the structure 702 and oriented in a third direction (e.g., rightward facing from center). Additionally, as shown, the first sub-array 700(1), the second sub-array 700(2), and the third sub-array 700(3) may be tilted upwards. In some instances, the structure 702 may orient the first sub-array 700(1), the second sub-array 700(2), and/or the third sub-array 700(3) between 60 and 70 degrees upward, or relative to a horizontal plane. In some instances, the first sub-array 700(1), the second sub-array 700(2), and/or the third sub-array 700(3) may be offset from surfaces of the structure 702 to reduce interferences caused by materials of the structure 702.

The mounting, angles, and orientation of the first sub-array 700(1), the second sub-array 700(2), and/or the third sub-array 700(3) may increase a line of sight and/or radiation pattern of the CPE 108 (or of the antenna(s) 120). For example, when the CPE 108 communicates with other devices (e.g., the base station radio devices 106), the upward tilt and horizontal field of view may increase the signal strength. Moreover, the first sub-array 700(1), the second sub-array 700(2), and/or the third sub-array 700(3) may include different polarizations. In such instances, the receivers of the communicating devices, such as the antenna(s) 206 of the base station radio devices 106) may receive stronger signal strengths from the CPE 108 and be capable of receiving signals with varying polarizations.

The antenna(s) 120 may be arranged to maximize the polarization diversity across the radiation pattern of the CPE 108. For example, by selecting specific polarization feeds on the first sub-array 700(1), the second sub-array 700(2), and/or the third sub-array 700(3), and precoding (predetermining) the phase and or amplitude of those feeds, a radiation pattern may be implemented with a predetermined variable polarization. In some instances, the predetermined variable polarization may be a function of the direction of departure and arrival in the CPE 108. That is, the antenna(s) 120 may include a predetermined polarization and/or azimuth direction using elements of the first sub-array 700(1), the second sub-array 700(2), and/or the third sub-array 700(3) with different polarizations, along with differential composite phase and amplitude in the feed network.

Additionally, or alternatively, by selection of specific polarizations and precoding the phase and amplitude of those feeds, a flat total power beamwidth with a gain variation of less than 3 dB may be implemented. In some instances, the antenna(s) 120 may have dual orthogonal polarization, port to port isolation greater than 18 db, and gain over a 3 dB pattern targeted at 4 dBi (Vertical: +70°-0°; Horizontal: ±90°).

Although the antenna(s) 120 are shown being substantially square in shape and/or of a certain size, other shapes and/or sizes are envisioned. By way of example, the antenna(s) 120 may be circular, rectangular, and/or hexagonal.

Figure 9:
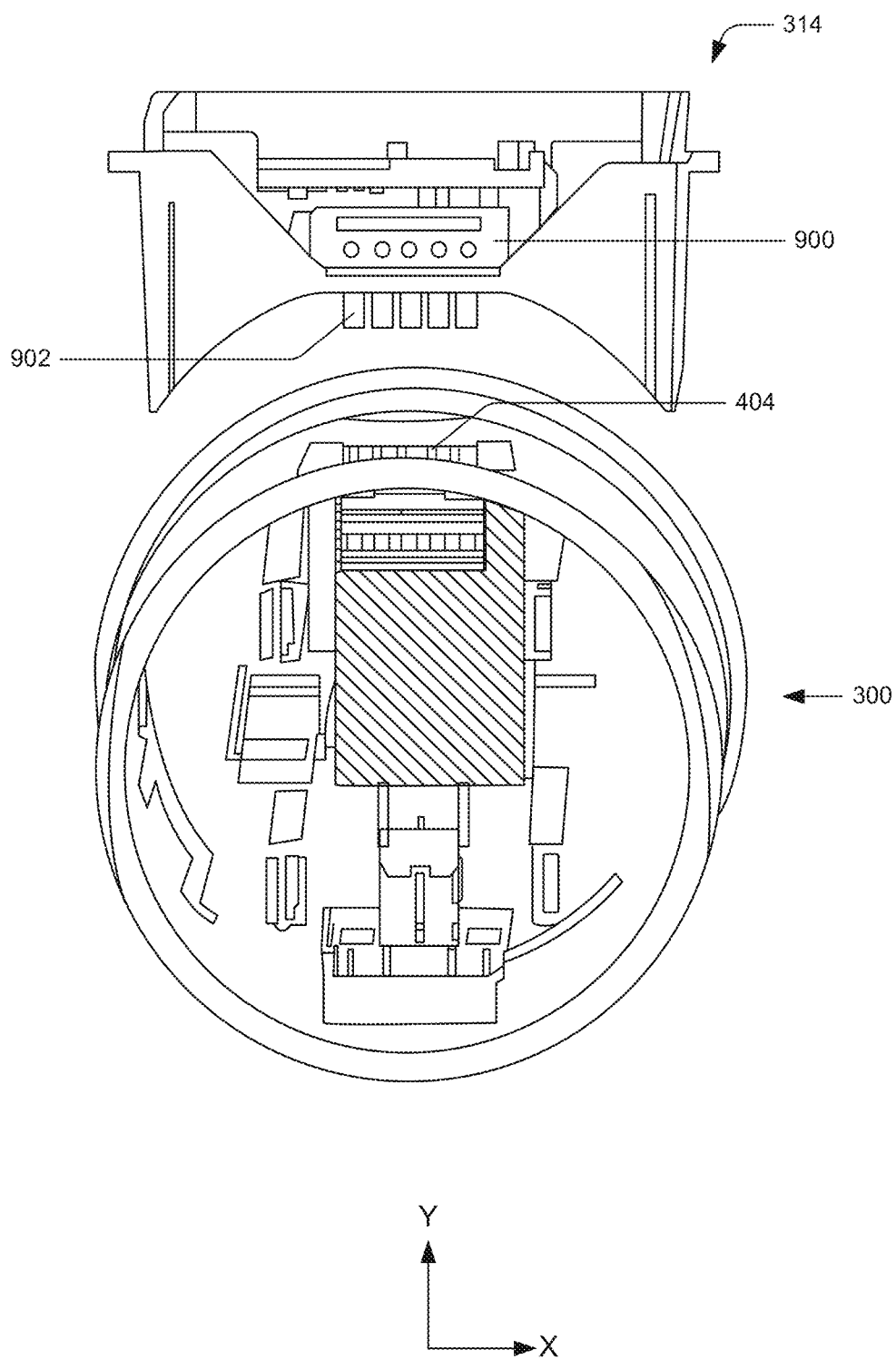
FIG. 9 illustrates the CPE of FIG. 1, showing example components for removably coupling portions of the CPE from a body of the CPE, according to an embodiment of the present disclosure.

FIG. 9 illustrates a transparent view of the CPE 108, showing the top portion 314 disposed above the collar 300 and the first connector within the collar 300.

The top portion is shown including a second connector 900 that engages with the first connector 404. For example, prongs 902 of the second connector 900 may engage within receptacles or slots of the first connector 404. This may allow the top portion 314 to be interchangeable for different communication technologies, for repair, and so forth. In some instances, the first connector 404 and the second connector 900 may resemble a quick disconnect feature between the top portion 314 and the collar 300, or components thereof. The coupling between the first connector 404 and the second connector 900 may be snap-fit or pressure fit and may couple computing components within the top portion 314 and computing components within the collar 300. The connection between the first connector 404 and the second connector 900 may supply power to the top portion 314, transfer data (e.g., broadband internet) between the top portion and the collar 300 (and ultimately into the premises 102), and so forth.

Figure 10:
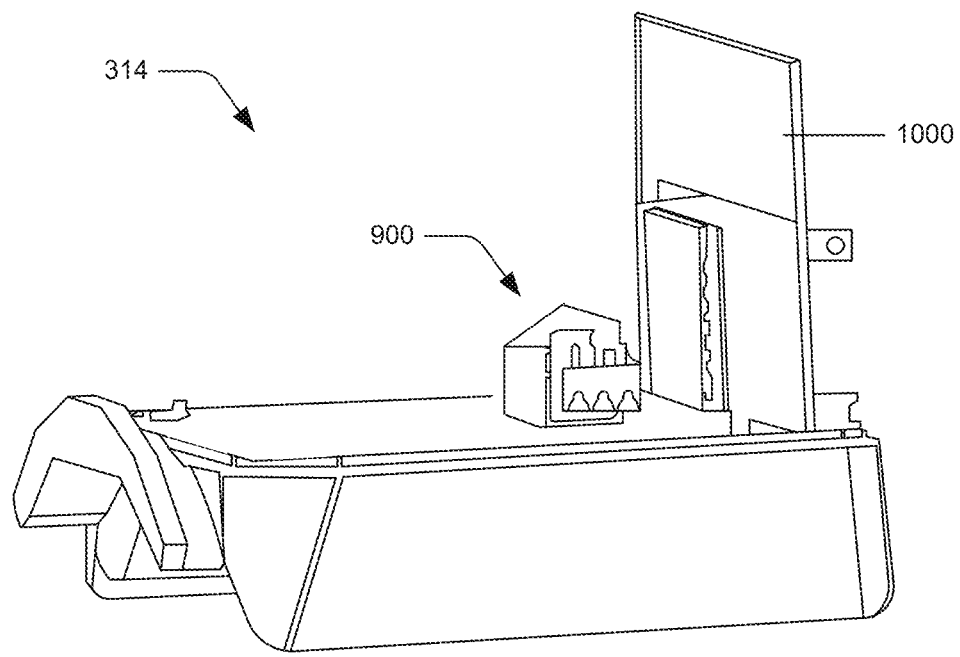
FIG. 10 illustrates the CPE of FIG. 1, showing the example transceiver system of FIG. 7 removed to illustrate the example components of FIG. 9, according to an embodiment of the present disclosure.
Figure 10:
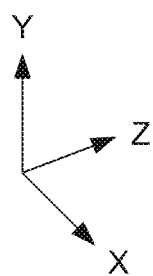

FIG. 10 illustrates the top portion 314 of the CPE 108, showing the cover 318 removed to illustrate components of the CPE 108 disposed beneath the cover 318. In FIG. 10, the antenna(s) 120 and the collar 300 are also shown being removed.

The CPE 108 is further shown including a printed circuit board (PCB) 1000 (or integrated circuit board) to which components of the CPE 108 couple or communicatively couple. For example, the PCB 1000 may house the first BPL interface 122, the first modem module 126, and so forth. The PCB 1000, in some instances, may additionally include processor(s), memory, and so forth. In some instances, the top portion 314 may include batteries for supplying power to components disposed in the top portion 314.

In some instances, the CPE 108 may include a first PCB including the first BPL interface 122 disposed within the collar 300, and a second PCB including the first modem module 126 disposed within the top portion 314. This may allow the top portion 314 to be displaced from the collar 300. Additionally, locating the antenna(s) 120 and the first modem module 126 external to the collar 300, or within the top portion 314, allows the top portion 314 to be quickly replaced and/or upgraded. For example, as new technologies are introduced and new antenna(s) 120 become available, the top portion 314 may be replaced without removing the collar 300 from the meter collar. Additionally, if components of the top portion 314 fail or break, the top portion 314 may be repaired without removing the collar 300 from the meter collar.

The modularity of the CPE 108 may be provided, in part, by the first connector 404 (not shown in FIG. 10) and the second connector 900. For example, the first connector 404 and the second connector 900 may resemble a quick disconnect feature that allows the top portion 314 to be separated from the collar 300. The first connector 404 and the second connector 900 may include corresponding male and female slots, prongs, etc. for communicatively coupling computing components within the top portion 314 with those within the collar 300. For example, an engagement between the first connector 404 and the second connector 1100 may provide power to the top portion 314, communicatively couple the top portion 314 with the electrical wiring of the premises 102, and so forth.

Figure 11:
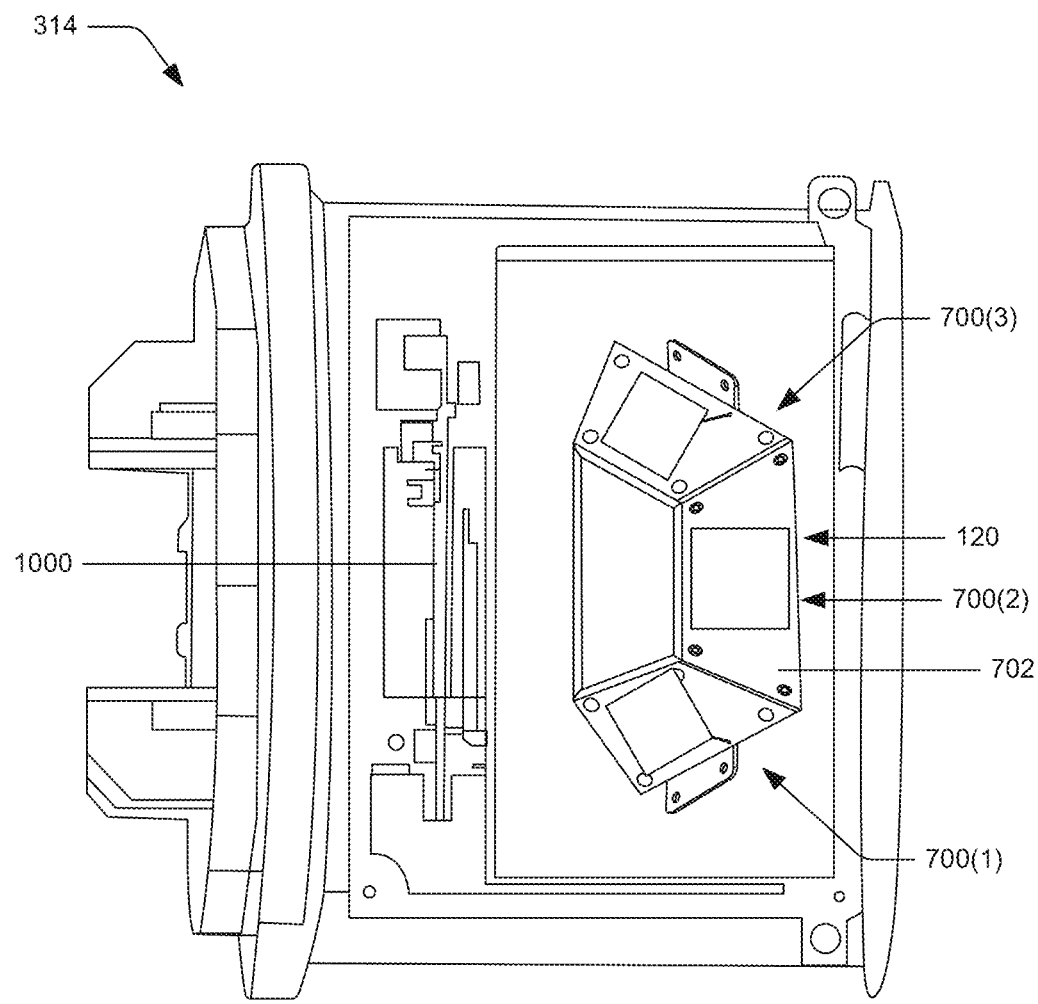
FIG. 11, illustrates a top view of the example transceiver system of FIG. 7, according to an embodiment of the present disclosure.

FIG. 11 illustrates a top view of the top portion 314, showing the cover 318 removed to illustrate the antenna(s) 120 and the PCB 1000. In some instances, and as shown, the PCB 1000 may mount behind (Z-direction) the structure 702 (and the antenna(s) 120) and extend in a vertical direction Y-direction.

The structure 702 is shown including a curved trajectory, between the first side 604 and the second side 606. The first sub-array 700(1), the second sub-array 700(2), and/or the third sub-array 700(3) couple to the structure 702 for disposing the first sub-array 700(1), the second sub-array 700(2), and/or the third sub-array 700(3) across a surface of the structure 702.

Figure 12:
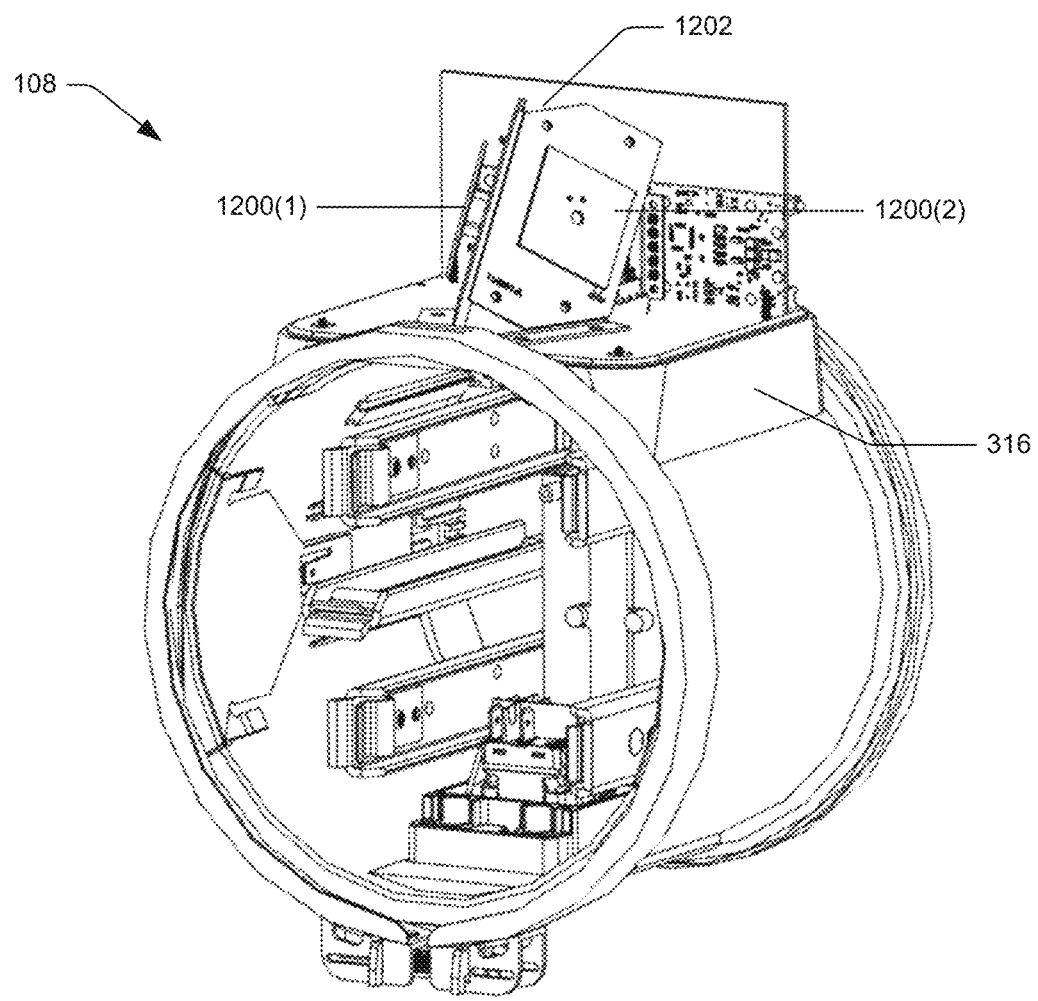
FIG. 12 illustrates a perspective view of the CPE of FIG. 1, showing an example transceiver system, according to an embodiment of the present disclosure.
Figure 12:
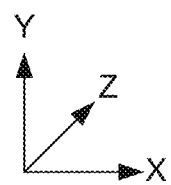

FIG. 12 illustrates a different embodiment of antenna(s) 120 of the CPE 108. In some instances, rather than the CPE 108 including the first sub-array 1200(1), the second sub-array 1200(2), and the third sub-array 1200(3), the antenna(s) 120 may include two sub-arrays, as illustrated in FIG. 12. For example, the CPE 108 may include a first sub-array 1200(1) and a second sub-array 1200(2).

The first sub-array 1200(1) and the second sub-array 1200(2) are shown being coupled to or mounted on a frame 1202. In some instances, the frame 1202 couples to the base 316. The frame 1202 may include a first mounting surface and a second mounting surface for receiving the first sub-array 1200(1) the second sub-array 1200(2), respectively. In some instances, the first mounting surface and the second mounting surface may be angled apart from one another to increase a field of view of the first sub-array 1200(1) and the second sub-array 1200(2). For example, the frame 1202 may include a V-shape.

In some instances, the first mounting surface may be angled relative to the Z-plane, or relative to the second mounting surface. In some instances, the first mounting surface may be angled by 45 degrees. Similarly, the second mounting surface may be angled relative to the Z-plane, which may be equal to or substantially equal to 45 degrees. As such, in some instances, the first mounting surface and the second mounting surface may be angled apart from one another by substantially 90 degrees. The angling or orientation of the first sub-array 1200(1) and the second sub-array 1200(2) with respect to the Z-plane may provide a collective horizontal field of view of approximately between 160 degrees and 180 degrees.

Furthermore, the frame 1202 may be angled backwards. In some instances, the frame 1202 may be angled backwards by substantially 30 degrees. The first sub-array 1200(1) and the second sub-array 1200(2) may therefore be angled between 60 degrees and 70 degrees upward, or relative to a horizontal plane. Angling the first sub-array 1200(1) and the second sub-array 1200(2) in this manner may increase a line of sight between the CPE 108 and base station radio device 106. Moreover, the radiation pattern of the antenna(s) 120 may be adjusted and configured according to predetermined variable polarizations. In some instances, the variable polarization may be determined as a function of the direction of departure/arrival in the array pattern of the first sub-array 1200(1) and the second sub-array 700(2).

Figure 13:
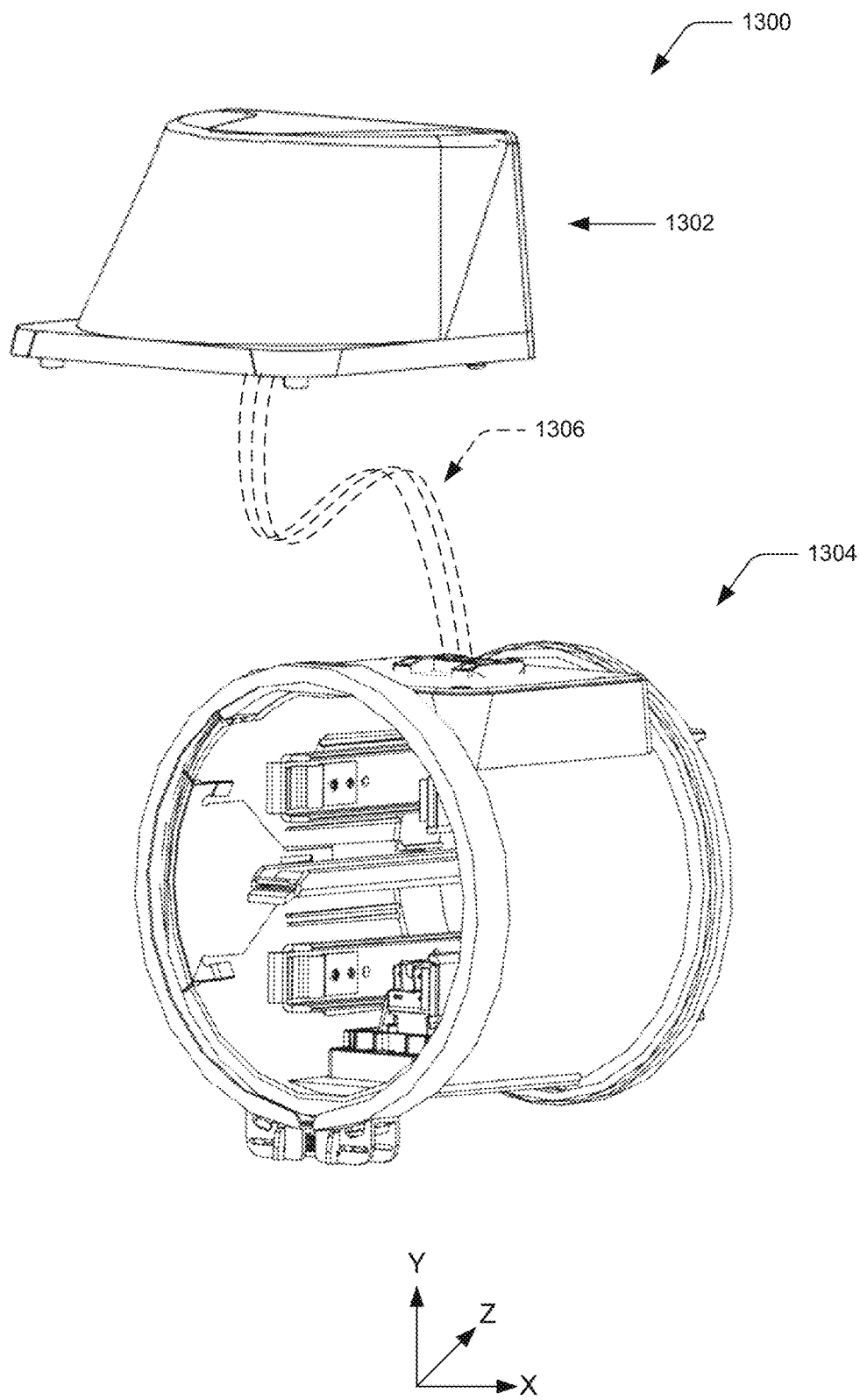
FIG. 13 illustrates an alternate embodiment of a customer premises equipment (CPE), including a top that may be disposed from a body of the CPE for placing the top at various locations relative to the body, according to an embodiment of the present disclosure.

FIG. 13 illustrates an alternate customer premises device (CPE) 1300 that includes a top portion 1302 positionable relative to a collar 1304. In some instances, the CPE 1300 may be similar to and include similar components as the CPE 108, and/or the collar 1304 may include similar components as the collar 300. However, as shown in FIG. 13, the top portion 1302 may be designed and configured to extend from the collar 1304 (or a body thereof).

For example, depending on the location of the electric meter (or the electric meter panel) of the premises 102, the wireless communication between the CPE 1300 and the base station radio device 106 may not be ideal. By way of example, the premises 102 may be located behind a taller building relative to the location of base station radio device 106, or the electric meter may be located at the back of the premises 102 relative to the location of the base station radio device 106. Additionally, in some instances, not all powerline structures may include a base station radio device 106. Under such situations, the communication path may be obstructed (e.g., taller building). These factors may cause additional path loss between the base station radio device 106 and the CPE 1300. Consequently, the CPE 1300 may have a reduced signal strength with the base station radio device 106.

To address these situations, the CPE 1300 or the collar 1304 may include components for extending the top portion 1302 at various positions from the collar 1304. For example, the top portion 1302 (which includes antenna(s) for communicating with the base station radio device 106) may be disposed from the collar 1304 and placed at various locations around, on, or about the exterior of the premises 102. In such instances, the CPE 1300 may be located at more desirable places on the premises 102 (e.g., rooftop) to achieve a closer line-of-sight communication path with the base station radio device 106.

In some instances, the optimum placement for the top portion 1302 may be determined based on expected ranges of maximum achievable throughput calculated sides of the premises 102. For example, instruments may calculate or determine the relative signal strength around the premises 102. Based on the highest signal strength, the top portion 1302 may be installed at a corresponding location. In some instances, an installer of the CPE 1300 (or the top portion 1302) may utilize these instruments during an installation process, and once finding the optimal location, may use these parameters to install the CPE 1300 and/or the top portion 1302 (or the antenna(s)) at respective locations.

In some instances, the top portion 1302 may be tethered and/or wired to the collar 1304 for transmitting and receiving data (or signals). For example, in some instances, the top portion 1302 and/or the collar 1304 may include a recoil, or spool, for leashing the top portion 1302 to various lengths. As illustrated, the top portion 1302 and the collar 1304 may communicatively couple via one or more wires 1306 that are configured to extend at various lengths from the collar 1304. These wires 1306 may be spooled within the collar 1304 and/or the top portion 1302. The wires 1306 may also provide power to the top portion 1302, and components thereof, such as PCBs, lighting element(s), antenna(s), etc.

Although FIG. 13 illustrates certain components being disposed from the collar 1304, other embodiments are envisioned. For example, only the antenna(s) may be disposed from the collar 1304, and the PCBs and/or lighting element(s) may remain on the collar 1304 (e.g., not within the top portion 1302). In these instances, the components that are disposed from the collar 1304 may be varied. In some instances, the top portion 1302 may include a PCB including the first modem module 136, while the collar 1304 may include a PCB including the first BPL interface 122. This may allow the first modem module 136 (and the top portion 1302) to be disposed from the collar 1304. In such instances, the top portion 1302 and the collar 1304 may be coupled via an Ethernet cable (e.g., PoE).

In some instances, the top portion 1302 (or components thereof) may be powered via batteries and/or power transmitted through the wires 1306 (from the collar 1004). Additionally, or alternatively, the top portion 1302 maybe powered via power over ethernet (PoE). In such instances, the wires 1306 may correspond to and/or include ethernet cables for communicatively coupling the top portion 1302 and the collar 1304. Still, in some instances, components within the top portion 1302 may be powered via solar energy.

Figure 14A:
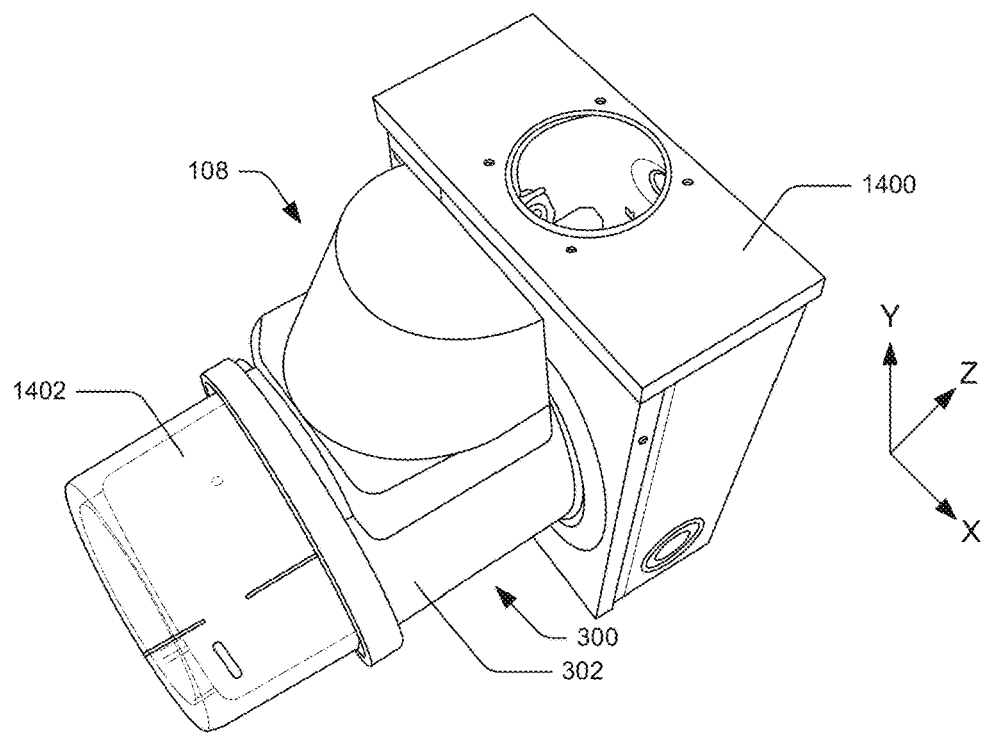
FIG. 14A illustrates a perspective view of the CPE of FIG. 1 installed within an example electric meter panel and coupled to an example electric meter, according to an embodiment of the present disclosure.
Figure 14B:
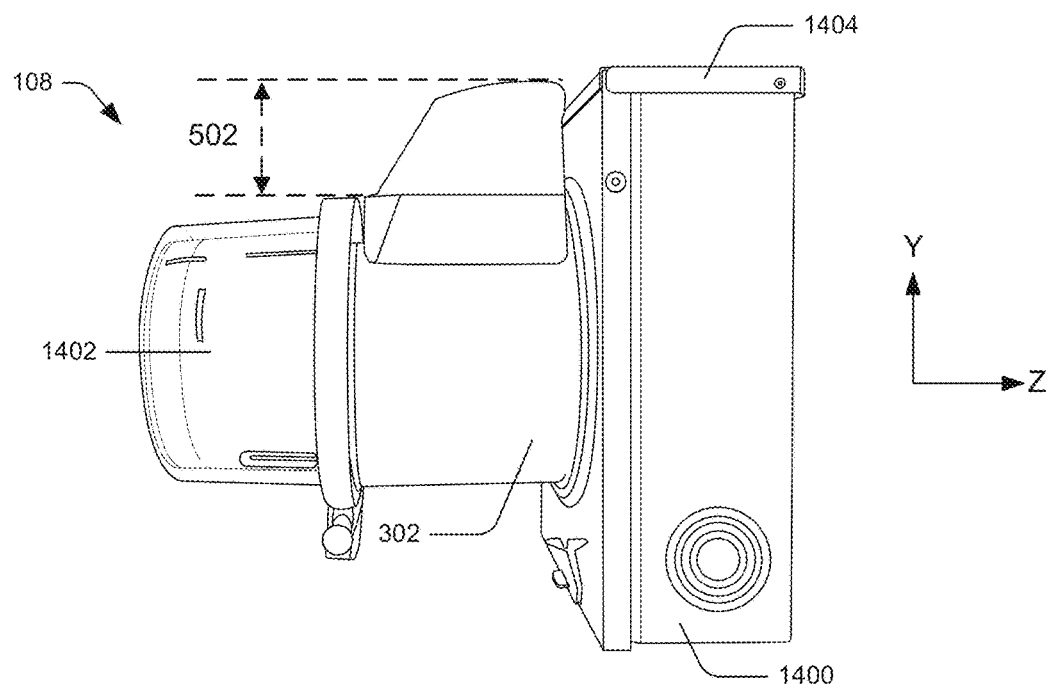
FIG. 14B illustrates a side view of the CPE of FIG. 1 installed within the electric meter panel and coupled to the electric meter of FIG. 14A, according to an embodiment of the present disclosure.

FIGS. 14A and 14B illustrate the CPE 108, including the collar 300, coupled to an electric meter panel 1400 and an electric meter 1402.

In some instances, the CPE 108 may be installed to the electric meter panel 1400 during an installation process. For example, after removing couplings (e.g., clamps, screws, sockets, etc.) from the electric meter 1402, the electric meter 1402 may be pulled in a slightly downward direction (Y-direction) to remove the electric meter 1402 from the electric meter panel 1400. Removing the electric meter 1402 exposes slots of the electric meter panel 1400 (e.g., the slots 312), that receive prongs of the electric meter 1402. Therein, the CPE 108 may be coupled to the electric meter panel 1400. For example, as discussed above, the CPE 108 may include prongs (e.g., the prongs 402) that are received within the slots of the electric meter panel 1400. Additionally, an end of collar 300 may fit within and/or reside within the electric meter panel 1400. Thereafter, the collar 300 may be secured to the electric meter panel 1400 to provide a water-tight seal.

The CPE 108 may couple to the wiring of the premises 102 via the collar 300 coupling to the electric meter panel 1400. Finally, the electric meter 1402 may be re-installed at the premises 102. For example, after the CPE 108 is coupled to the electric meter panel 1400, the electric meter 1402 may couple to the collar 300. The collar 300 may include slots (e.g., the slots 312) for receiving prongs of the electric meter 1402. This coupling may complete a circuit to supply power to the premises 102 (after power is restored). In this manner, the collar 300 may act as an extension, interposed between the electric meter panel 1400 and the electric meter 1402 to power the CPE 108, tap into the electrical wiring of the premises 102, and to enable coupling of the electric meter 1402 to the electric meter panel 1400.

In turn, after installation, the CPE 108 may perform the operations described hereinabove for communicating with the base station radio device 106 and the router 110 to provide broadband internet to the premises 102. For example, after the CPE 108 is installed, the consumer may plug in the router 110 to start receiving broadband internet. This process may involve a handshake or pairing operation. Additionally, in some instances, after the CPE 108 is installed, the CPE 108 may automatically connect to cloud software and/or services and provisioned with the appropriate broadband service selected by the consumer. Such coupling also allows the SPN 116 to communicate directly with CPE 108 to diagnose issues and/or monitor a status of the CPE 108.

Turning back to the illustrations shown in FIGS. 14A and 14B, the CPE 108 may be positioned or interposed between the electric meter panel 1400 and the electric meter 1402, with the collar 300 acting as an extension. In this sense, the collar 300 may dispose the electric meter 1402 at a farther distance away from the premises 102 (e.g., side of a house). With this design, the CPE 108 significantly reduces the installation cost and also solves the building penetration problem by tapping into the electrical wiring of the premises 102. This allows for the CPE 108 to seamlessly integrate with electric utilities that offer, or wish to offer, broadband internet to consumers. In some instances, the CPE 108 may be installed in minutes by simply plugging into the electric power service entrance to the building.

The CPE 108 is installed to provide a weathertight seal between the electric meter panel 1400 and the electric meter 1402. Installing the CPE 108 on an exterior side of the premises 102 reduces an installation time, as the SPN 116 may not have to access an interior of the premises 102. This may also make installation less burdensome for the SPN 116 and/or the premises owner.

As also discussed above, the distance 502 permits the top 600 of the cover 318 to be disposed beneath (Y-direction) a top 1404 of the electric meter panel 900. This permits the CPE 108 to be installed on electric meters that are in close proximity to one another, such as in apartment complexes or multi-family units.

FIGS. 15-20 illustrate various embodiments of antenna(s) that may be implemented within the CPE 108, or other customer premises devices. In some embodiments, the antenna(s) illustrated herein may represent transceiver systems that are capable of transmitting and receiving data. For example, the antenna(s) may transmit and receive data from the base station radio device 106. In such instances, the antenna(s) may include multiple sub-arrays, a feed network, and a radio modem. It is to be understood that the antenna(s) discussed herein may be implemented within the CPE 108 as the antenna(s) 120. Additionally, the modems discussed herein may be representative of the first modem module 126.

Figure 15:
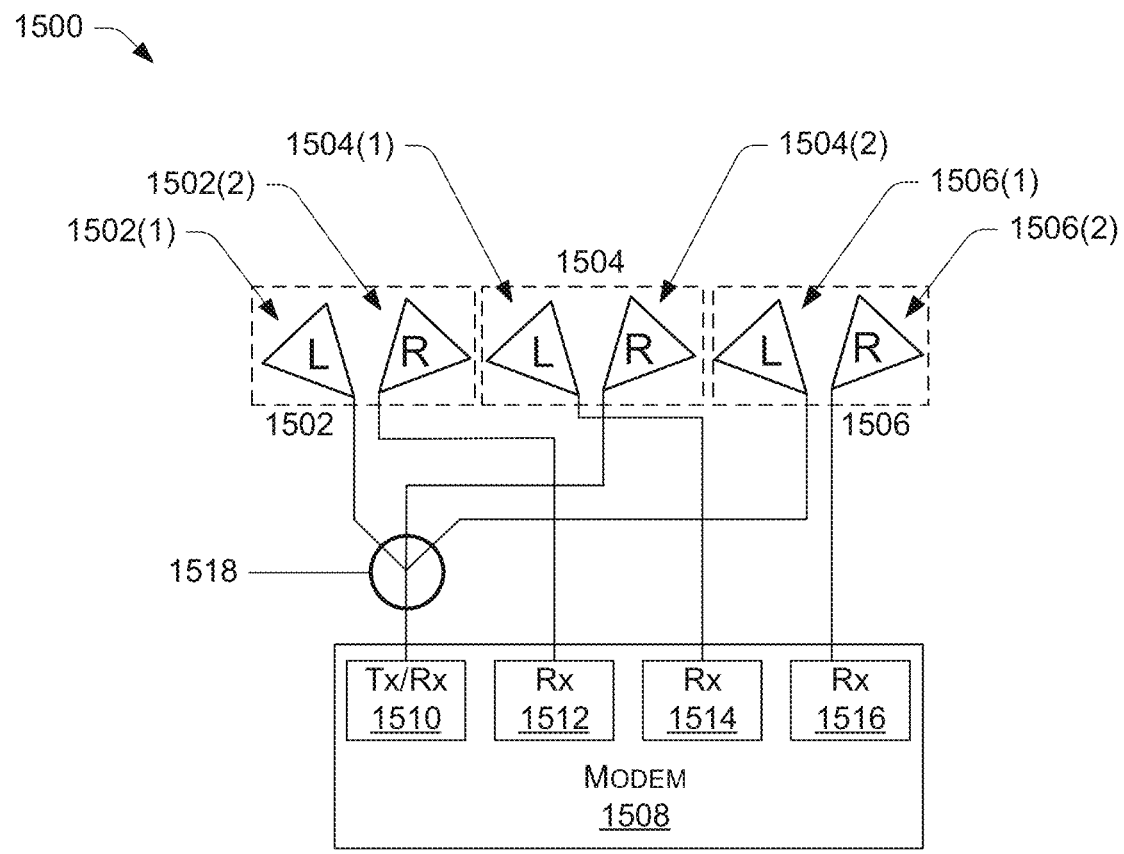
FIG. 15 illustrates an example antenna feed network of the example transceiver system of FIG. 7, according to an embodiment of the present disclosure.

FIG. 15 illustrates a transceiver system 1500 having multiple sub-arrays. For example, the transceiver system 1500 may include a first sub-array 1502, a second sub-array 1504, and a third sub-array 1506. In some instances, the first sub-array 1502, the second sub-array 1504, and/or the third sub-array 1506 may include multiple elements that are dual polarized. In some instances, the first sub-array 1502, the second sub-array 1504, and/or the third sub-array 1506 may be dual polarized patch antennas.

The first sub-array 1502 is shown including a first element 1502(1) and a second element 1502(2), the second sub-array 1504 is shown including a first element 1504(1) and a second element 1504(2), and the third sub-array 1506 is shown including a first element 1506(1) and a second element 1506(2). The first element 1502(1) of the first sub-array 1502 may represent a left antenna and the second element 1502(2) of the first sub-array 1502 may represent a right antenna. The first element 1502(1) and the second element 1502(2) may include different polarizations or may be polarized differently than one another. For example, in some instances, the first element 1502(1) and the second element 1502(2) may be orthogonally polarized.

The first element 1504(1) of the second sub-array 1504 may represent a left antenna and the second element 1504(2) of the second sub-array 1504 may represent a right antenna. The first element 1504(1) and the second element 1504(2) may include different polarizations and may be orthogonally polarized. The first element 1506(1) of the third sub-array 1506 may represent a left antenna and the second element 1506(2) of the third sub-array 1506 may represent a right antenna. The first element 1506(1) and the second element 1506(2) may include different polarizations and may be orthogonally polarized.

The transceiver system 1500 may have dedicated feed ports for transmitting and receiving via the first sub-array 1502, the second sub-array 1504, and the third sub-array 1506. For example, the transceiver system 1500 is shown including a modem 1508 having a first port 1510, a second port 1512, a third port 1514, and a fourth port 1516. In some instances, the first port 1510 may represent a transmission and receiving port, while the second port 1512, the third port 1514, and/or the fourth port 1516 may represent receiving ports.

Conventional antenna designs dictate an antenna feed design that feeds only a single co-polarized set of sub-array elements. That is, a co-polarized element is chosen from each sub-array to be driven by the distributed power of a transmission/receiver port. This co-polarization is suboptimal in modern MIMO wireless links given the frequency dependent fading and polarization mode dispersion introduced in NLOS communication. That is, co-polarization elements are the same (e.g., vertical to vertical, horizontal to horizontal, right hand circular to right hand circular, etc.). In such instances, given the scattering in NLOS communication, the signals may become cross-polarized, leading to PDL, insufficient signal levels at the base station radio device 106, and/or loss of communication. However, comparatively, the transceiver system 1500 may include a single transmission/receiving port, such as the first port 1510, but may split transmission signals amongst element(s) for generating variable polarized signals. This variation may improve signal levels and restore communications.

To elaborate, and as shown, the transceiver system 1500 may include a power splitter and combiner 1518 to drive the elements of the first sub-array 1502, the second sub-array 1504, and the third sub-array 1506. In some instances, the power splitter and combiner 1518 may unequally split and combine power to adjust the relative magnitude of each element in the transceiver system 1500. For example, the power splitter and combiner 1518 may split signals to the first element 1502(1) of the first sub-array 1502, the second element 1504(2) of the second sub-array 1504, and the first element 1506(1) of the third sub-array 1506. Additionally, signals received via the first element 1502(1) of the first sub-array 1502, the second element 1504(2) of the second sub-array 1504, and the first element 1506(1) of the third sub-array 1506 may be combined via the power splitter and combiner 1518.

During transmission, the splitting of the signals may drive the polarizations of each element of the sub-arrays. In some instances, the different polarizations of the first element 1502(1) of the first sub-array 1502, the second element 1504(2) of the second sub-array 1504, and the first element 1506(1) of the third sub-array 1506 may maximize the polarization diversity across the radiation pattern of the transceiver system 1500. Moreover, given the orientation of the first element 1502(1) of the first sub-array 1502, the second element 1504(2) of the second sub-array 1504, and the first element 1506(1) of the third sub-array 1506, transmitted signals may be sent in multiple directions.

The signals transmitted by the first element 1502(1) of the first sub-array 1502, the second element 1504(2) of the second sub-array 1504, and the first element 1506(1) of the third sub-array 1506 may have predetermined phases and/or amplitudes for steering transmitted beams. The predetermined phases and/or amplitudes may generate variable polarizations for receipt by the base station radio device 106. That is, the base station radio device 106 may be configured to receive vertical, horizontal, circular, and/or elliptical polarizations, for example. As such, the polarizations of first element 1502(1), the second element 1504(2), and the first element 1506(1) may generate various polarizations through constructive interference. The diversity of polarizations generated by the transceiver system 1500 may increase the signal strength of received signals. That is, by selecting specific polarization feeds on the first element 1502(1), the second element 1504(2), and the first element 1506(1), and precoding the phase and or amplitude of those feeds, a radiation pattern may be emitted with a predetermined variable polarization. This predetermined variable polarization may be determined as a function of the direction of transmission and arrival in the transceiver system 1500. The transceiver system 1500 may provide a continuous distribution of polarizations from linear to elliptical to circular, and then back to elliptical and linear.

The polarization diversity may increase transmission with computing devices. The destructive and/or constructive interference between the first element 1502(1) of the first sub-array 1502, the second element 1504(2) of the second sub-array 1504, and the first element 1506(1) of the third sub-array 1506 may generate linear, circular, and elliptical polarizations. This variance in polarizations permits receivers to receive the signals, across the array of polarizations. In such instances, and given NLOS communications, if one particular polarization lacks sufficient signal to noise ratio and/or insufficient signal above the receiver's sensitivity, the base station radio device 106 may receive signals having the different polarizations. Additionally, by splitting the transmitted signals, the energy of the transmitted signals may remain under a certain threshold governed by FCC regulations. For example, the polarizations of the elements, the phases of transmitted signals, and/or the amplitudes of the transmitted signals may be altered to obtain destructive interference.

With the sub-arrays of the transceiver system 1500, the phases and/or magnitudes of the elements may be adjusted to steer the beam pattern of the transceiver system 1500 and/or adjust the beamwidth. Such modulation and adjustment may allow the transceiver system 1500 to communicate with the base station radio device 106. For example, different phases and/or amplitudes may be imparted to the signals transmitted via the first element 1502(1) of the first sub-array 1502, the second element 1504(2) of the second sub-array 1504, and the first element 1506(1) of the third sub-array 1506 to steer beams in a particular direction (e.g., constructive interference).

The second element 1502(2) of the first sub-array 1502 is shown coupled to the second port 1512, the first element 1504(1) of the second sub-array 1504 is shown coupled to the third port 1514, and the second element 1506(2) of the third sub-array 1506 is shown coupled to the third port 1514.

Figure 16:
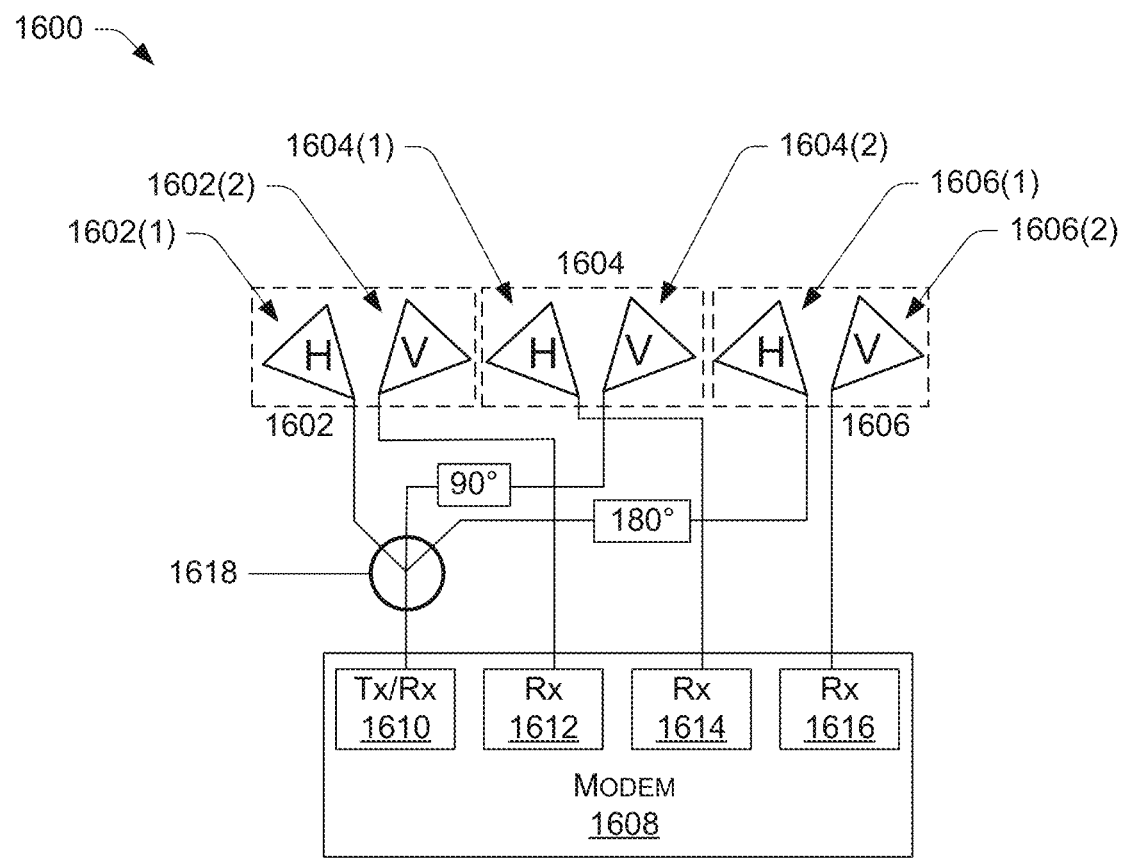
FIG. 16 illustrates an example antenna feed network of the example transceiver system of FIG. 7, according to an embodiment of the present disclosure.

In some instances, the transceiver system 1500 may include more than one receiving ports and/or more than three transmitting/receiving ports. The dedicated receiving ports of the modem are coupled to a diversity of receive polarizations and azimuthal gain patterns. This spatial and polarization diversity will enhance the performance of MIMO signal processing from the base station 106 and the CPE 108 improving spectral efficiency (e.g. higher throughput). In addition this antenna provides for polarimetric processing to eliminate PDL and exploit PMD processing for interference rejection FIG. 16 illustrates a transceiver system 1600. In some instances, the transceiver system 1600 may be similar to the transceiver system 1600. For example, the transceiver system 1600 may include a first sub-array 1602, a second sub-array 1604, and a third sub-array 1606. In some instances, the first sub-array 1602, the second sub-array 1604, and/or the third sub-array 1606 may include multiple elements that are dual polarized. In some instances, the first sub-array 1602, the second sub-array 1604, and/or the third sub-array 1606 may be dual polarized patch antennas. The first sub-array 1602 is includes a first element 1602(1) and a second element 1602(2), the second sub-array 1604 includes a first element 1604(1) and a second element 1604(2), and the third sub-array 1606 includes a first element 1606(1) and a second element 1606(2).

The transceiver system 1600 may have dedicated feed ports for transmitting and receiving via the first sub-array 1602, the second sub-array 1604, and the third sub-array 1606. For example, the transceiver system 1600 is shown including a modem 1608 having a first port 1610, a second port 1612, a third port 1614, and a fourth port 1616. In some instances, the first port 1610 may represent a transmission and receiving port, while the second port 1612, the third port 1614, and/or the fourth port 1616 may represent receiving ports. As shown, the transceiver system 1600 may include a power splitter and combiner 1618 to drive the elements of the first sub-array 1602, the second sub-array 1604, and the third sub-array 1606. In some instances, the power splitter and combiner 1618 may unequally split and combine power to adjust the relative magnitude of element(s) in the transceiver system 1600.

The first element 1602(1) and the second element 1602(2), the first element 1604(1) and the second element 1604(2), and the first element 1606(1) and the second element 1606(2) may be polarized differently than one another (e.g., orthogonally polarized). Compared to the transceiver system 1500, the transceiver system 1600 may have horizontal and vertical polarizations. For example, the first element 1602(1), the first element 1604(1), and the first element 1606(1) may have horizontal polarization. The second element 1602(2), the second element 1604(2), and the second element 1606(2) may have vertical polarizations. The diversity of polarizations generated by the transceiver system 1600 may increase the signal strength of received signals. This predetermined variable polarization may be determined as a function of the direction of transmission and arrival in the transceiver system 1600.

Additionally, some of the elements of the sub-arrays may have 90 degree and 180 degree phase offsets. For example, the second element 1604(2) may have a 90 degree phase offset and the first element 1606(1) may have a 180 degree phase offset. In some instances, the phase offsets may obtain destructive interference, may steer the beam pattern of the transceiver system 1600, and/or adjust the beamwidth. For example, the 90 degree phase offset and the 180 degree phase offset may steer beams in a particular direction (e.g., constructive interference). Moreover, phase shifting may create polarization diversity for receiving devices, such as the base station radio device 106. In some instances, the horizontal and vertical polarizations of the first sub-array 1602, the second sub-array 1604, and the third sub-array 1606, as well as the phase shifts of the second element 1604(2) and the first element 1606(1), may generate various polarizations through constructive interference. By precoding the phases of the second element 1604(2) and the first element 1606(1), a radiation pattern may be emitted with a predetermined variable polarization.

Figure 17:
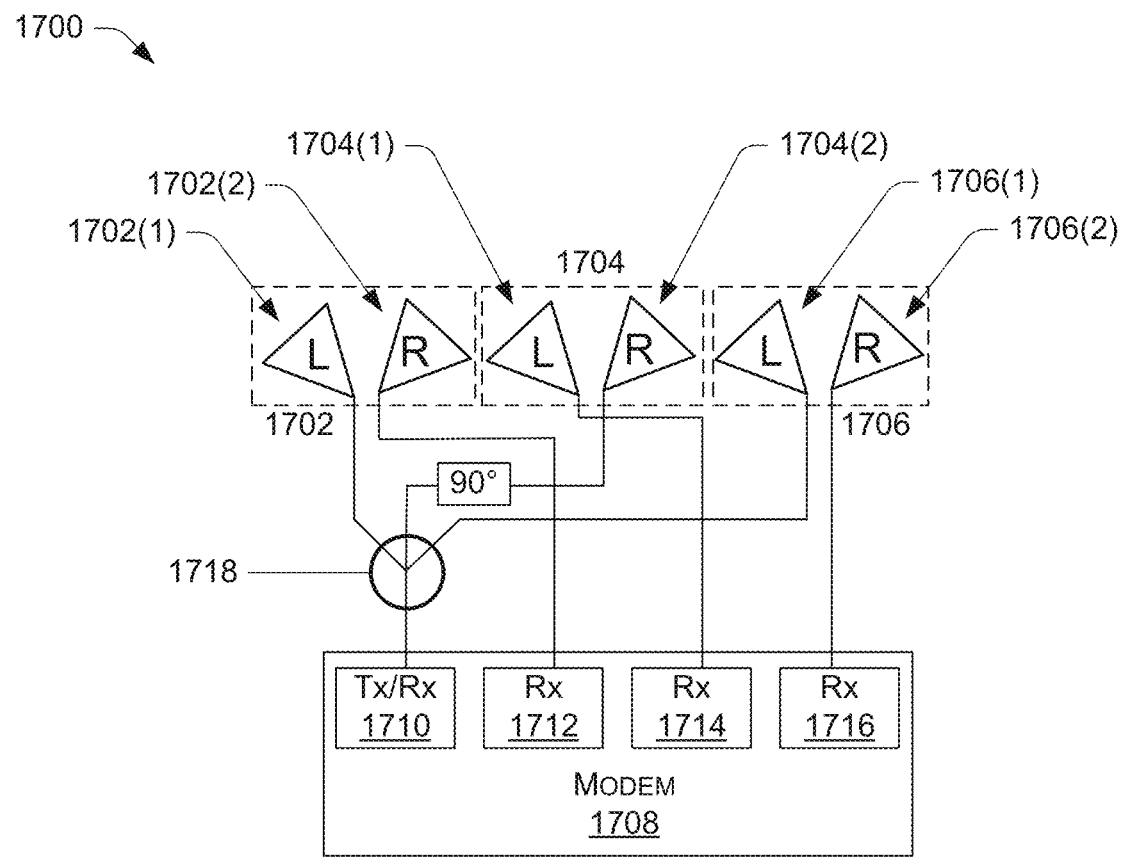
FIG. 17 illustrates an example antenna feed network of the example transceiver system of FIG. 7, according to an embodiment of the present disclosure.

FIG. 17 illustrates a transceiver system 1700. In some instances, the transceiver system 1700 may be similar to the transceiver system 1500 and/or the transceiver system 1600. For example, the transceiver system 1700 may include a first sub-array 1702, a second sub-array 1704, and a third sub-array 1706. The first sub-array 1702, the second sub-array 1704, and/or the third sub-array 1706 may include multiple elements that are dual polarized. The first sub-array 1702 includes a first element 1702(1) and a second element 1702(2), the second sub-array 1704 includes a first element 1704(1) and a second element 1704(2), and the third sub-array 1706 includes a first element 1706(1) and a second element 1706(2).

The transceiver system 1700 may have dedicated feed ports for transmitting and receiving via the first sub-array 1702, the second sub-array 1704, and the third sub-array 1706. For example, the transceiver system 1700 is shown including a modem 1708 having a first port 1710, a second port 1712, a third port 1714, and a fourth port 1716. The first port 1710 may represent a transmission and receiving port, while the second port 1712, the third port 1714, and/or the fourth port 1716 may represent receiving ports. The transceiver system 1700 may include a power splitter and combiner 1718 to drive the elements of the first sub-array 1702, the second sub-array 1704, and the third sub-array 1706. In some instances, the power splitter and combiner 1518 may unequally split and combine power to adjust the relative magnitude of each element in the transceiver system 1700.

Compared to the transceiver system 1600, the transceiver system 1700 may have different predetermined phase shifts. For example, the second element 1704(2) may have a 90 degree phase shift. This may result in the transmission of circularly polarized signals (via interaction amongst the elements within the sub-array) and permit the receivers (e.g., the port second 1712, the third port 1714, and the fourth port 1716) of the transceiver system 1600 to receive circularly polarized signals. In some instances, the overlapping regions between the elements may result in circular polarization (or near circular polarization). In some instances, the phase offsets may obtain destructive interference, may steer the beam pattern of the transceiver system 1700, and/or adjust the beamwidth. Moreover, phase shifting may create polarization diversity for receiving devices, such as the base station radio device 106.

In some instances, the first element 1702(1) and the first element 1706(1) may be driven with equal phase while the second element 1704(2) may be driven with a composite 90 degree phase shift. That is, the composite 90 degree phase shift may represent the sum of the phase realized in the transceiver system 1700 and the time of flight phase delay due to the separation of the sub-arrays. In this instance, measuring the polarization on the far left of the transceiver system 1600, a vertical polarization is realized (via the first element 1702(1) of the first sub-array 1702). As the measurement position moves from left to right, around the transceiver system 1500 (i.e., from the first sub-array 1704 to the third sub-array 1706), the polarization varies from the initial polarization through elliptical to a circular polarization. This changing in polarization is formed by selecting an orthogonal polarization for second element 1704(2) of the second sub-array 1704. Therein, the polarization returns to the elliptical polarization and then to orthogonal vertical polarization as a result of the first element 1706(1) of the third sub-array 1706. As such, the transceiver system 1700 may create a variable polarization over its beamwidth.

Figure 18:
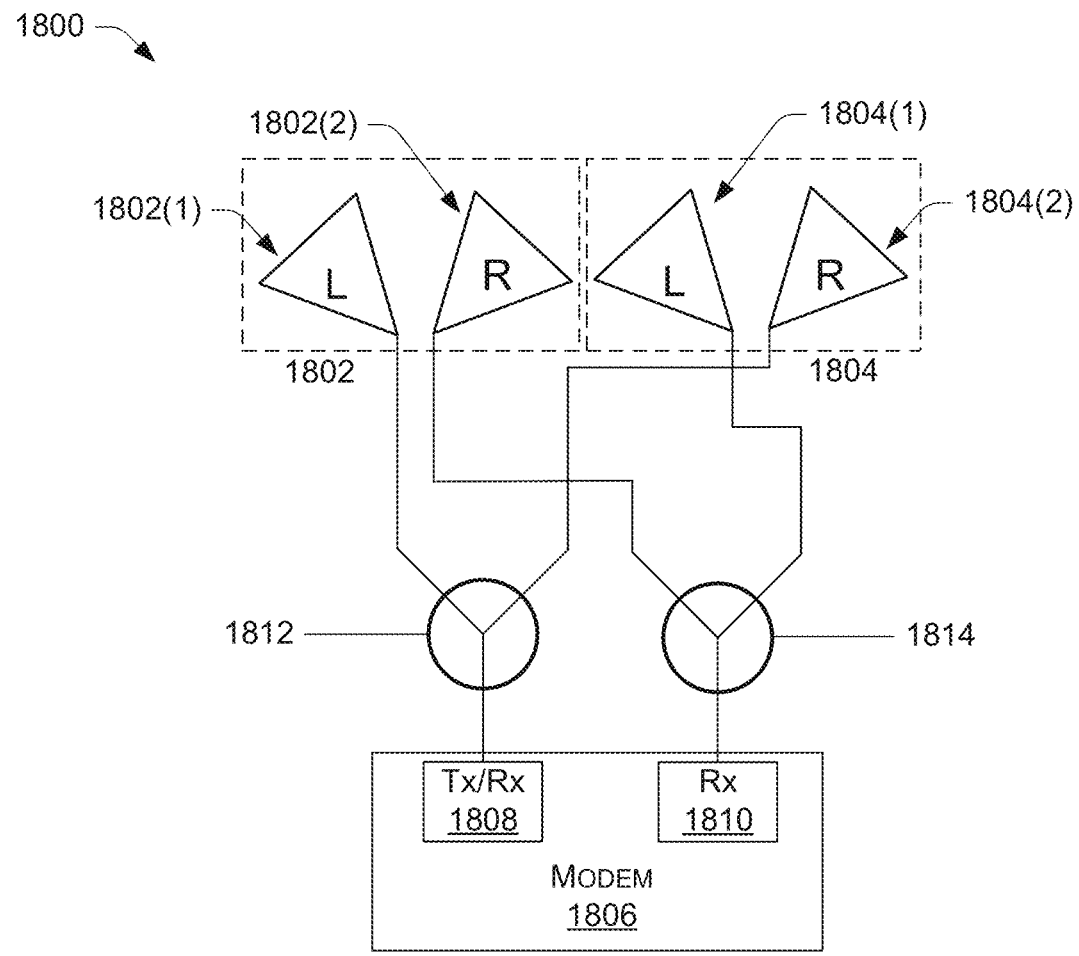
FIG. 18 illustrates an example antenna feed network of the example transceiver system of FIG. 12, according to an embodiment of the present disclosure.

FIG. 18 illustrates a transceiver system 1800 including a first sub-array 1802 and a second sub-array 1804. In some instances, the first sub-array 1802 and the second sub-array 1804 may include multiple elements that are dual polarized. For example, in some instances, the first sub-array 1802 and the second sub-array 1804 may be dual polarized patch antennas or cross polarized dipole antennas. Although the CPE 108 discussed above includes three antenna(s), or three sub-arrays, the transceiver system 1800 may be embodied within the CPE 108 (as discussed with regard to FIG. 12). In such instances, the structure may include different features and/or shapes for receiving the first sub-array 1802 and the second sub-array 1804 (e.g., a V-shaped structure). As such, the CPE 108 may be configurable to receive less than three antennas or sub-arrays.

The first sub-array 1802 is shown including a first element 1802(1) and a second element 1802(2), and the second sub-array 1804 is shown including a first element 1804(1) and a second element 1804(2). In some instances, the first element 1804(1) and the second element 1804(2) may be orthogonally polarized. Additionally, or alternatively, the first element 1804(1) and the second element 1804(2) may be orthogonally polarized.

The transceiver system 1800 may have dedicated feed ports for transmitting and receiving via the first sub-array 1802 and the second sub-array 1804. For example, the transceiver system 1800 is shown including a modem 1806 including a first port 1808 and a second port 1810. In some instances, the first port 1808 may represent a transmission and receiving port, while the second port 1810 may represent a receiving port. As shown, the transceiver system 1800 may include power splitter/combiners, such as a first power splitter and combiner 1812 and a second power splitter and combiner 1814. The first power splitter and combiner 1812 may drive the elements of the first sub-array 1802 and/or the second sub-array 1804. The second power splitter and combiner 1814 may drive the elements of the first sub-array 1802 and the second sub-array 1804. In some instances, the first power splitter and combiner 1812 and/or the second power splitter and combiner 1814 may unequally split and combine signals to adjust the relative magnitude of each element, or sub-array, in the transceiver system 1800. For example, the first port 1808 may split transmission signals via the first power splitter and combiner 1812 to the first element 1802(1) of the first sub-array 1802 and the second element 1804(2) of the second sub-array 1804. Signals received via the first element 1802(1) of the first sub-array 1802 and the second element 1804(2) of the second sub-array 1804 may be combined via the first power splitter and combiner 1812. Similarly, signals received via the second element 1802(2) of the first sub-array 1802 and the first element 1804(1) of the second sub-array 1804 may be combined via the second power splitter and combiner 1814.

During transmission, the splitting of the signals via the first power splitter and combiner 1812 may drive the polarizations of each element. In some instances, the different polarizations of the first element 1802(1) of the first sub-array 1802 and the second element 1804(2) of the second sub-array 1804 may maximize the polarization diversity across the radiation pattern of the transceiver system 1800. As such, the transceiver system 1800 may create a variable polarization over its beamwidth. Moreover, given the orientation of the first element 1802(1) of the first sub-array 1802 and the second element 1804(2) of the second sub-array 1804 (e.g., leftward facing, rightward facing, etc.), transmissions may be sent in multiple directions.

The signals transmitted by the first element 1802(1) of the first sub-array 1802 and the second element 1804(2) of the second sub-array 1804 may have predetermined phases and/or amplitudes for steering transmitted beams. For example, because the elements of the first sub-array 1802 and the second sub-array 1804 have dedicated feed ports, their phase and/or magnitudes may be individually controlled for achieving polarization diversity. Moreover, the predetermined phases and/or amplitudes may generate variable polarizations for receipt by receivers of other devices (e.g., the base station radio device 106). In other words, the antenna(s) of the base station radio device 106 may be configured to receive vertical, horizontal, circular, and/or elliptical polarizations, for example, emitted by the first sub-array 1802 and the second sub-array 1804. As such, the polarizations of the first element 1802(1) of the first sub-array 1802 and the second element 1804(2) of the second sub-array 1804 may generate various polarizations through constructive interference.

The diversity of polarizations generated by the transceiver system 1800 may increase the signal strength of received signals. That is, by selecting specific polarization feeds on the first element 1802(1) of the first sub-array 1802 and the second element 1804(2) of the second sub-array 1804, and precoding the phase and or amplitude of those feeds, a radiation pattern may be emitted with a predetermined variable polarization. This predetermined variable polarization may be determined as a function of the direction of transmission and arrival in the transceiver system 1800. For example, by phase shifting and/or adjusting the amplitude of the outgoing signals of the first element 1802(1) of the first sub-array 1802 and the second element 1804(2) of the second sub-array 1804, the direction of transmissions may be adjusted. Similarly, receiving signals may be phase shifted.

Although a particular embodiment of the transceiver system 1800 is shown, more than two dual-polarized elements (i.e., the first sub-array 1802 and the second sub-array 1804) may be implemented within the transceiver system 1800. For example, the transceiver system 1800 may include four dual-polarized sub-arrays that are arranged to form a pattern beamwidth that exceeds the radiation pattern of the individual widths of the individual sub-arrays. In such instances, the four sub-arrays may include two orthogonally polarized elements, and each element of the sub-array may have a dedicated antenna feed port.

The transceiver system 1800 may be mounted to a structure that supports and orients the first sub-array 1802 and the second sub-array 1804. For example, the mounting of the first sub-array 1802 and the second sub-array 1804 may provide the transceiver system 1800 with a pattern in azimuth and elevation directions that is greater than the pattern of the first sub-array 1802 and the second sub-array 1804. That is, the individual beam patterns of the first sub-array 1802 and the second sub-array 1804 may constructively interfere with one another to increase a beam pattern of the transceiver system 1800. For example, individually, the first sub-array 1802 and/or the second sub-array 1804 may exhibit a 70 degree pattern in both azimuth and elevation directions. However, through constructive interference the transceiver system 1800 may achieve a 3 dB pattern of +/−90 degree azimuth with respect to the transceiver system 1800 boresight and an elevation of zero (0) degrees to 70 degrees with respect to a horizontal plane. This pattern may represent a directional pattern of the transceiver system 1800.

However, as noted above, by selecting specific polarization feeds on each of the dual polarized elements of the first sub-array 1802 and the second sub-array 1804, and precoding the phase and/or amplitude of the feeds, a radiation pattern with a predetermined variable polarization may be generated as a function of the direction of departure/arrival in the transceiver system 1800. For example, the transceiver system 1800 may realize a 3 dB pattern of +/−180 degree azimuth with respect to the transceiver system 1800 boresight and an elevation of zero (0) degrees to 70 degrees with respect to a horizontal plane. This azimuthal pattern constitutes an omni-directional pattern.

Figure 19:
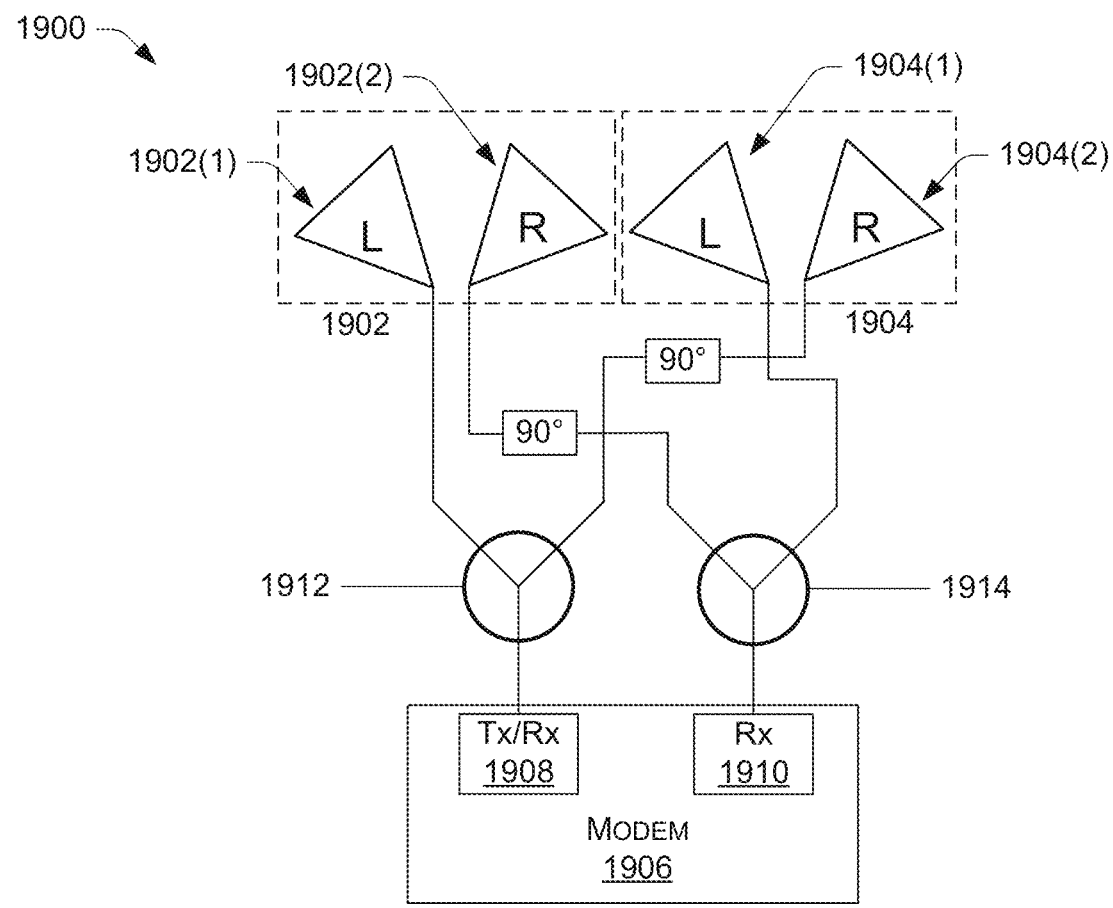
FIG. 19 illustrates an example antenna feed network of the example transceiver system of FIG. 12, according to an embodiment of the present disclosure.

FIG. 19 illustrates a transceiver system 1900. In some instances, the transceiver system 1900 may be similar to the transceiver system 1800. For example, the transceiver system 1900 may include a first sub-array 1902 and a second sub-array 1904. In some instances, the first sub-array 1902 and the second sub-array 1904 may include multiple elements that are dual polarized. In some instances, the first sub-array 1902 and the second sub-array 1904 may be dual polarized patch antennas. The first sub-array 1902 includes a first element 1902(1) and a second element 1902(2), and the second sub-array 1904 includes a first element 1904(1) and a second element 1904(2).

The transceiver system 1900 may have dedicated feed ports for transmitting and receiving via the first sub-array 1902 and the second sub-array 1904. For example, the transceiver system 1900 is shown including a modem 1906 having a first port 1908 and a second port 1910. In some instances, the first port 1908 may represent a transmission and receiving port, while the second port 1910 may represent a receiving port. As shown, the transceiver system 1900 may include a first power splitter and combiner 1912 to drive the first element 1902(1) of the first sub-array 1902 and the second element 1904(2) of the second sub-array 1904. The transceiver system 1900 may also include a second power splitter and combiner to drive the second element 1902(2) of the first sub-array 1902 and the first element 1904(1) of the second sub-array 1904. In some instances, the first power splitter and combiner 1912 and the second power splitter and combiner 1914 may unequally split and combine power to adjust the relative magnitude of each element in the transceiver system 1900.

The first element 1902(1) and the second element 1902(2), the first element 1904(1) and the second element 1904(2) may be polarized differently than one another (e.g., orthogonally polarized). Additionally, some of the elements of the sub-arrays may have 90 degree phase shifts. For example, the second element 1902(2) may have a 90 degree phase shift and the second element 1904(2) may have a 90 degree phase shift. The predetermined phase shifts of the second element 1902(2) and the second element 1904(2) may produce circular polarizations. For example, the predetermined 90 degree phase shift in transmitting signals may result in the transmission of circularly polarized signals (via vector summing between the elements of the sub-arrays). Additionally, this allows the transceiver system 1900 to receive circularly polarized signals. That is, the overlapping regions between the elements of the first sub-array 1902 and the second sub-array 1904 may result in circular polarization (or near circular polarization).

Figure 20:
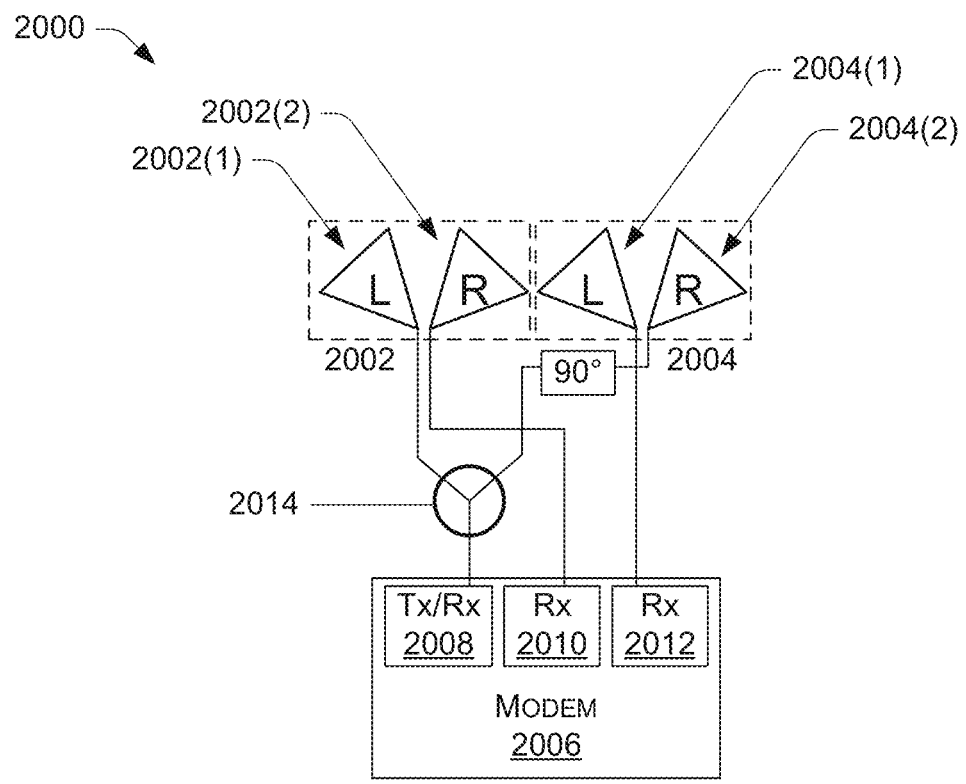
FIG. 20 illustrates an example antenna feed network of the example transceiver system of FIG. 12, according to an embodiment of the present disclosure.

FIG. 20 illustrates a transceiver system 2000 having multiple sub-arrays. For example, the transceiver system 2000 may include a first sub-array 2002 and a second sub-array 2004. In some instances, the first sub-array 2002 and the second sub-array 2004 may include multiple antennas, that are dual polarized. In some instances, the first sub-array 2002 and the second sub-array 2004 may be dual polarized patch antennas.

The first sub-array 2002 is shown including a first element 2002(1) and a second element 2002(2), while the second sub-array 2004 is shown including a first element 2004(1) and a second element 2004(2). The first element 2002(1) of the first sub-array 2002 may represent a left antenna and the second element 2002(2) of the first sub-array 2002 may represent a right antenna. The first element 2002(1) and the second element 2002(2) may include different polarizations, or may be polarized differently than one another. The first element 2002(1) and the second element 2002(2) may be orthogonally polarized. Likewise, the first element 2004(1) of the second sub-array 2004 may represent a left antenna and the second element 2004(2) of the second sub-array 2004 may represent a right antenna. The first element 2004(1) and the second element 2004(2) may include different polarizations and may be orthogonally polarized.

The transceiver system 2000 has dedicated feed ports for transmitting and receiving via the first sub-array 2002 and the second sub-array 2004. For example, the transceiver system 2000 is shown including a modem 2006 that includes a first port 2008, a second port 2010, and a third port 2012. In some instances, the first port 2008 may represent a transmission and receiving port, while the second port 2010 and the third port 2012 may represent receiving ports. As shown, the transceiver system 2000 may include a power splitter and combiner 2014 to drive the elements of the first sub-array 2002 and the second sub-array 2004. For example, the first port 2008 may split transmission signals to the first element 2002(1) of the first sub-array 2002 and the second element 2004(2) of the second sub-array 2004 via a phase delay of a composite 90 degrees.

During transmission, the splitting of the signals may drive the polarizations of each element. In some instances, the different polarizations of the first element 2002(1) and the second element 2004(2) may maximize the polarization diversity across the radiation pattern of the transceiver system 2000. In this example, the polarization of the second element 2002(2), illustrated as slant left polarization, forming the left most extent of the beamwidth while the second element 2004(2) may be a right facing slant right polarization element forming the right extent of the beamwidth. Due to the 90 degree phase offset, the central facing polarization formed between the right and left elements may result in a right hand circular polarization. Additionally, this may result in the transmission of circularly polarized signals (via interaction between the elements) and permit the receivers of the transceiver system 2000 to receive circularly polarized signals.

The second element 2002(2) of the first sub-array 2002 may couple to the second port 2010 and the first element 2004(1) of the second sub-array 2004 may couple to the third port 2012. The transceiver system 2000 may represent an antenna array having one transmission/receiving port, with a two-way combine/split, and two receiving ports.

Figure 21:
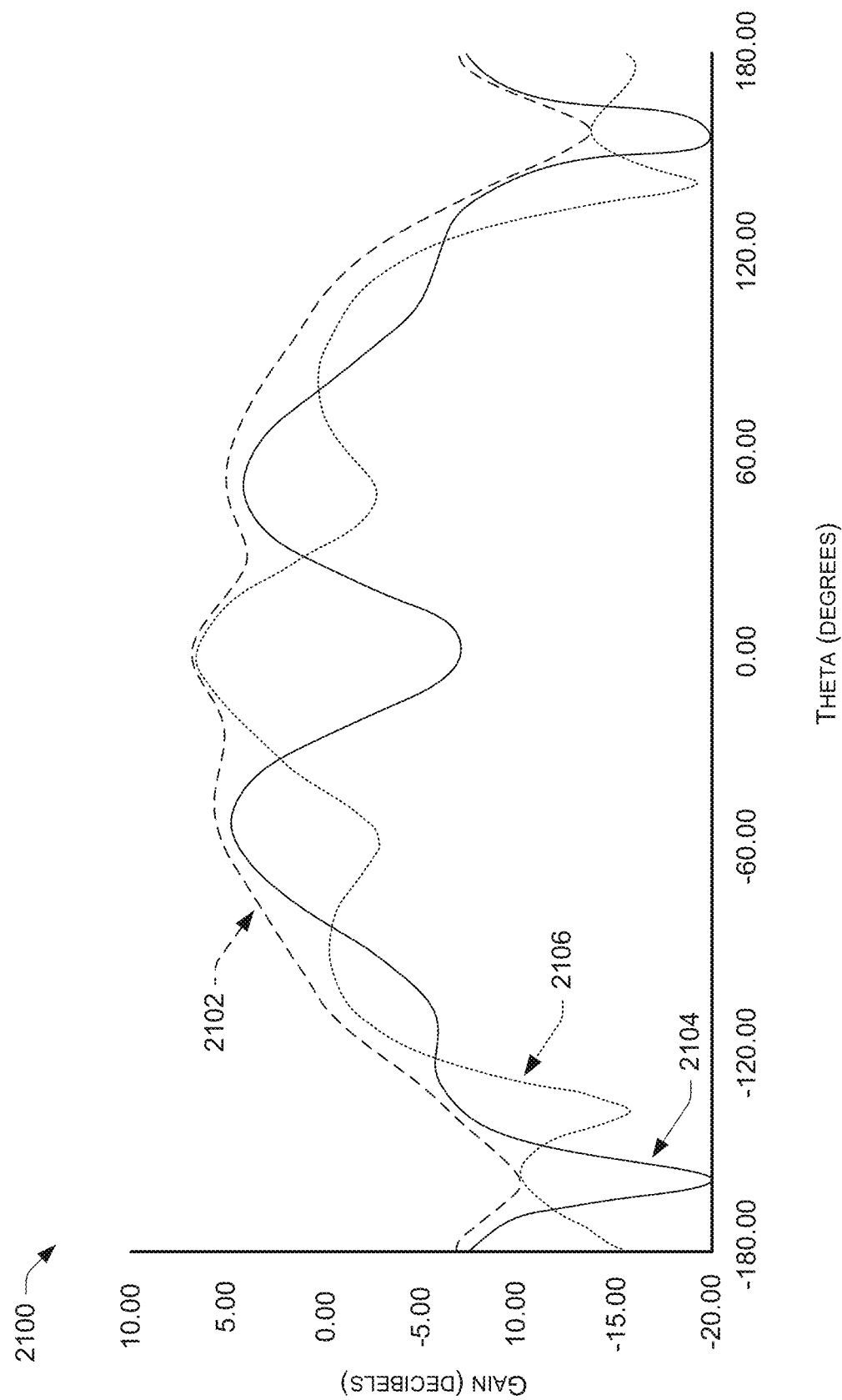
FIG. 21 illustrates a graph showing antenna gain and polarizations of an example antenna and associated feed network, according to an embodiment of the present disclosure.

FIG. 21 illustrates a graph 2100 showing simulation results for a transceiver system having three sub-arrays, such as the transceiver system 1500. FIG. 21 illustrates the total power of the transceiver system at line 2102. The right hand circular polarization (RHCP) is shown by line 2104 and the left hand circular polarization (LHCP) is shown by line 2106. By starting on the left of the graph 2100, the variation in polarization is observed to change in a trajectory around the Poincaré Sphere. Additionally, the graph 2100 illustrates the partial overlap of beams may result in destructive interference decreasing the gain in specific directions. For example, at zero degrees, the RHCP is shown as having a lull (e.g., the signals may be 180 degree out of phase).

Figure 22:
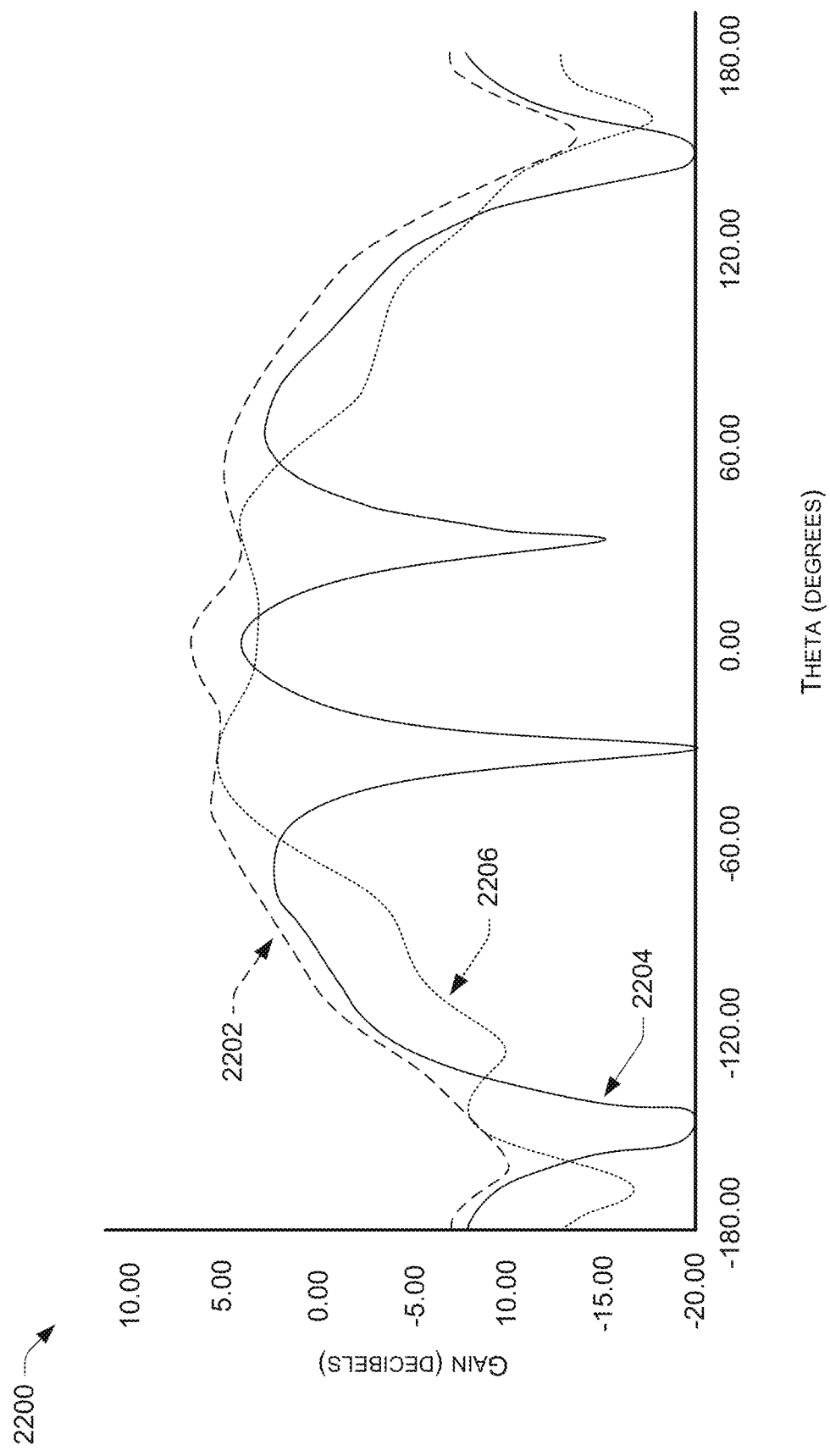
FIG. 22 illustrates a graph showing antenna gain and polarizations of an example antenna and associated feed network, according to an embodiment of the present disclosure.

FIG. 22 illustrates a graph 2200 showing simulation results for a transceiver system having three sub-arrays, such as the transceiver system 1500. FIG. 22 illustrates the total power of the transceiver system 1500 at line 2202. The horizontal polarization is shown by line 2204 and the vertical polarization is shown by line 2206. By starting on the left of the graph 2200, the variation in polarization is observed to change in a trajectory around the Poincare Sphere.

Figure 23:
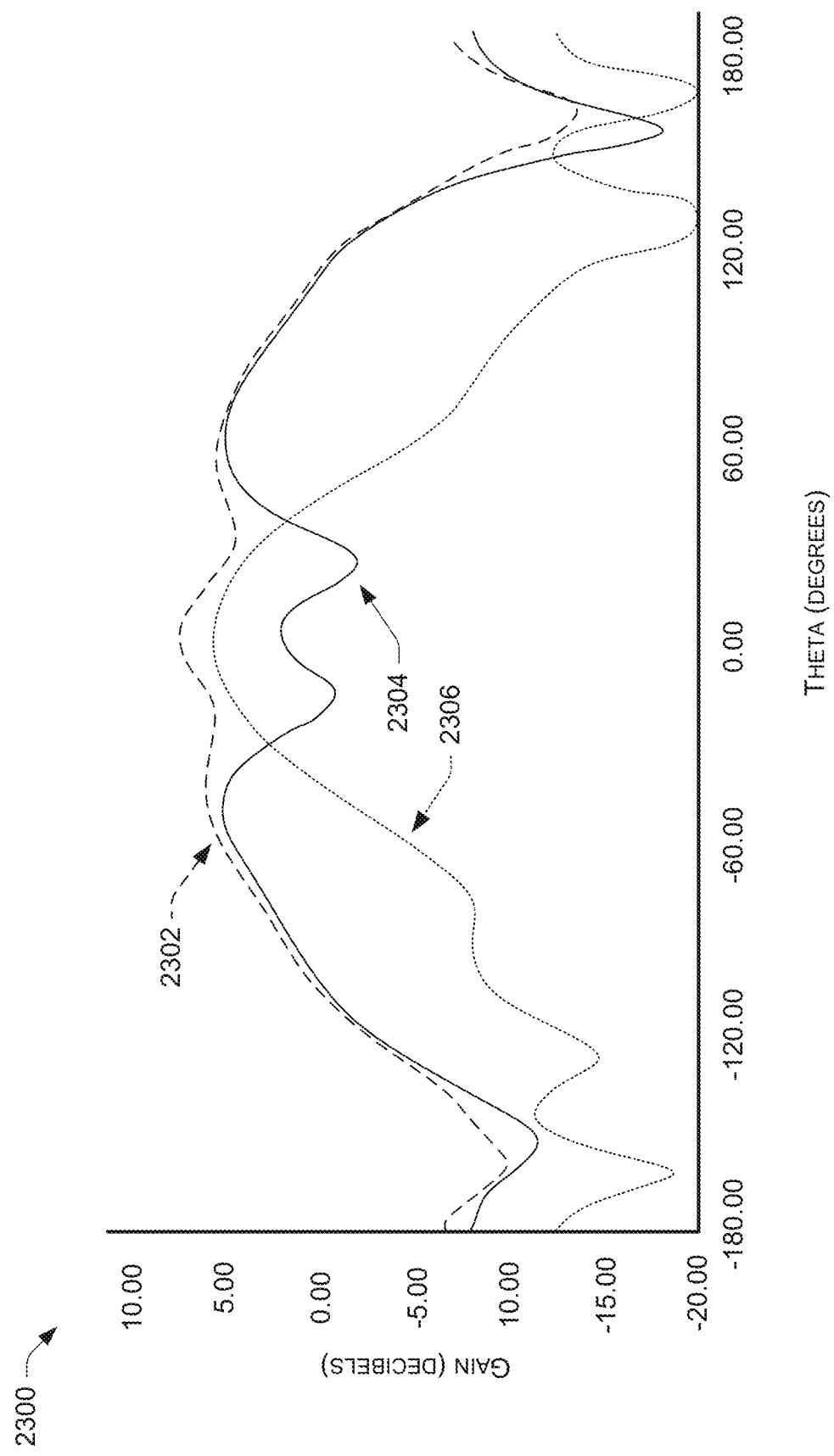
FIG. 23 illustrates a graph showing antenna gain and polarizations of an example antenna and associated feed network, according to an embodiment of the present disclosure.

FIG. 23 illustrates a graph 2300 showing simulation results for a transceiver system having three sub-arrays, such as the transceiver system 1500. FIG. 23 illustrates the total power of the transceiver system 1500 at line 2302. A +45 degree slant polarization is shown by line 2304 and the −45 degree slant polarization is shown by line 2306. By starting on the left of the graph 2300, the variation in polarization is observed to change in a trajectory around the Poincare Sphere.

Across the graphs 2100, 2200, and 2300, the lines 2102, 2202, and 2302 illustrates that the total power are the same. Here, any orthogonal pair of measurement antennas can have large gain variations over the beamwidth while the total power is relatively flat over the +/−90 degree beamwidth.

Figure 24:
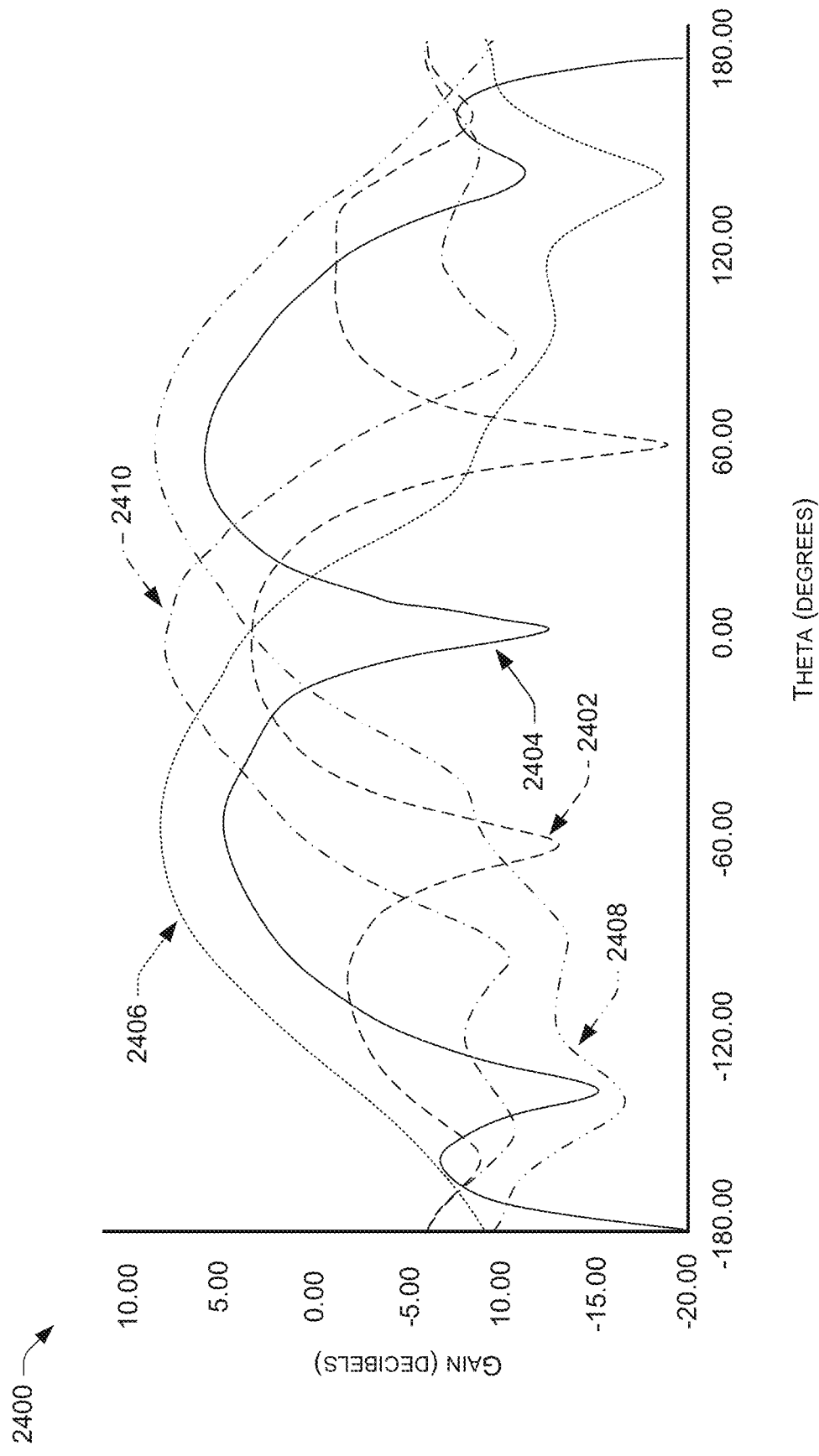
FIG. 24 illustrates a graph showing antenna gain and polarizations of an example antenna and associated feed network, according to an embodiment of the present disclosure.

FIG. 24 illustrates a graph 2400 showing simulation results for a transceiver system having three sub-arrays, such as the transceiver system 1600. The line 2402 and the line 2404 represent pattern traces of the orthogonal measurements of the transmission receiver port of the transceiver system 1600, such as the first port 1610. The lines 2406, 2408, and 2410 represent the three independent receiving port patterns (e.g., the second port 1612, the third port 1614, and the fourth port 1616). A 180 degree phase shift may exist between the right and left facing co-polarized elements and create a deep transmission null at 0 degrees to improve array gain flatness. In addition, the transceiver system 1600 traverses a full 360 degrees of rotation around the Poincare Sphere. This is due to the +/−90 degree differential phase relative to the orthogonal center element the maximize polarization diversity.

Figure 25:
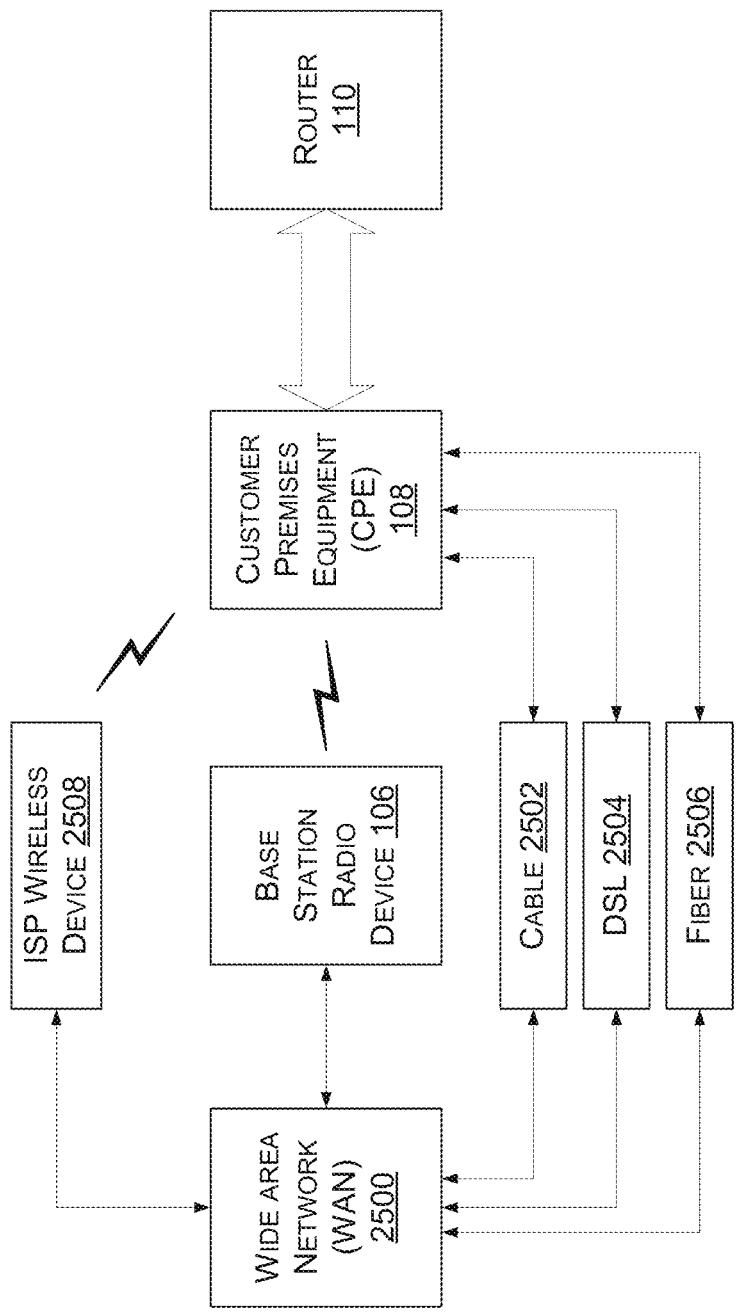
FIG. 25 illustrates diverse physical layer (PHY) technologies coupled to the CPE of FIG. 1 for providing broadband internet, according to an embodiment of the present disclosure.

FIG. 25 illustrates the CPE 108 providing broadband internet to a premises 102 using a plurality of disparate communication protocols. As discussed above, the CPE 108 may be disposed on an exterior of the premises 102 while the router 110 is disposed on an interior of the premises 102. The CPE 108 communicatively couples to the router 110 via a BPL interface (e.g., the first BPL interface 122). The CPE 108 additionally communicatively couples to the base station radio device 106 via the communication channel 118. The base station radio device 106 is shown communicatively coupled to a wide area network (WAN) 2500. The WAN may be representative of the SPN 116, or an ISP.

In some instances, the premises 102 may include a plurality of diverse physical layer (PHY) technologies, such as wired, optical, or wireless, and/or wide area network (WAN) connections may be available at the utility service entrance of the premises 102.

In some instances, the PHY technologies and WAN technologies provided by Internet Service Providers (ISPs) are processed as needed by compatible modems at the CPE 108. For example to support multiple WAN technologies for failover redundancy, the top portion 314 of the CPE 108 may be interchangeable with compatible modems and depending on technologies located at the premises 102. For example, as shown, the premises 102 may include an cable 2502 (e.g., coaxial), a DSL 2504 (e.g., twisted pair), and an fiber 2506 (e.g., fiber optic). Each of the cable, the DSL 2504, and the fiber 2506 may serve to provide internet services to the premises 102. For example, the DSL 2504 may represent telephone lines that carry signals to and from the SPN 116. Traditionally, each of the cable, the DSL 2504, and the fiber 2506 requires a physical routing through a structure of the premises 102 for connection to a modem and/or router. However, as shown, the CPE 108 may communicatively couple to the cable 2502, the DSL 2504, and/or the fiber 2506 for providing broadband internet to the premises 102. That is, rather than routing cables through the premises 102 for providing broadband internet (as discussed above), the cable 2502, the DSL 2504, and the fiber 2506 may instead couple to the CPE 108. Therein, the CPE 108 may communicatively couple to the router 110 for providing broadband internet to the premises 102. In some instances, the CPE 108, the cable 2502, the DSL 2504, and/or the fiber 2506 may be located at a demarcation point in which services are provided to the premises 102.

The cable 2502, the DSL 2504, and the fiber 2506 are shown coupling to the WAN 2500 (e.g., the SPN 116) for providing access to the broadband internet. In some instances, the premises 102 may include any and/or all of the cable 2502, the DSL 2504, and the fiber 2506. That is, different premises may include different services that provide internet, or different technologies that provide internet to the premises 102. However, in these instances, the CPE 108 may be modular for accepting any one of the cable 2502, the DSL 2504, and/or the fiber 2506 for providing broadband internet. In such instances, antenna(s) and/or modems of the CPE 108 may be configured to be interchangeable and installed for providing broadband internet, and depending on the type of PHY technologies (e.g., the cable 2502, the DSL 2504, and the fiber 2506). That is, in some instances, the premises 102 may include the cable 2502 and the CPE 108 may receive the cable 2502 for providing broadband internet to the premises 102. In this instance, the CPE 108 may not wirelessly communicate with the base station radio device 106, but may take advantage of a PHY technology of the premises 102. The CPE 108 may also be configured with a modem for communicating with the WAN 2500, using the cable 2502. In some instances, the CPE 108 may provide the broadband internet to the premises 102 (via the router 110) using wired technologies (e.g., BPL) and/or wireless technologies.

As another example, the premises 102 may include the fiber 2506. Here, the CPE 108 may couple to the fiber 2506 for communicatively coupling with the WAN 2500. The CPE 108 may also include modems and/or modules for transmitting and receiving data via the fiber 2506. The CPE 108 may therein provide broadband internet to the premises 102 (using wired technologies and/or wireless technologies) through communicating with the router 110.

In some instances, rather than wirelessly receiving broadband internet via the base station radio device 106, the CPE 108 may wirelessly couple to an ISP's wireless device 2508, or wireless services. In some instances, the connections between the CPE 108 and the WAN 2500 may be combined into a plurality of WANs (m-WAN) and conveyed using at least a single PHY to enter the premises 102. For example, this single PHY may comprise BPL for transmitting data to the router 110 on the interior of the premises 102. However, transmitting and receiving data with the WAN 2500 may come by way of wireless, coaxial cable, twisted pair cables, fiber, and so forth. In this sense, the CPE 108 may represent a hub that is utilized to transmit data into the premises 102.

The CPE 108 may also aggregate data received across a plurality of frequencies or received via the different PHY technologies. For example, the CPE 108 may receive first data over a first frequency and second data over a second frequency, and combine the first data and the second data before sending into the premises 102, via the first BPL interface 122. In this manner, the CPE 108 may dynamically take advantage of unused frequency, or frequencies with low traffic, for communicating with the base station radio device 106 and/or the WAN 2500. This process may also load balance data sent to and from the WAN 2500. In some instances, the CPE 108 may include a mmWave antenna/modem for aggregating and/or obtaining higher bandwidths.

Inside the premises 102, in some instances, the plurality of WAN connections (if present) are separated into their independent and own bridge ethernet connections for WAN aggregation. Additionally, or alternatively, the plurality of WAN connections may be aggregated using the router 110. In some instances, the router 110 may correspond to a multi-PHY multi-WAN router (MPMWR). In instances where the router 110 comprises a MPMWR, the router 110 may support one or more PHYs on each of the WAN/LAN ports (e.g., using wireless, coax, and so forth) to distribute load-balanced fail-over or WAN bonded multi-PHY LAN bandwidth throughout the premises.

In some instances, segmentation of the CPE 108 and the router 110 on the exterior and interior side of the premises 102, respectively, may provide for optimal PHY selections. That is, the broadband internet may be provided to the premises 102 via power networks, DSL cables, cables, and so forth. As such, the optimal (e.g., most reliable, highest bandwidth, etc.) connection(s) are chosen to match existing infrastructure throughout the premises 102. Installation may be similar as discussed above. For example, the consumer may request service, the utility service or company may survey the premises 102 for available or optimal PHYs, install the CPE 108 (along with appropriate modems), and then provision the CPE 108.

In some instances, the CPE 108 may connect to a remote antenna for delivering broadband internet to the premises 102. For example, in the event a customer is beyond the useful range of the CBRS spectrum, a remote unit may be deployed. The remote unit may include a directional antenna that allow the utility service to connect with the premises in instances where deployment of a radio station radio device is not feasible.

Figure 26:
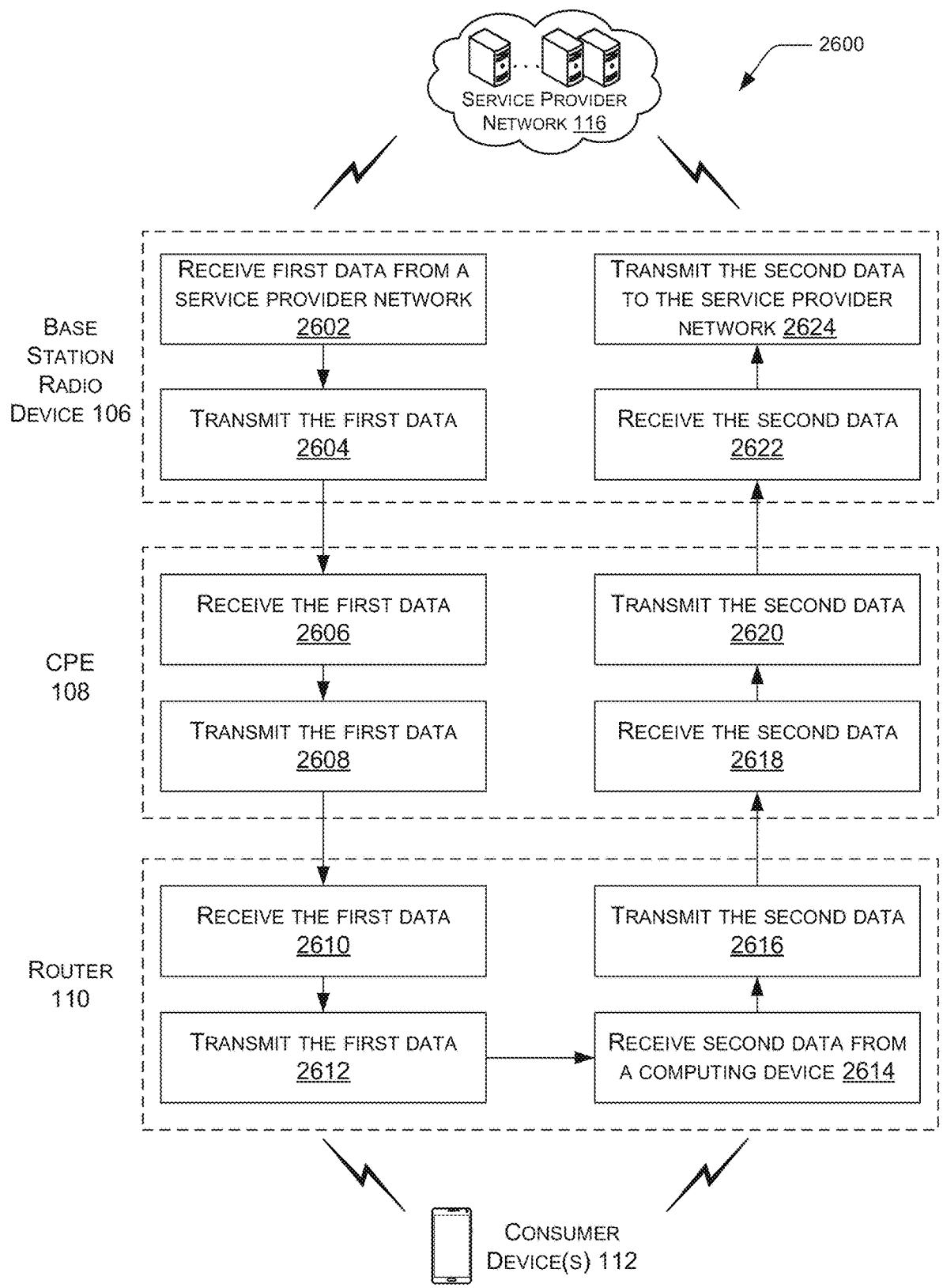
FIG. 26 illustrates an example process for providing broadband services to a premises, according to an embodiment of the present disclosure.

FIG. 26 illustrates an example process 2600 for providing broadband internet to a premises, such as the premises 102.

At 2602, the process 2600 may receive first data from a service provider network. For example, the base station radio device 106 may receive, from the SPN 116, data for routing and/or transmitting to the premises 102. The base station radio device 106 may receive the first data via a backhaul (e.g., wired and/or wireless). In some instances, the base station radio device 106 may receive the first data from another base station radio device and/or a servers, devices, or facilities of the SPN 116.

At 2604, the process 2600 may transmit the first data. For example, the base station radio device 106 may transmit the data to the CPE 108 using the interface(s) 204 and antenna(s) 206. The base station radio device 106 may communicate with the CPE 108 using any spectrum (e.g., DSS, CBRS, WWAN, C-band, etc.) and according to the technology of the CPE 108 (e.g., the first modem module 126). In some instances, the base station radio device 106 may perform beamforming or beam steering with sending the first data.

At 2606, the process 2600 may receive the first data. For example, the CPE 108 may include antenna(s) 120 and the first modem module 126 for receiving the first data. In some instances, the antenna(s) 120 may beamform for receiving the first data from the base station radio device 106.

At 2608, the process 2600 may transmit the first data. For example, the CPE 108 may transmit the first data via the first BPL interface 122.

At 2610, the process 2600 may receive the first data. For example, the router 110 may receive the first data, via the second BPL interface 124, from the first BPL interface 122, over electrical wiring of the premises 102.

At 2612, the process 2600 may transmit the first data. For example, the second modem module 128 and the antenna(s) 132 of the router 110 may transmit (e.g., broadcast) the first data to the consumer device(s) 112 within the premises 102. In some instances, the second modem module 128 and the antenna(s) 132 may be modular to broadcast internet to the consumer device(s) 112 at certain frequencies (e.g., 5.0G). In some instances, the router 110 distributes Wi-Fi through DSS and/or CBRS. Additionally, the router 110 may include wired connections for providing broadband internet to the consumer device(s) 112.

At 2614, the process 2600 may receive second data. For example, the second modem module 128 and the antenna(s) 132 of the router 110 may receive second data from the consumer device(s) 112 (e.g., request to navigate to a webpage).

At 2616, the process 2600 may transmit the second data. For example, the second BPL interface 124 may transmit the second data to the CPE 108.

At 2618, the process 2600 may receive the second data. For example, the first BPL interface 122 may receive the second data from the second BPL interface 124 via the electrical wiring of the premises 102.

At 2620, the process 2600 may transmit the second data. For example, the first modem module 126 and the antenna(s) 120 may transmit the second data to the base station radio device 106.

At 2622 the process 2622 may receive the second data. For example, the antenna(s) 206 and/or the interface(s) 204 may receive the second data form the CPE 108.

At 2624, the process 2624 may transmit the second data. For example, the base station radio device 106 may transmit the second data to the SPN 116.

Figure 27:
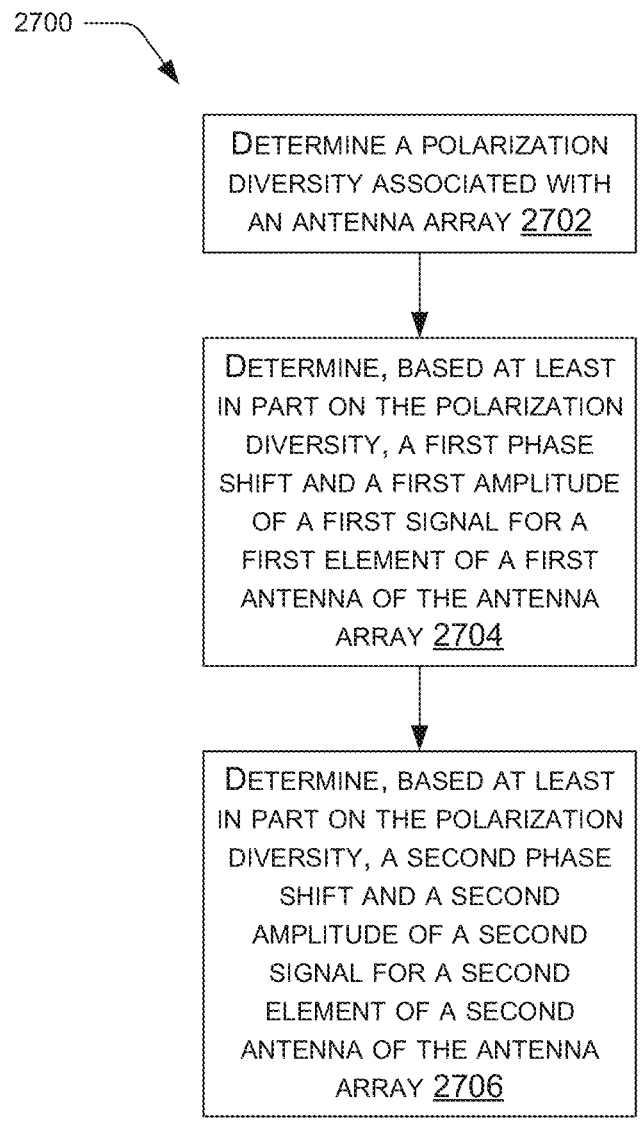
FIG. 27 illustrates an example process for determining phase shifts and/or amplitudes of antenna feeds within a transceiver system, according to an embodiment of the present disclosure.

FIG. 27 illustrates an example process 2700 for determining phase shifts and amplitudes for a transceiver system.

At 2702, the process 2700 may include determining a polarization diversity associated with an antenna array. In some instances, the polarization diversity may be based on a desired achieved polarization diversity of the antenna array, an amount of antennas within the antenna array, and/or a remote antenna with which the transceiver system is to communicate with. For example, the remote antenna may be configured to receive a plurality of polarizations (e.g., circular, vertical, etc.) from the transceiving system (or another system).

At 2704, the process 2700 may include determining a first phase shift and a first amplitude for a first element of a first antenna of the antenna array. For example, the process 2700 may include a first sub-array having multiple elements that are dual polarized. A first element of the first sub-array may be precoded with a first phase shift and a first amplitude. The first phase shift and the first amplitude may be determined, based at least in part on, the desired polarization of the antenna array. In some instances, the first phase shift and the first amplitude may be relative to an additional antenna of the first sub-array or an additional antenna of other sub-arrays of the antenna array.

At 2706, the process 2700 may include determining a second phase shift and a second amplitude for a second element of a second antenna of the antenna array. For example, the process 2700 may include a second sub-array having multiple elements that are dual polarized. A second element of the second sub-array may be precoded with a second phase shift and a second amplitude. The second phase shift and the second amplitude may be determined, based at least in part on, the desired polarization of the antenna array. In some instances, the second phase shift and the second amplitude may be relative to an additional antenna of the second sub-array or an additional antenna of other sub-arrays of the antenna array.

Although the process 2700 is discussed with regard to determining phase shifts and/or amplitudes for two sub-arrays, or a single element of the two sub-arrays, the process 2700 may determine phase shifts and/or amplitudes for multiple elements within a sub-array and/or for more sub-arrays (e.g., three).

While the foregoing invention is described with respect to the specific examples, it is to be understood that the scope of the invention is not limited to these specific examples. Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

Although the application describes embodiments having specific structural features and/or methodological acts, it is to be understood that the claims are not necessarily limited to the specific features or acts described. Rather, the specific features and acts are merely illustrative some embodiments that fall within the scope of the claims of the application.

What is claimed is:

1. A device comprising:
    a body including a first end configured to couple to an electric meter and a second end configured to couple to an electric meter panel;
    a power module disposed at least partially within the body, the power module being configured to couple to electrical wiring at a premises;
    a first connector disposed at least partially within the body, the first connector configured to communicatively couple to the power module; and
    a top portion coupled to the body, the top portion including:
        a base;
        a second connector configured to engage the first connector;
        one or more printed circuit boards (PCBs) communicatively coupled to the power module;
        a first antenna communicatively coupled to the power module, the first antenna being oriented upward in a first direction relative to the base;

a second antenna communicatively coupled to the power module, the second antenna being oriented upward in a second direction relative to the base;

a third antenna communicatively coupled to the power module, the third antenna being oriented upward in a third direction relative to the base;

a wireless wide area network (WWAN) module communicatively coupled to the first antenna, the second antenna, the third antenna, and the power module; and a broadband over powerline (BPL) interface communicatively coupled to the WWAN module and the power module.

2. The device of claim 1, further comprising:

one or more processors; and memory storing computer-executable instructions, that when executed by the one or more processors, perform operations comprising:

receiving, via the WWAN module, first data from a first remote device;

sending, via the BPL interface, the first data over the electrical wiring to a second remote device;

receiving, at the BPL interface and from the second remote device, second data; and sending, via the WWAN module, the second data to the first remote device.

3. The device of claim 1, wherein the device communicatively couples to a network service provider to provide broadband service to the premises.

4. The device of claim 1, wherein the top portion is removably coupled to the body by disengaging the first connector and the second connector.

5. The device of claim 1, wherein the first connector and the second connector couple for supplying power to the one or more PCBs, the first antenna, the second antenna, the third antenna, the WWAN module, and the BPL interface.

6. The device of claim 1, wherein:

the first connector comprises one or more first prongs or one or more first slots; and the second connector comprises one or more second prongs that engage with the one or more first slots or one or more second slots that engage with the one or more first prongs.

7. The device of claim 1, wherein the second connector is disposed between the one or more PCBs, the first antenna, the second antenna, and the third antenna.

8. An electronic device comprising: a first housing configured to couple to an electric meter at a premises, the first housing including a power module; and a second housing coupled to the first housing, the second housing including:

a frame having a first surface and a second surface;

a first antenna communicatively coupled to the power module, the first antenna coupled to the first surface of the frame and oriented in a first direction;

a second antenna communicatively coupled to the power module, the second antenna coupled to the second surface of the frame and oriented in a second direction that is different than the first direction;

at least one printed circuit board (PCB) communicatively coupled to the power module, the first antenna, and the second antenna;

a modem module communicatively coupled to the power module, the first antenna, the second antenna, and the at least one PCB; and an interface communicatively coupled to the power module, the first antenna, the second antenna, the at least one PCB, and the modem module.

9. The electronic device of claim 8, wherein the second housing is removably coupled to the first housing for interchanging the second housing with a third housing.

10. The electronic device of claim 8, wherein:

the first housing includes a first connector;

the second housing includes a second connector; and the first housing and the second housing couple together at least in part by the first connector and the second connector engaging.

11. The electronic device of claim 10, wherein the first connector and the second connector communicatively couple the power module with the first antenna, the second antenna, the at least one PCB, the modem module, and the interface.

12. The electronic device of claim 8, wherein:

the modem module comprises a dynamic share spectrum (DSS) module or a wireless wide area network (WWAN) module; and the interface comprises a broadband over powerline (BPL) or a local area network (LAN).

13. The electronic device of claim 8, wherein:

the first housing is configured to attach to a demarcation point at the premises in which power is supplied to the premises; and the electronic device is configured to supply broadband internet to the premises using electrical wiring of the premises.

14. The electronic device of claim 13, further comprising:

one or more processors; and memory storing computer-executable instructions, that when executed by the one or more processors, perform operations comprising:

receiving, at the modem module, first data from a first remote device;

sending, via the interface, the first data over the electrical wiring to a second remote device;

receiving, from the second remote device, second data; and sending, via the modem module, the second data to the first remote device.

15. The electronic device of claim 8, wherein:

the second housing further includes:

a base having:

a front, a back opposite the front, a first side, and a second side opposite the first side, and a cover coupled to the base; and at least one of:

the cover slants in a direction from the front to the back, or the cover curves between the first side and the second side.

16. An apparatus comprising:

a first housing configured to couple to an electric meter at a premises, the first housing including:

one or more first computing components, and a first connector; and a second housing including:

a base having a top surface and a bottom surface coupled to the first housing, one or more second computing components that comprise at least a first antenna and a second antenna, at least one of the first antenna or the second antenna being oriented at an acute angle relative to the top surface of the base,
a second connector engaged with the first connector, wherein an engagement between the first connector and the second connector communicatively couples the one or more first computing components and the one or more second computing components, and
a cover coupled to the base and disposed over the one or more second computing components, the cover having a front that is disposed at an acute angle relative to the top surface of the base.

17. The apparatus of claim 16, wherein the first housing is configured to receive a plurality of second housings, the second housing comprising one of the plurality of second housings.

18. The apparatus of claim 16, wherein:
the one or more first computing components comprise a power module;
the one or more second computing components further comprise a printed circuit board (PCB) and a modem module; and
the first antenna and the second antenna include dual-polarized sub-arrays having predetermined phases and amplitudes.

19. The apparatus of claim 16, further comprising:
one or more processors; and
memory storing computer-executable instructions, that when executed by the one or more processors, perform operations comprising:
receiving first data from a first remote device;
sending the first data over electrical wiring of the premises to a second remote device;
receiving, from the second remote device, second data; and
sending the second data to the first remote device.

20. The apparatus of claim 16, wherein:
the base includes a first side and a second side opposite the first side; and
the cover curves between the first side and the second side.

* * * * *